(12) United States Patent
Xie et al.

(10) Patent No.: US 12,363,965 B2
(45) Date of Patent: Jul. 15, 2025

(54) STACKED TRANSISTOR LAYOUT FOR IMPROVED CELL HEIGHT SCALING

(71) Applicant: INTERNATIONAL BUSINESS MACHINES CORPORATION, Armonk, NY (US)

(72) Inventors: Ruilong Xie, Niskayuna, NY (US); Nicholas Anthony Lanzillo, Wynantskill, NY (US); Albert M. Chu, Nashua, NH (US); Daniel James Dechene, Colonie, NY (US); Eric Miller, Watervliet, NY (US); Lawrence A. Clevenger, Saratoga Springs, NY (US)

(73) Assignee: International Business Machines Corporation, Armonk, NY (US)

(*) Notice: Subject to any disclaimer, the term of this patent is extended or adjusted under 35 U.S.C. 154(b) by 533 days.

(21) Appl. No.: 17/818,996

(22) Filed: Aug. 11, 2022

(65) Prior Publication Data

US 2024/0055477 A1 Feb. 15, 2024

(51) Int. Cl.
*H10D 62/10* (2025.01)
*H10D 30/67* (2025.01)
*H10D 62/13* (2025.01)
*H10D 84/85* (2025.01)

(52) U.S. Cl.
CPC ....... *H10D 62/121* (2025.01); *H10D 30/6757* (2025.01); *H10D 62/151* (2025.01); *H10D 84/856* (2025.01)

(58) Field of Classification Search
CPC .. H10D 62/121; H10D 84/856; H10D 62/151; H10D 30/6757; H10D 30/6735; H10D 30/014
See application file for complete search history.

(56) References Cited

U.S. PATENT DOCUMENTS

| | | | |
|---|---|---|---|
| 9,659,963 B2 | 5/2017 | Cheng et al. | |
| 9,837,414 B1 | 12/2017 | Balakrishnan et al. | |
| 9,865,544 B2 | 1/2018 | Jung et al. | |
| 10,192,819 B1 | 1/2019 | Chanemougame et al. | |
| 10,192,867 B1 | 1/2019 | Frougier et al. | |
| 10,510,622 B1 | 12/2019 | Frougier et al. | |

(Continued)

FOREIGN PATENT DOCUMENTS

WO 2014178949 A1 11/2014

OTHER PUBLICATIONS

International Search Report and Written Opinion; Mailed: Oct. 5, 2023; International Application No. PCT/EP2023/070181; Filed: Jul. 20, 2023; 15 pages.

Primary Examiner — Changhyun Yi
(74) Attorney, Agent, or Firm — CANTOR COLBURN LLP; Kimberly Zillig

(57) ABSTRACT

Embodiments of the invention include a first source region and a first drain region forming a first L-shaped layout. The first source and drain regions are formed on a bottom gate spacer material. Embodiments include a second source region and a second drain region forming a second L-shaped layout, the first L-shaped layout and the second L-shaped layout being interrupted by a gate. One of the first source and drain regions extends in a direction beyond the bottom gate spacer material to form the first L-shaped layout, wherein the direction is parallel to a lengthwise direction of the gate.

20 Claims, 53 Drawing Sheets

(56) References Cited

U.S. PATENT DOCUMENTS

| | | |
|---|---|---|
| 10,515,944 B2 | 12/2019 | Chamg et al. |
| RE48,831 E | 11/2021 | Tanaka |
| 11,189,692 B2 | 11/2021 | Do et al. |
| 2013/0087881 A1 | 4/2013 | Ikegami et al. |
| 2019/0319021 A1 | 10/2019 | Xu et al. |
| 2020/0104460 A1* | 4/2020 | Peng ................. H01L 21/76895 |
| 2021/0233990 A1 | 7/2021 | Peng et al. |
| 2021/0272904 A1 | 9/2021 | Komuro et al. |
| 2021/0351175 A1 | 11/2021 | Wang et al. |
| 2022/0102362 A1 | 3/2022 | Chanemougame et al. |
| 2022/0122993 A1 | 4/2022 | Chiu et al. |

* cited by examiner

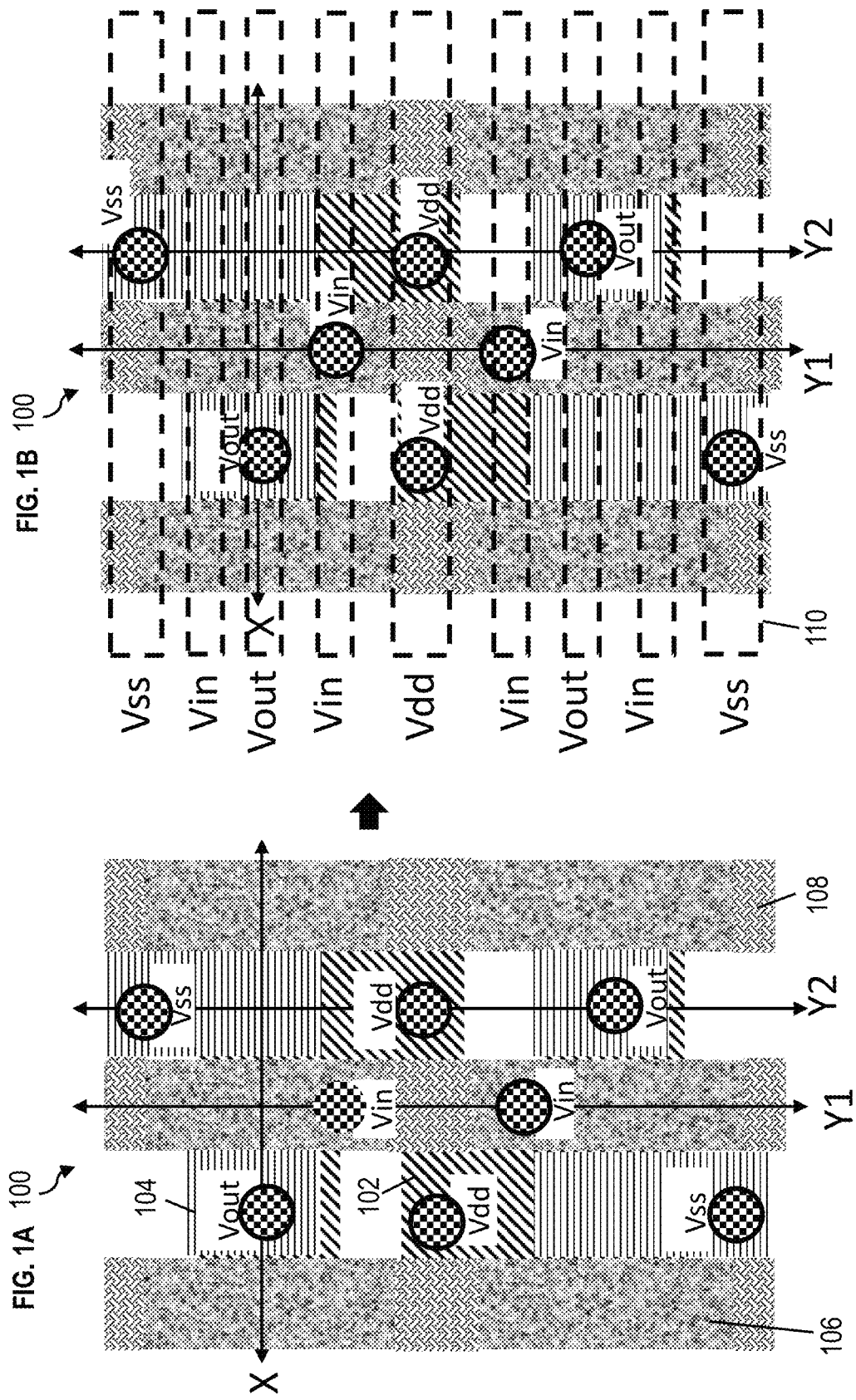

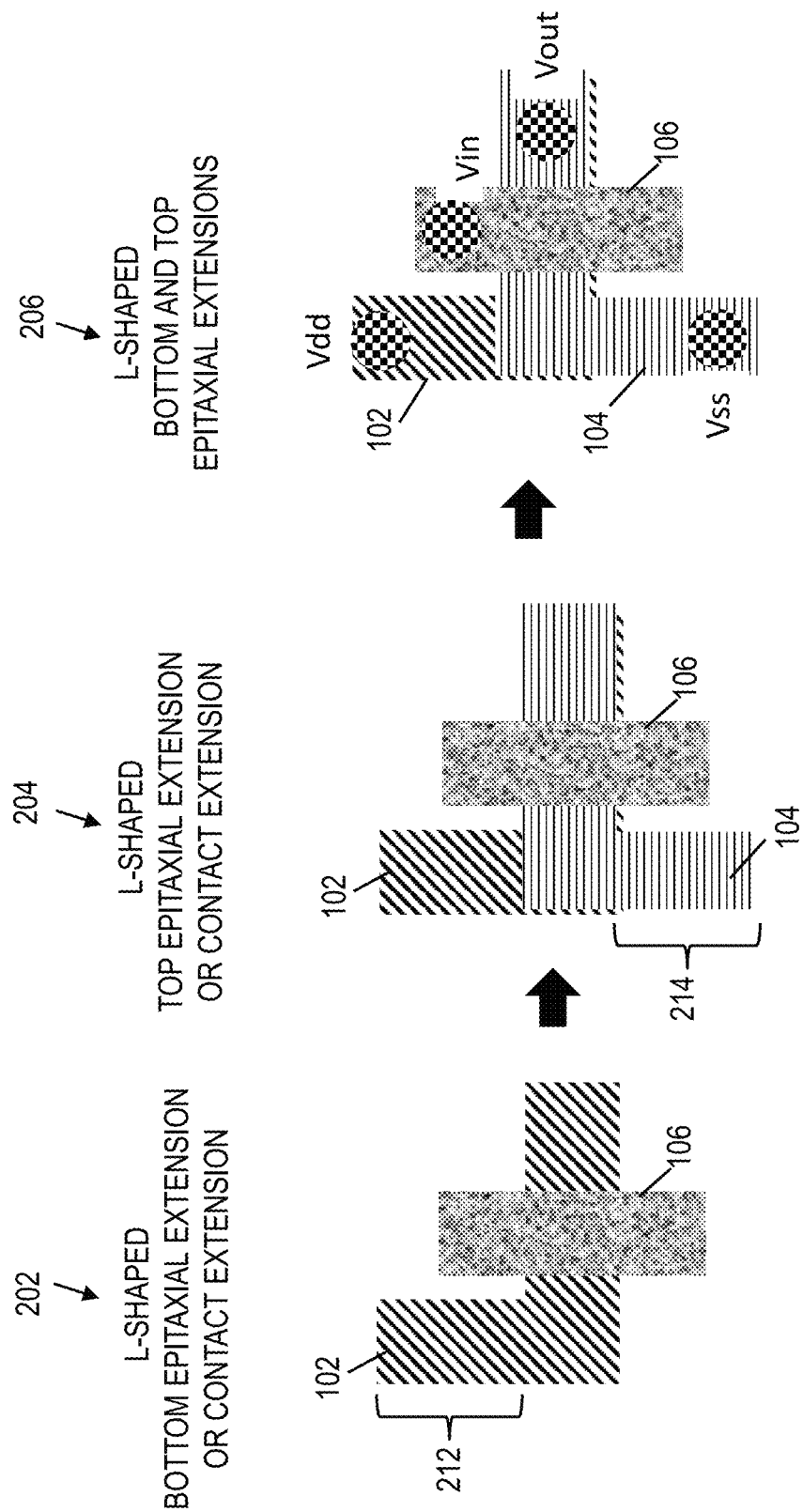

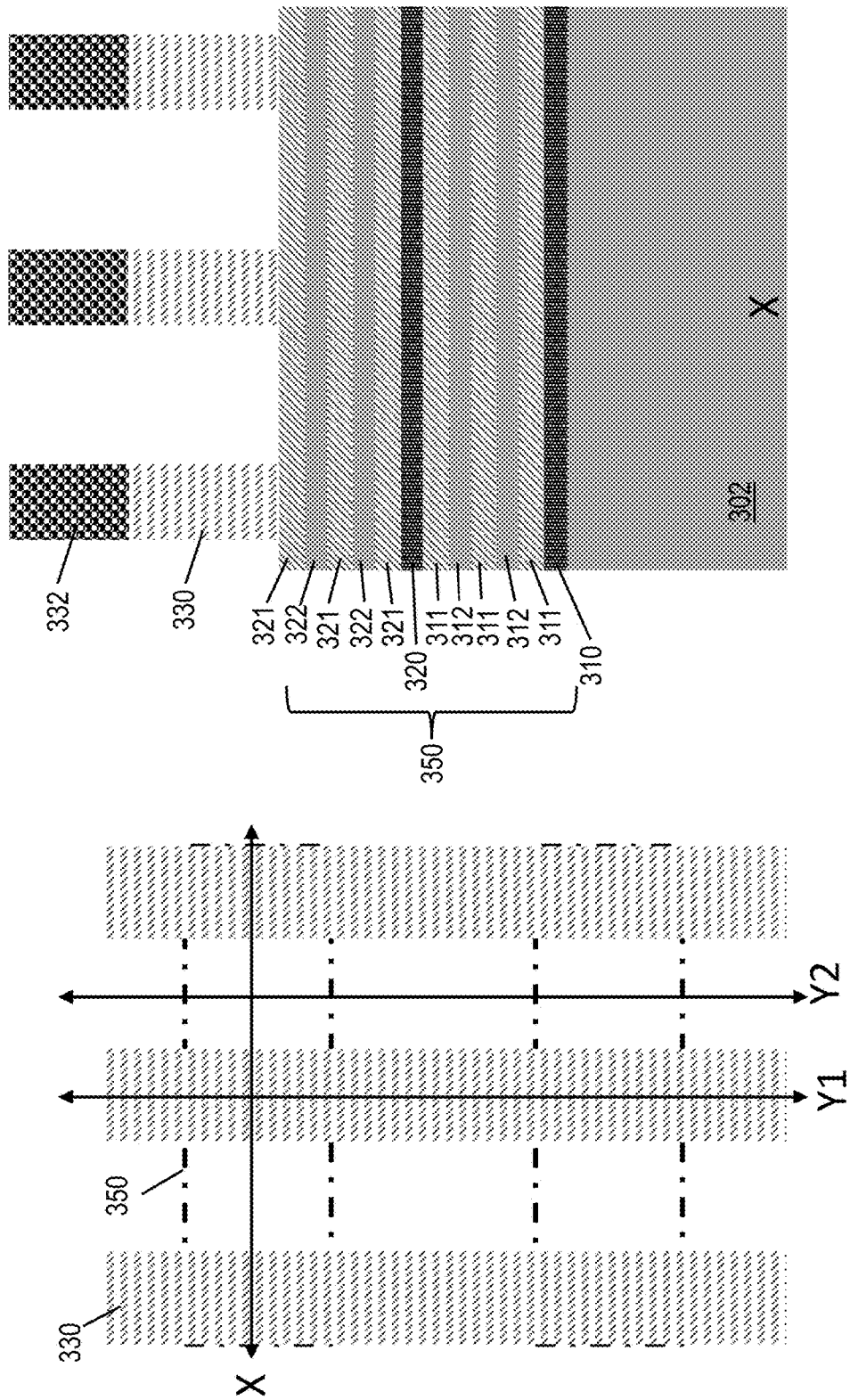

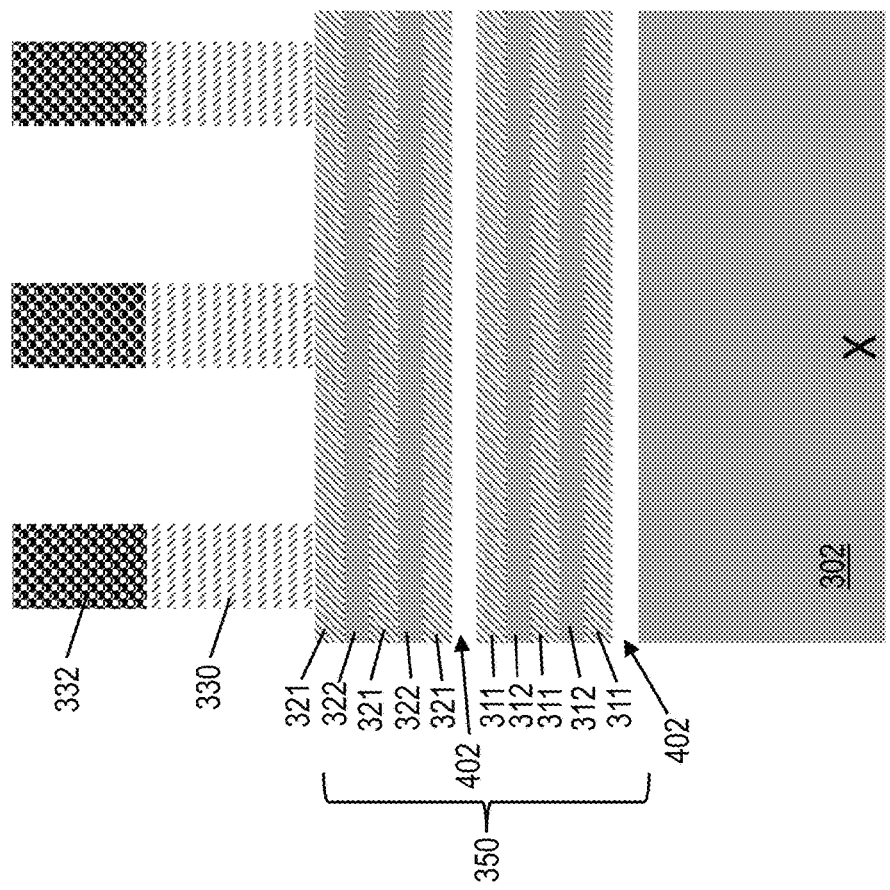
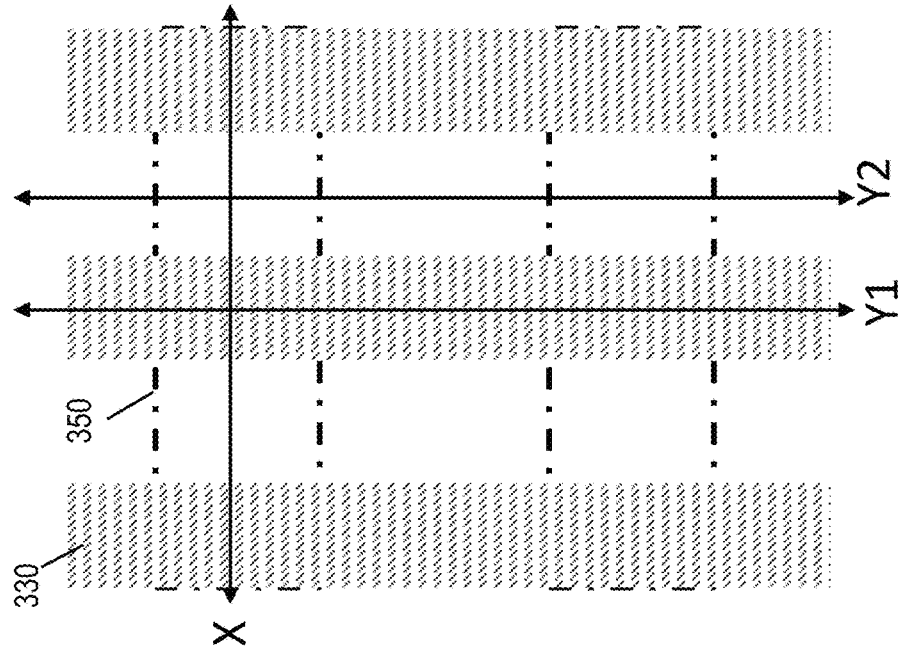

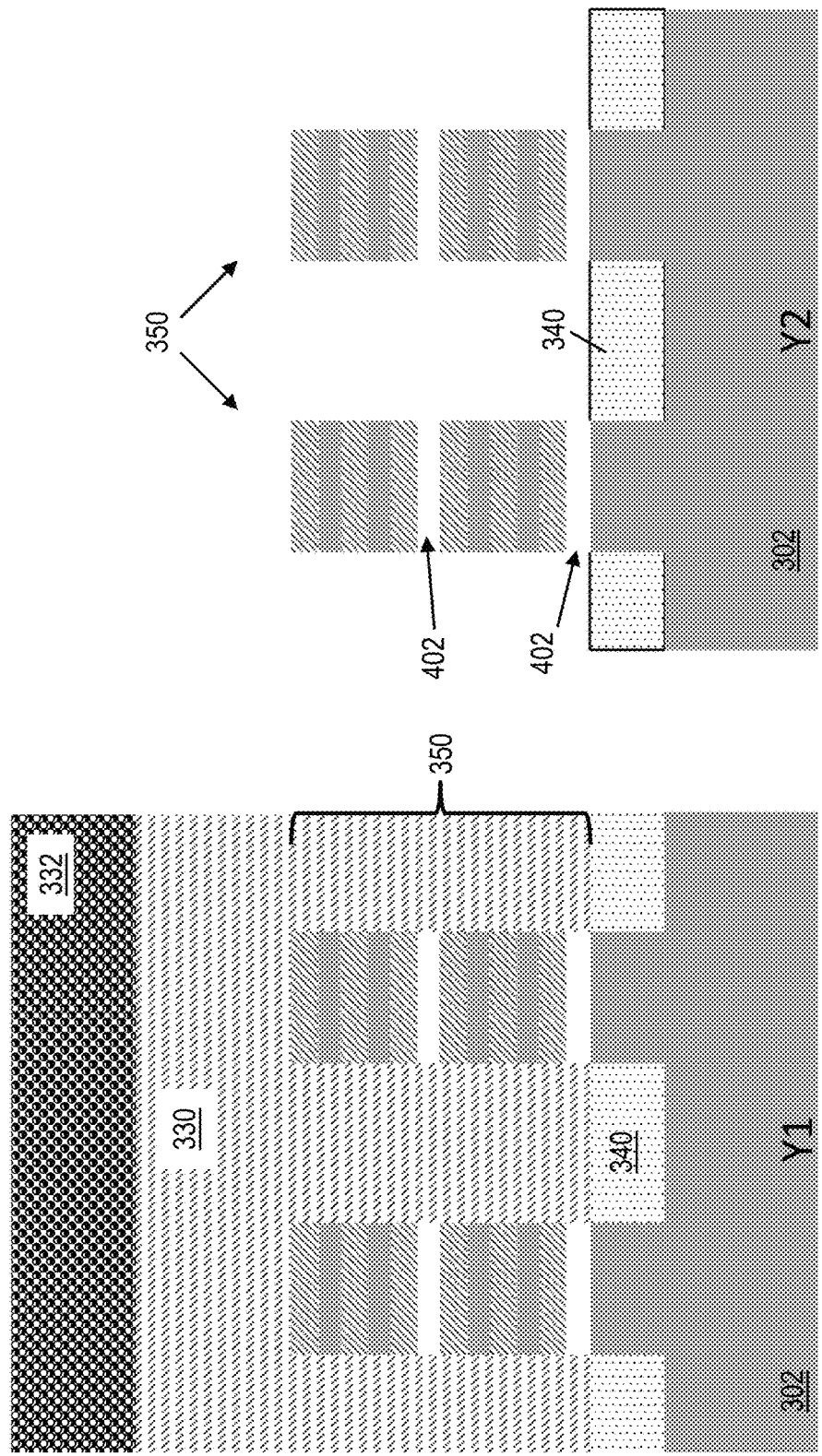

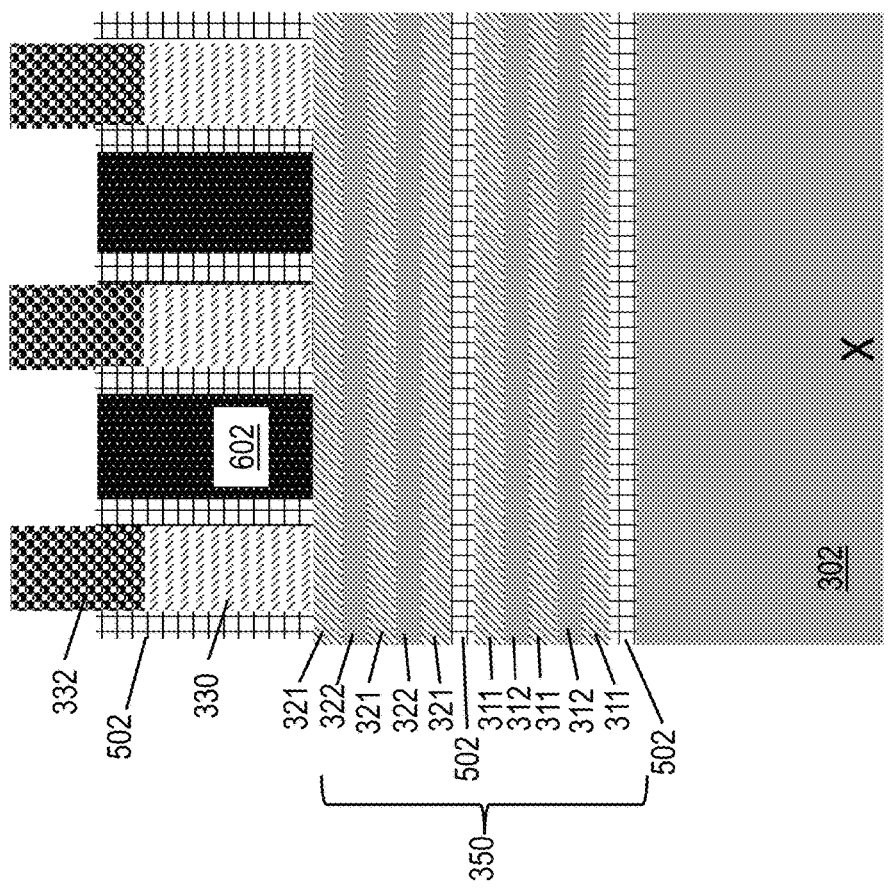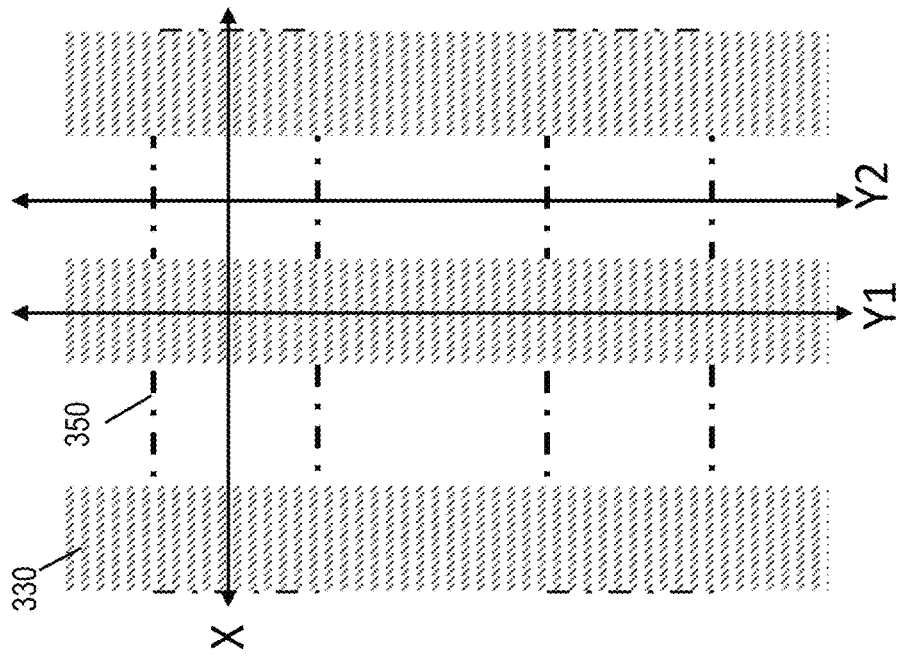

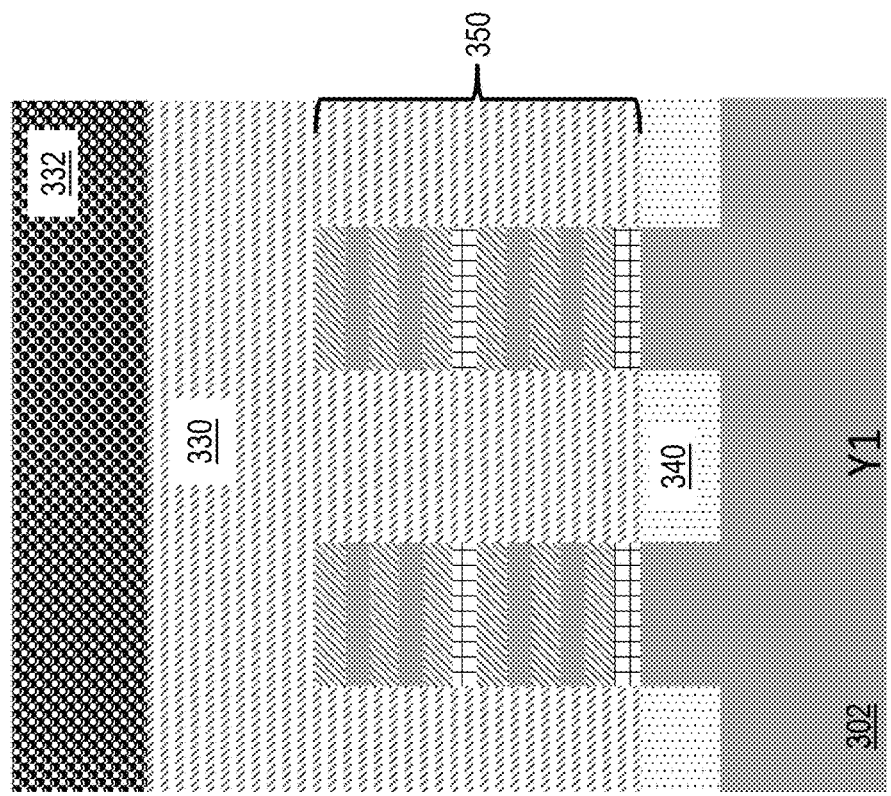
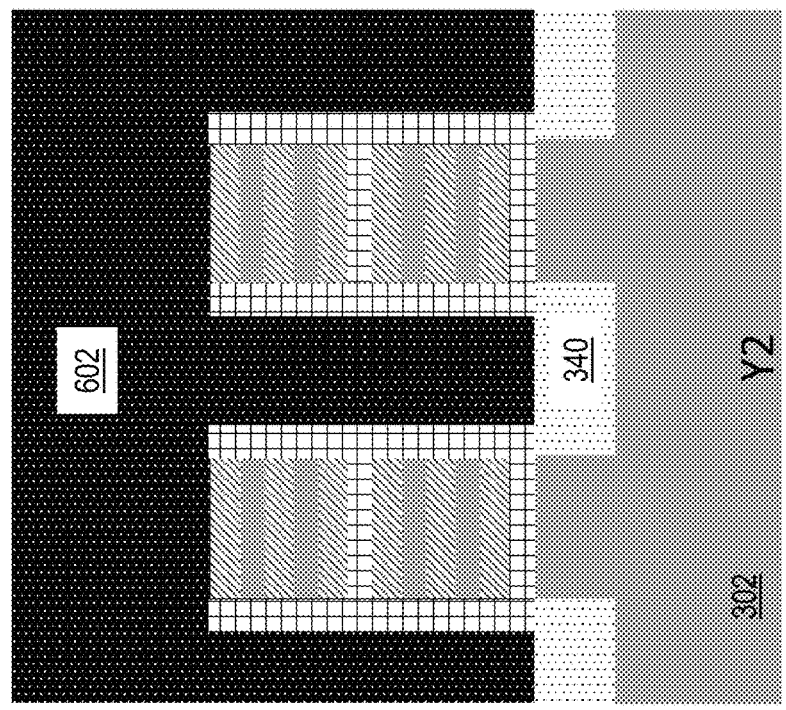

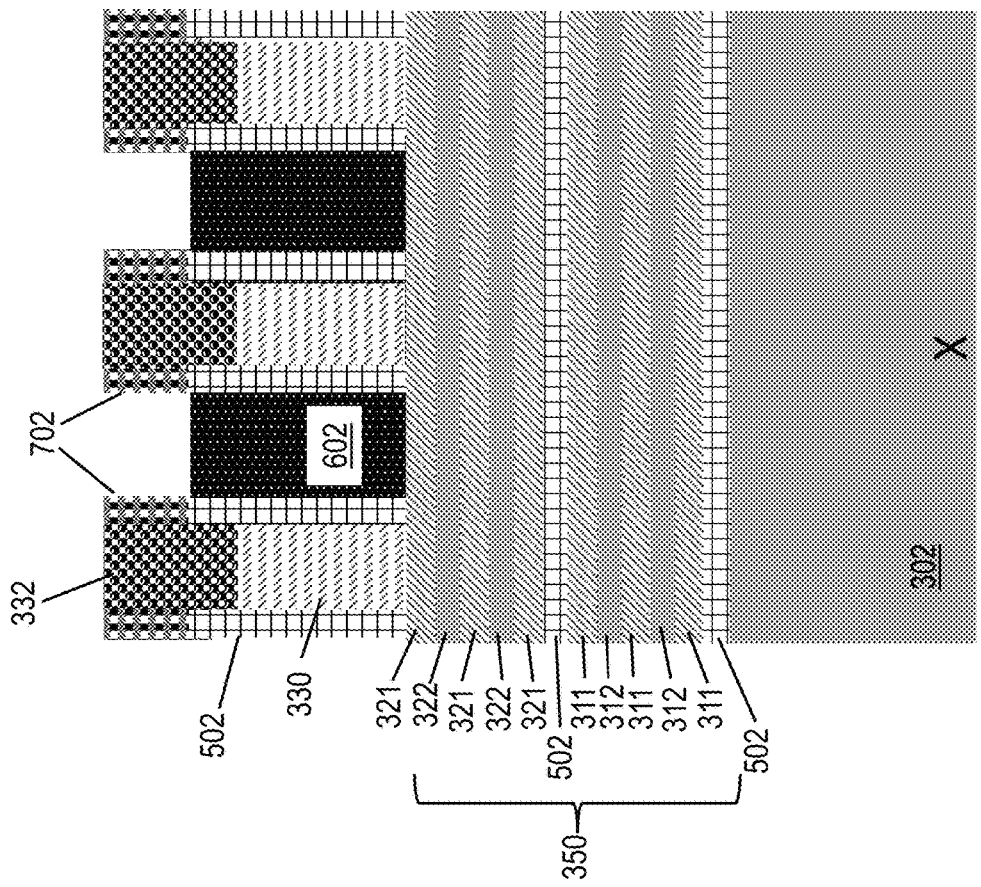
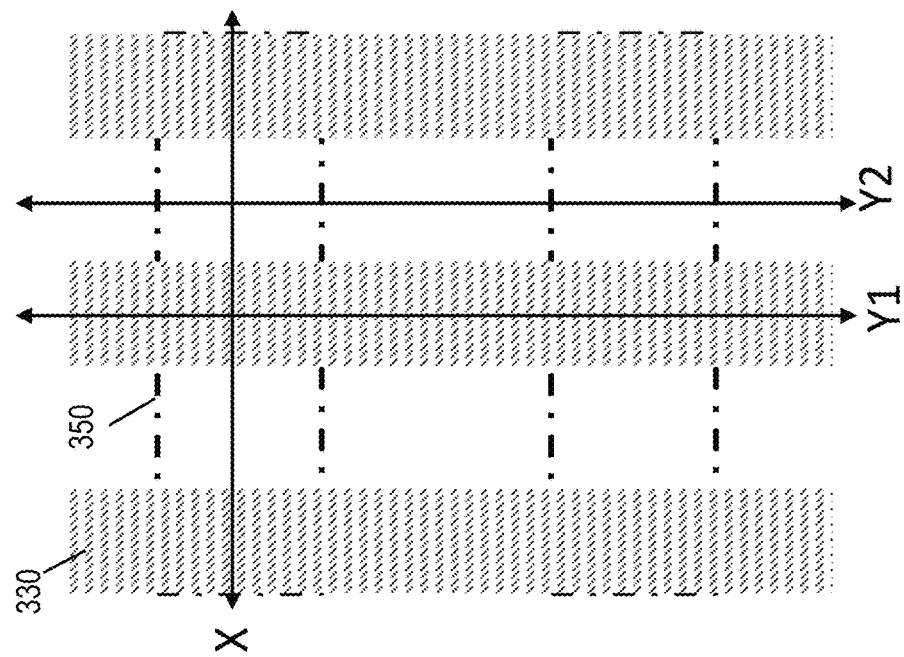

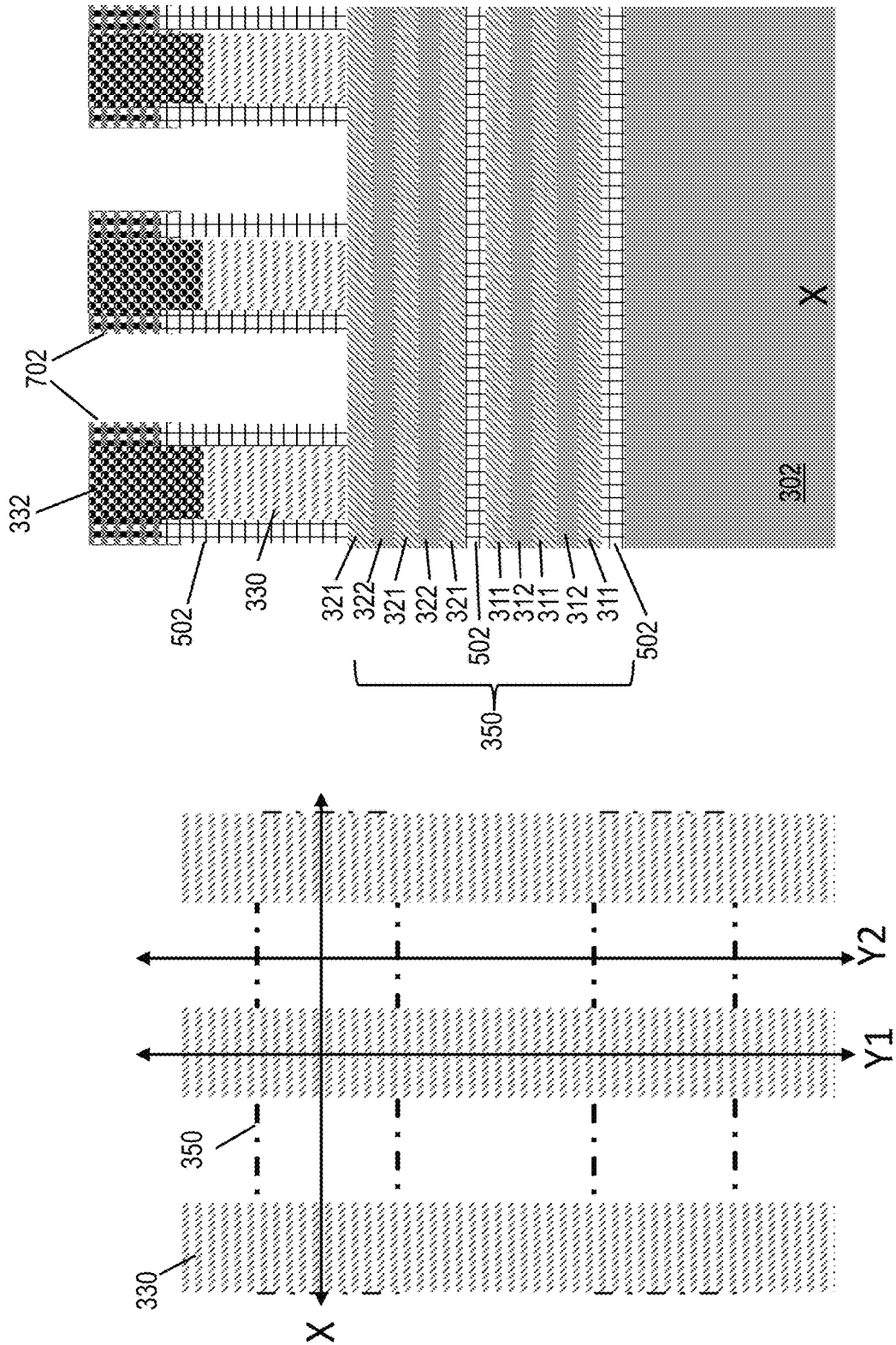

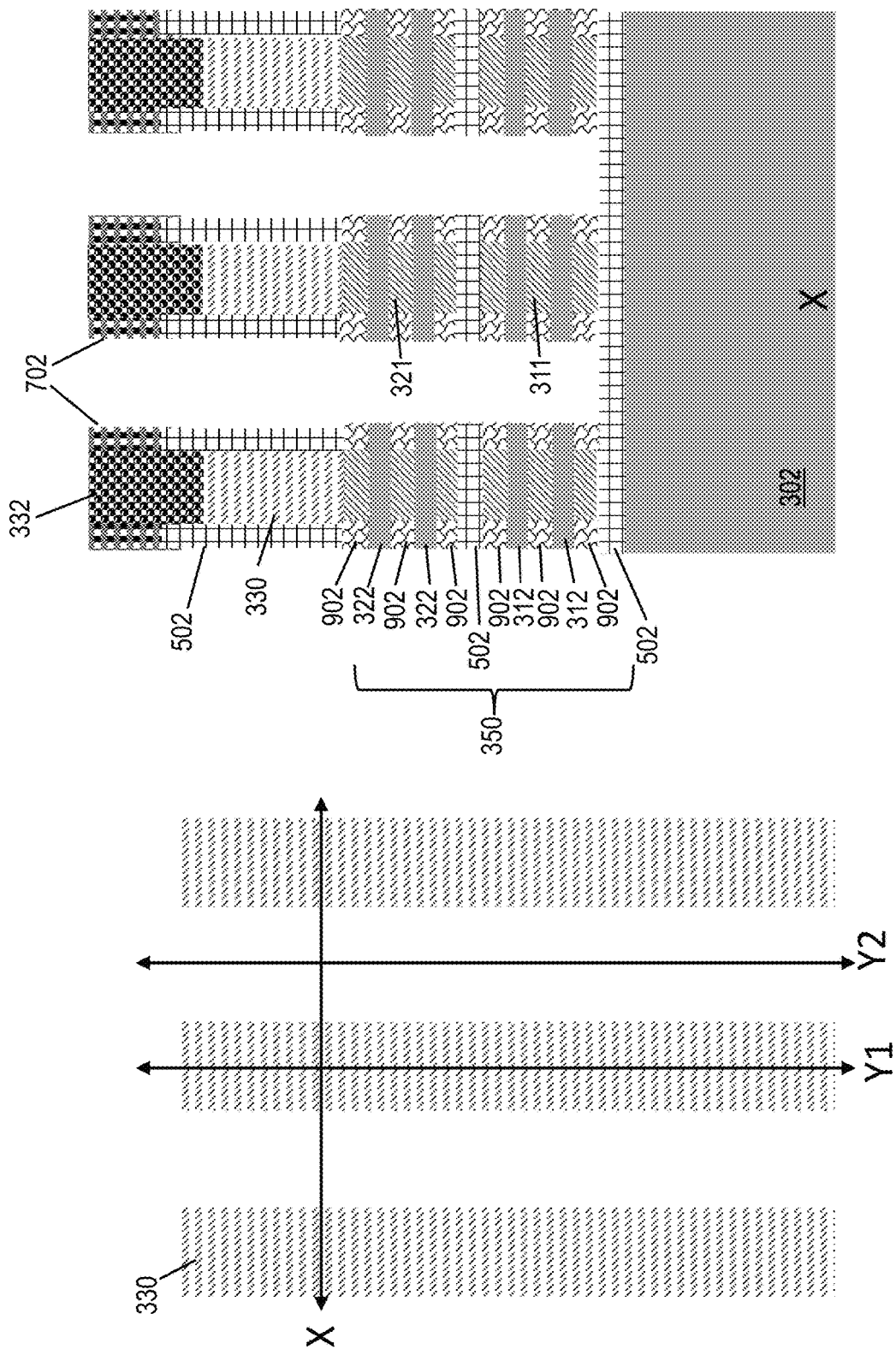

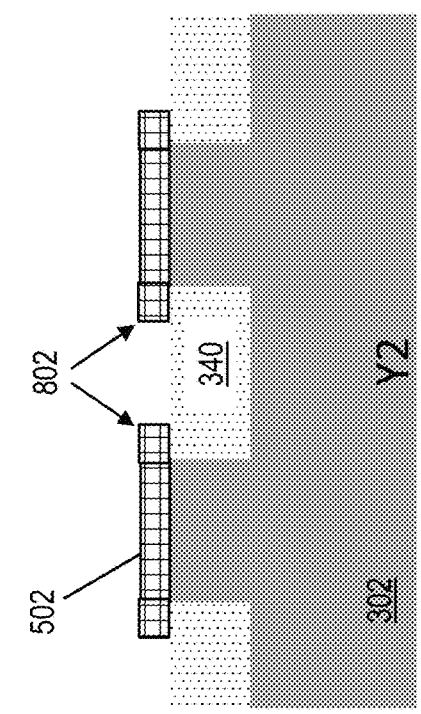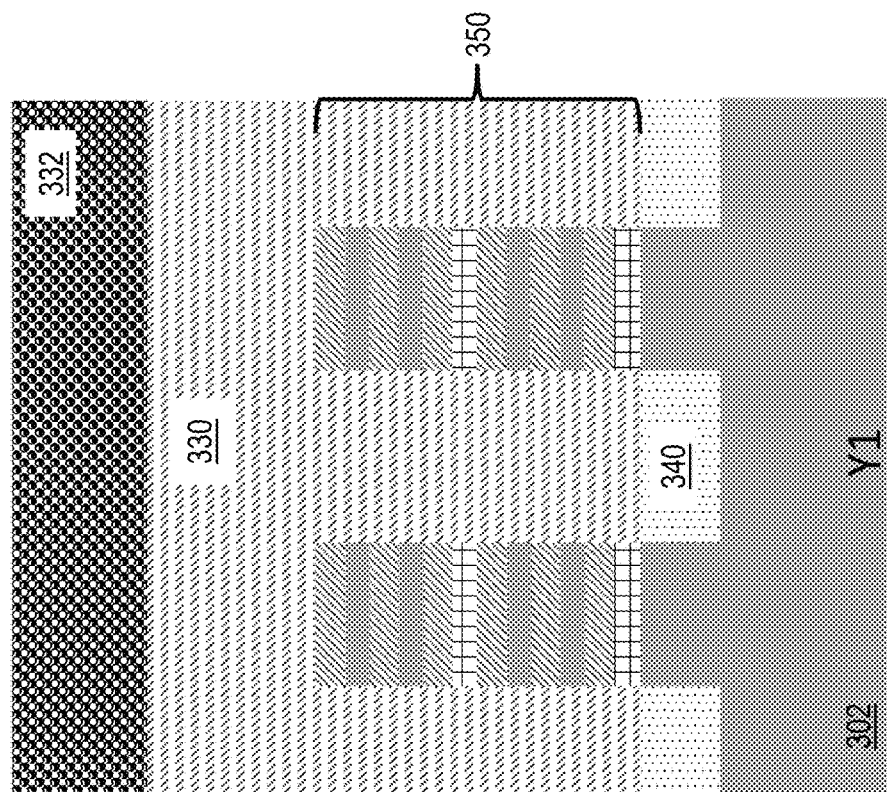

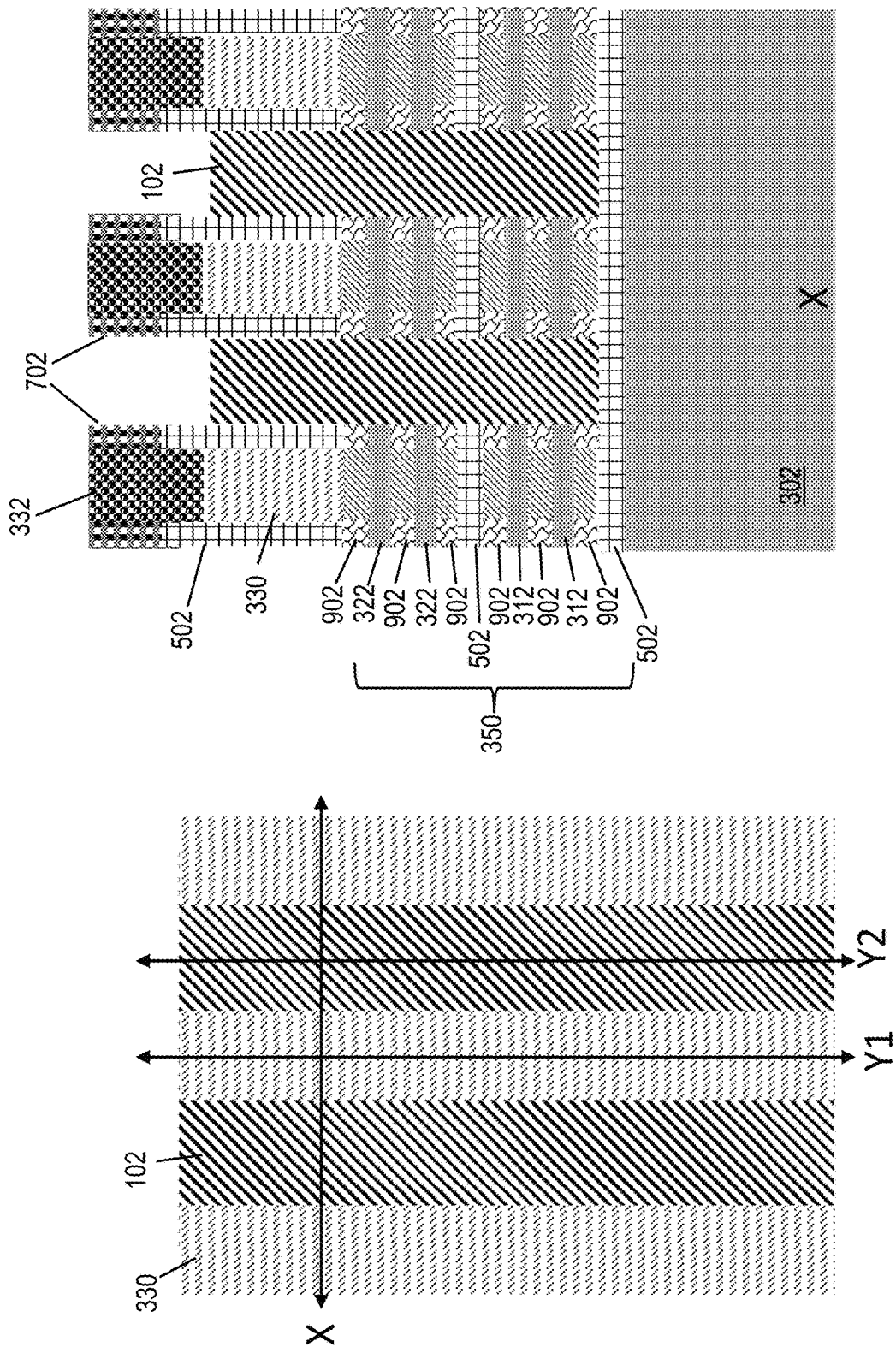

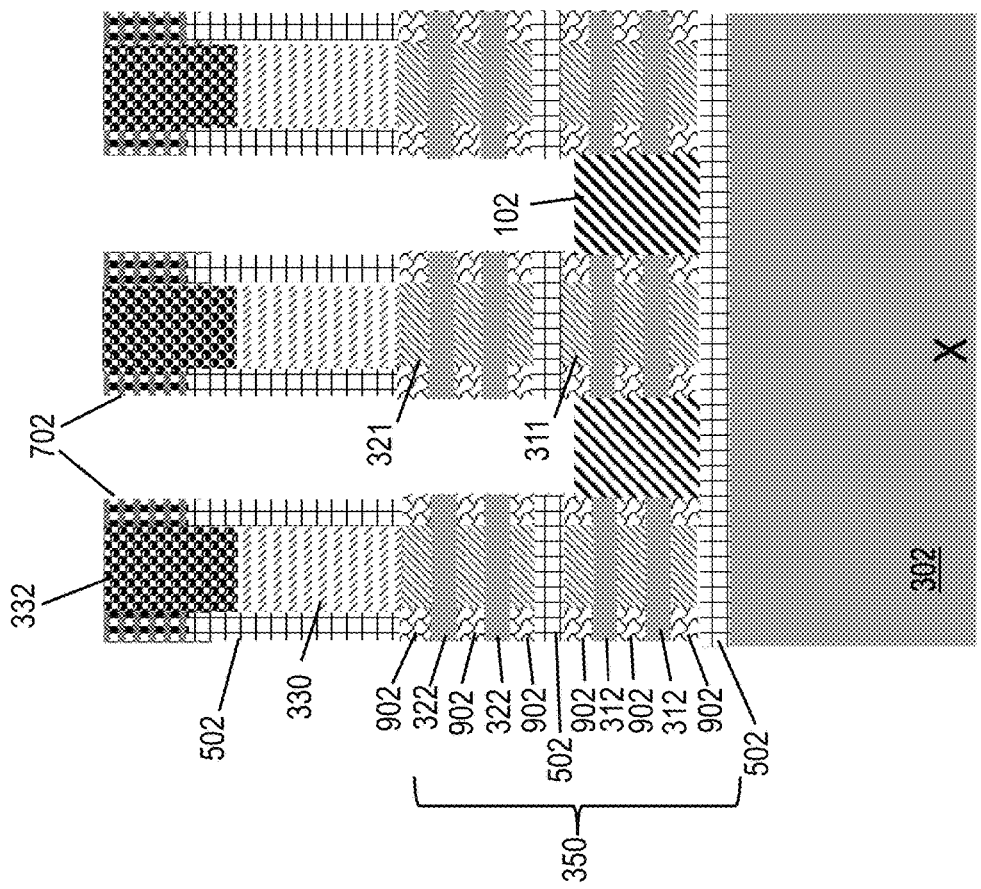
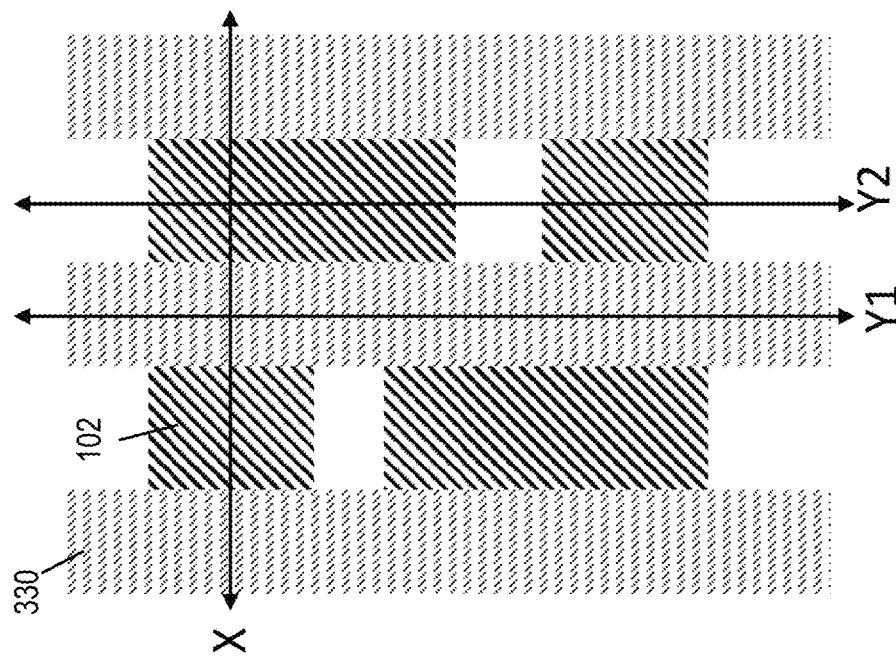

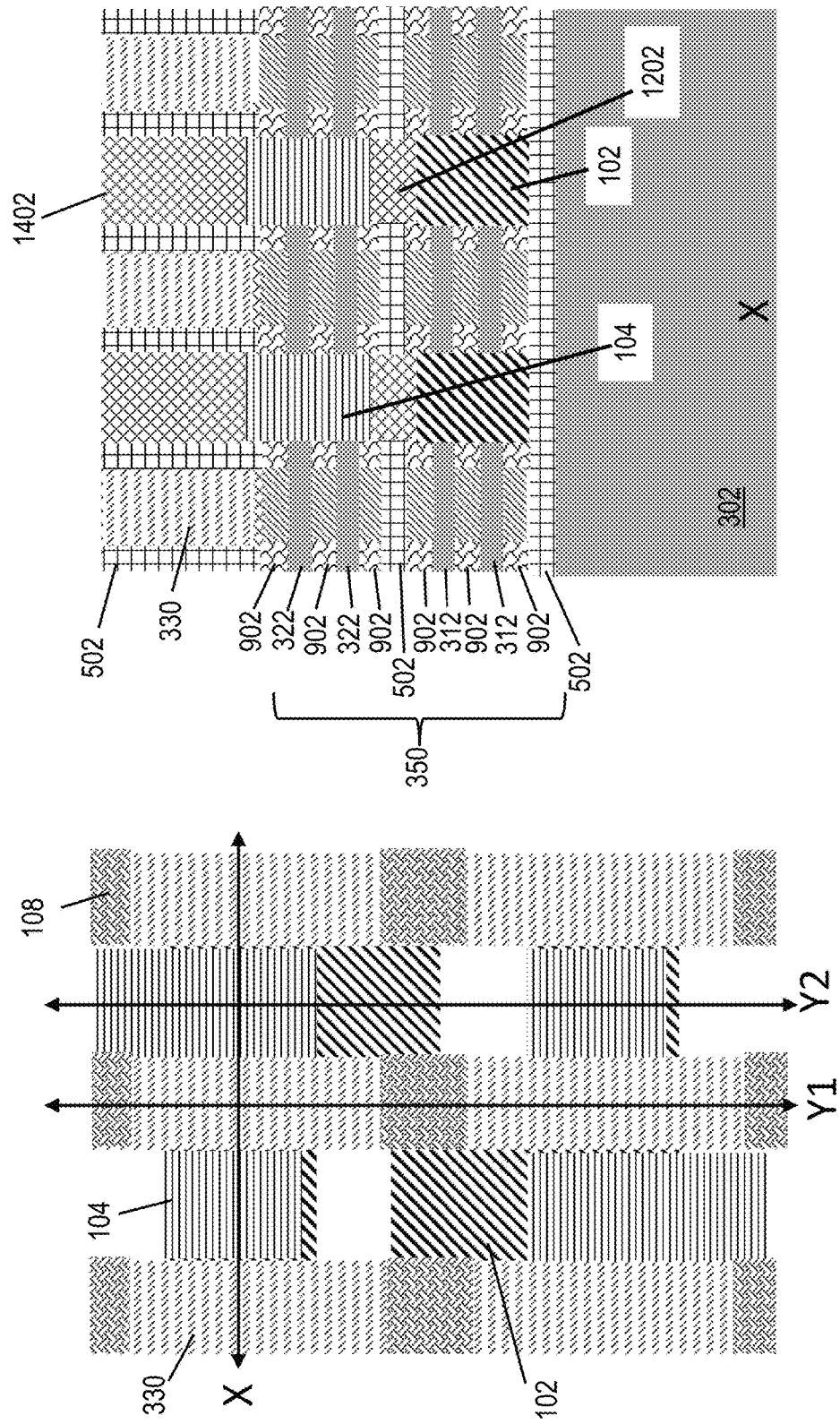

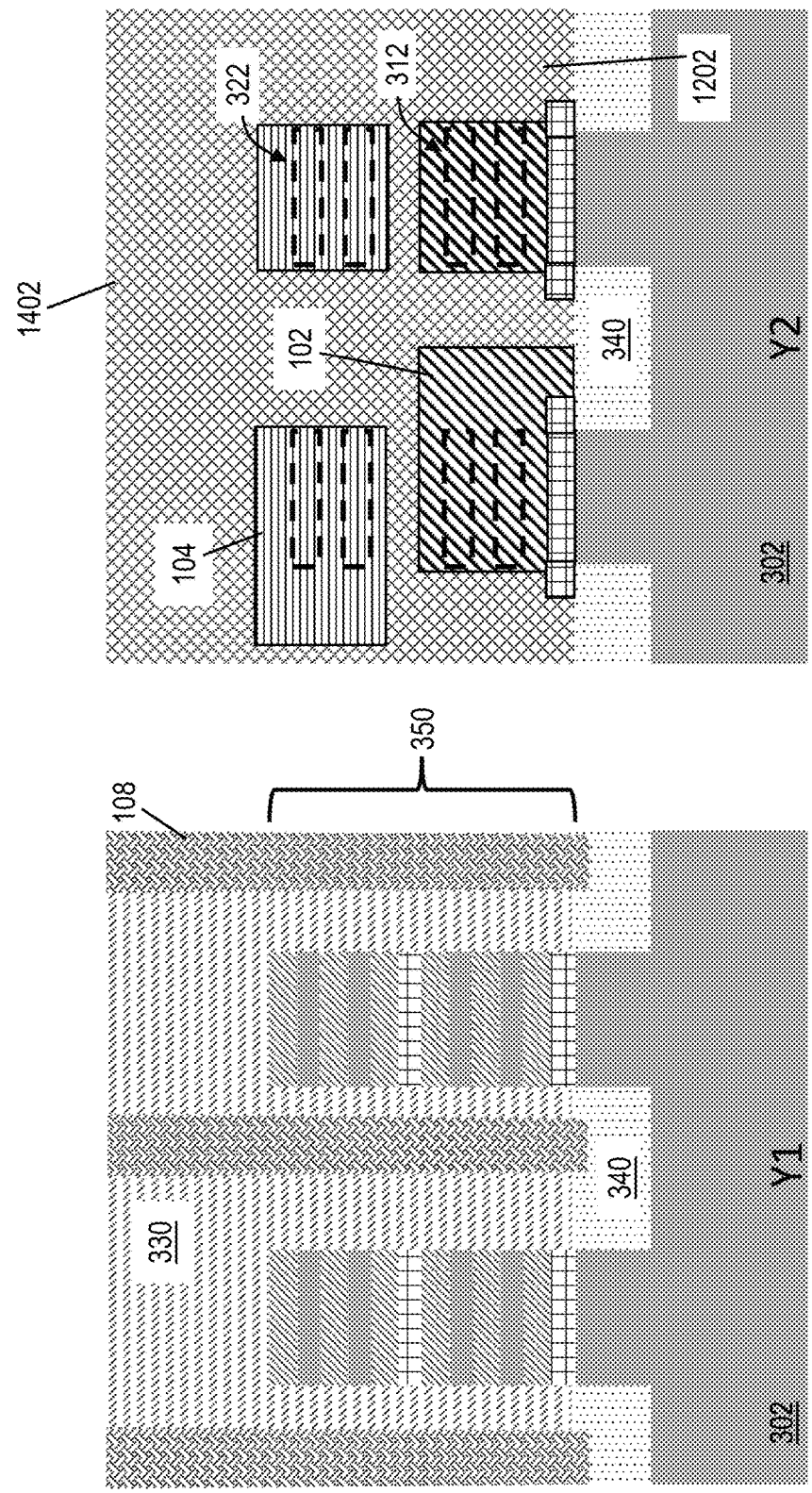

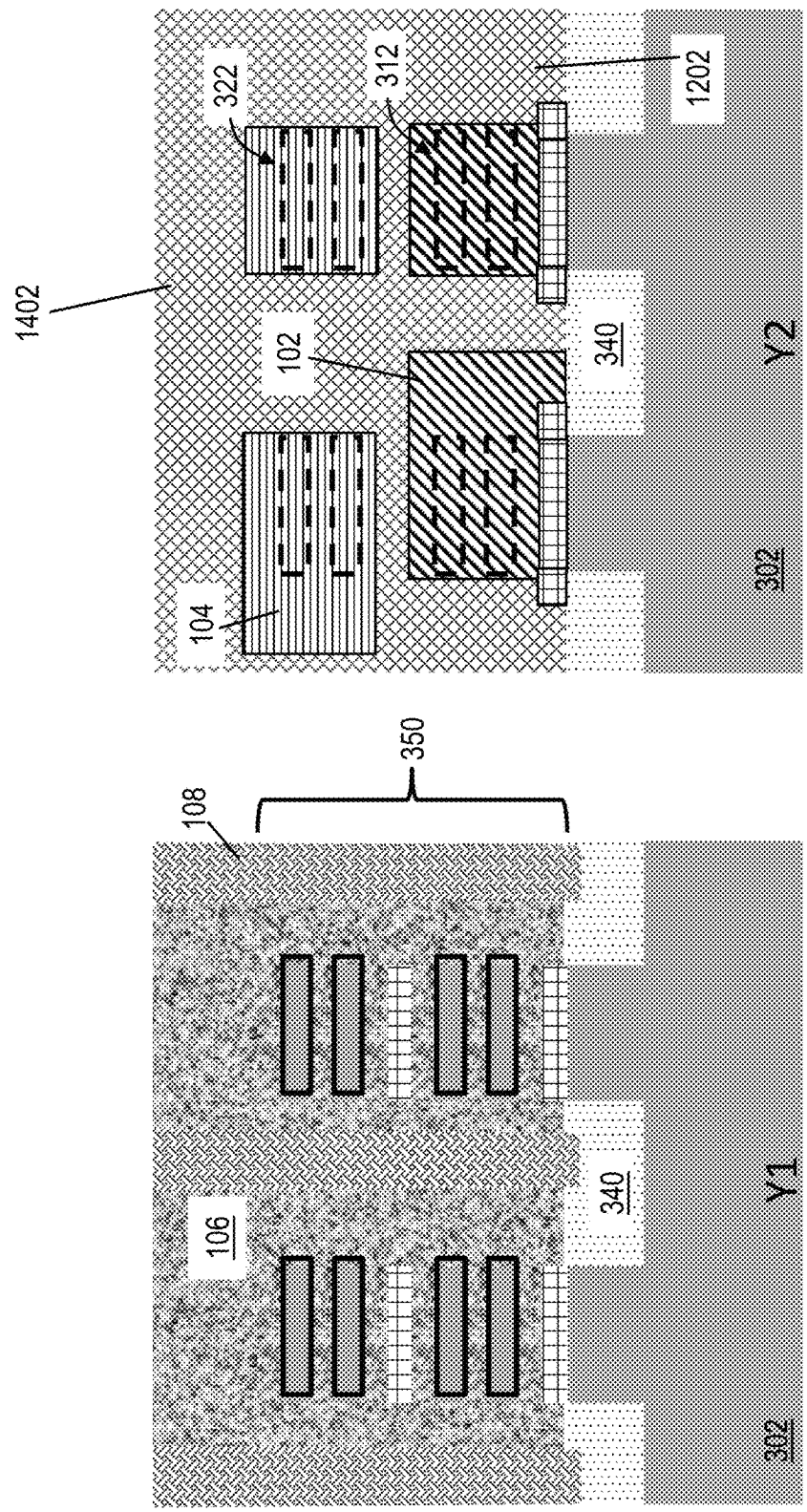

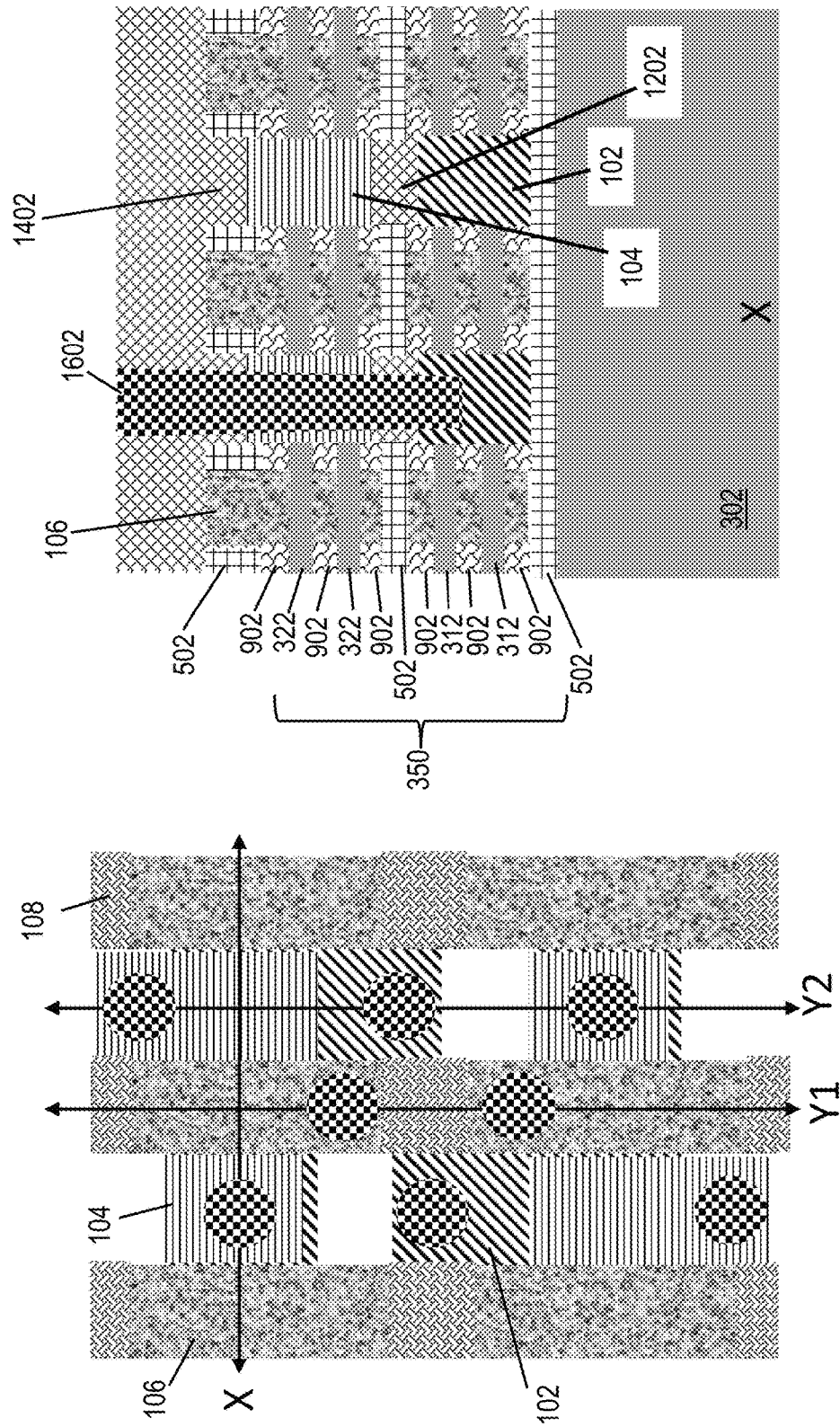

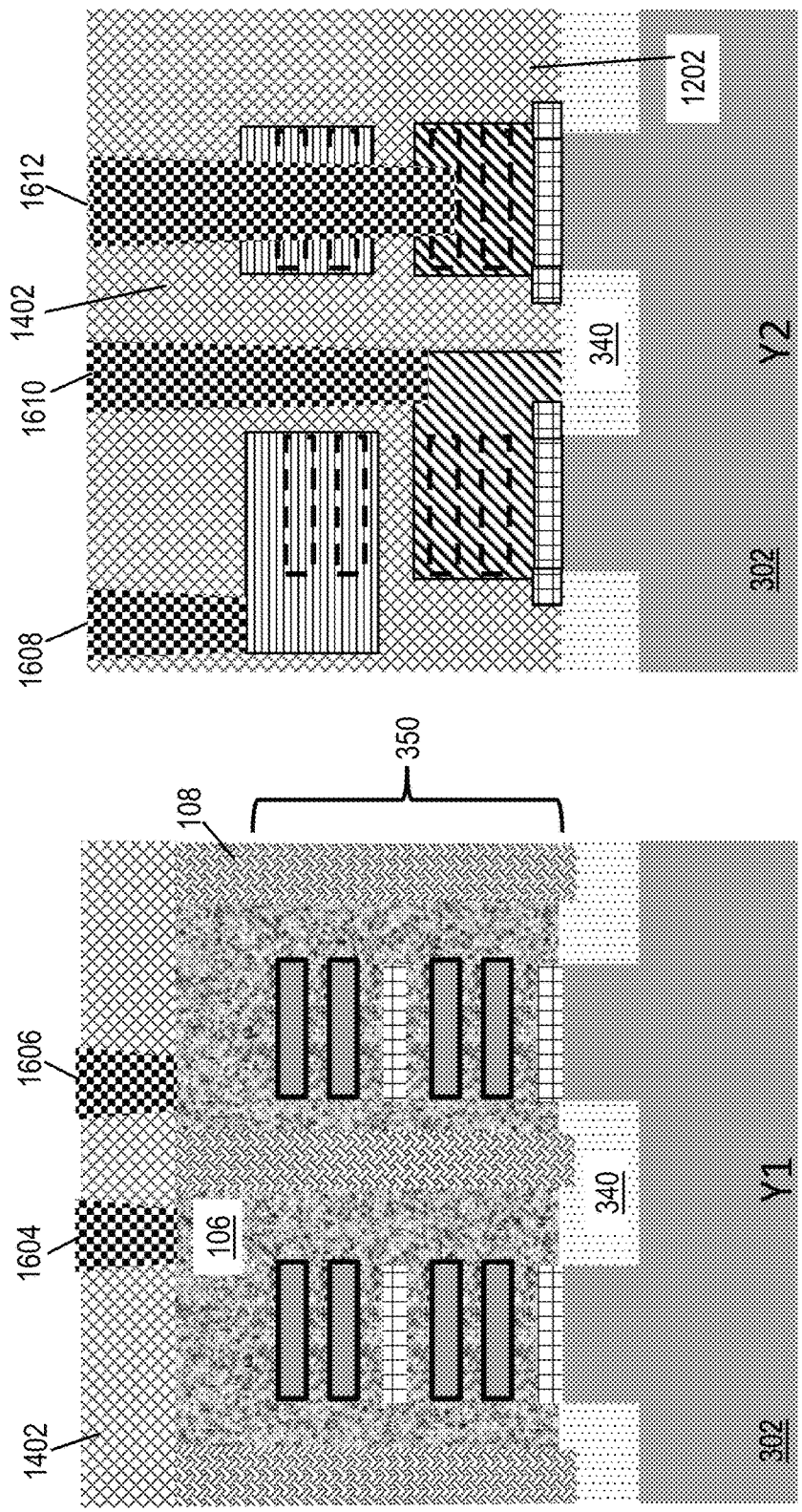

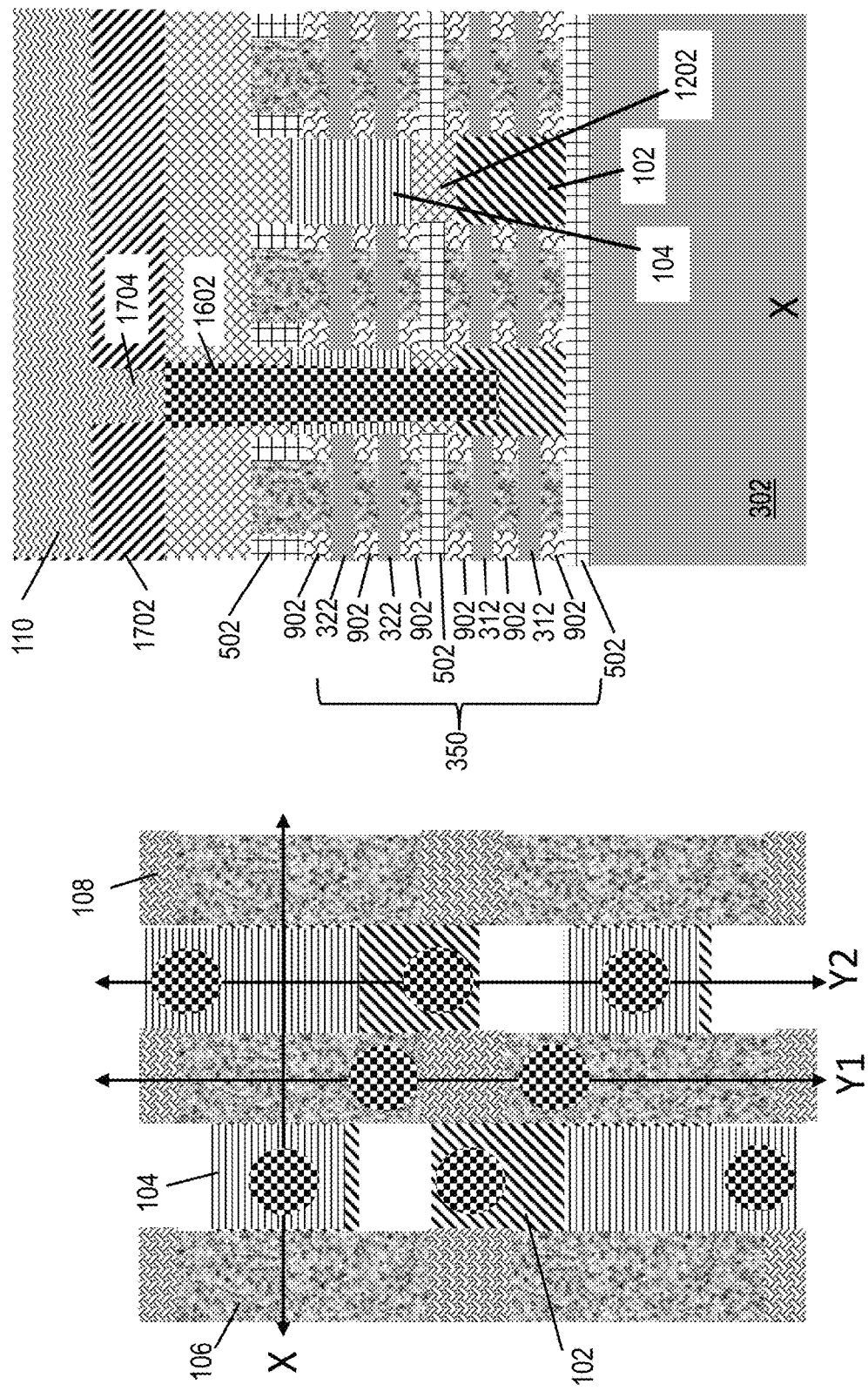

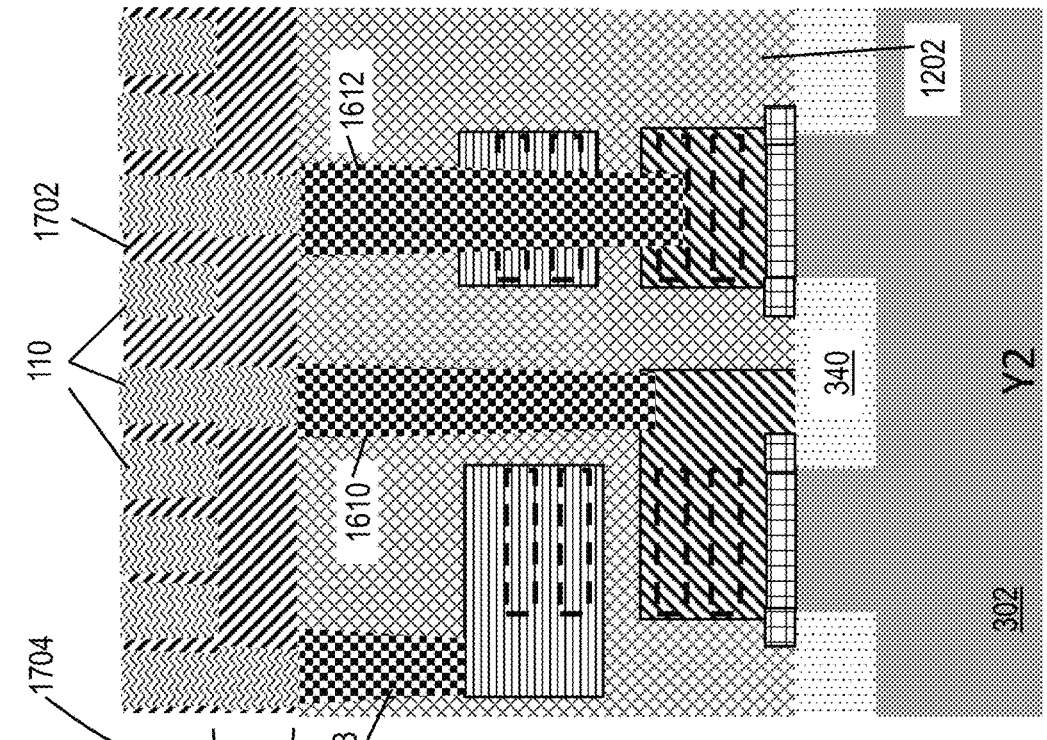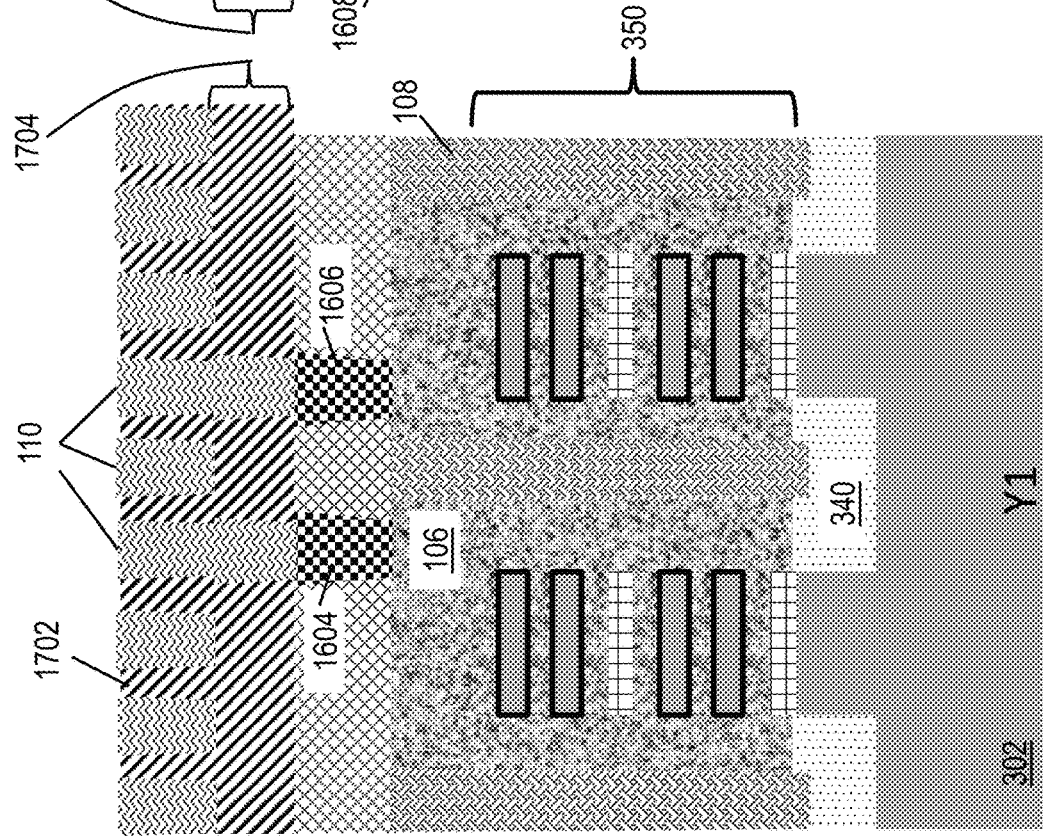

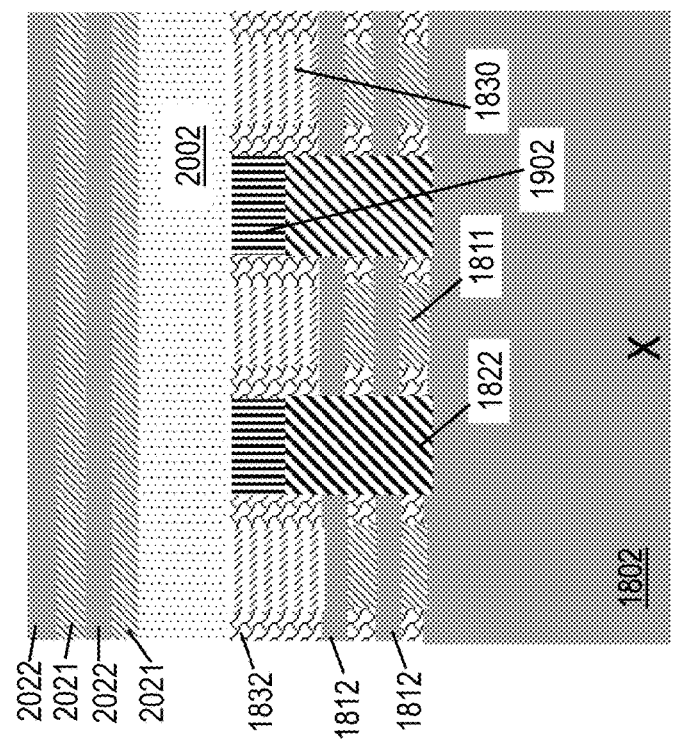
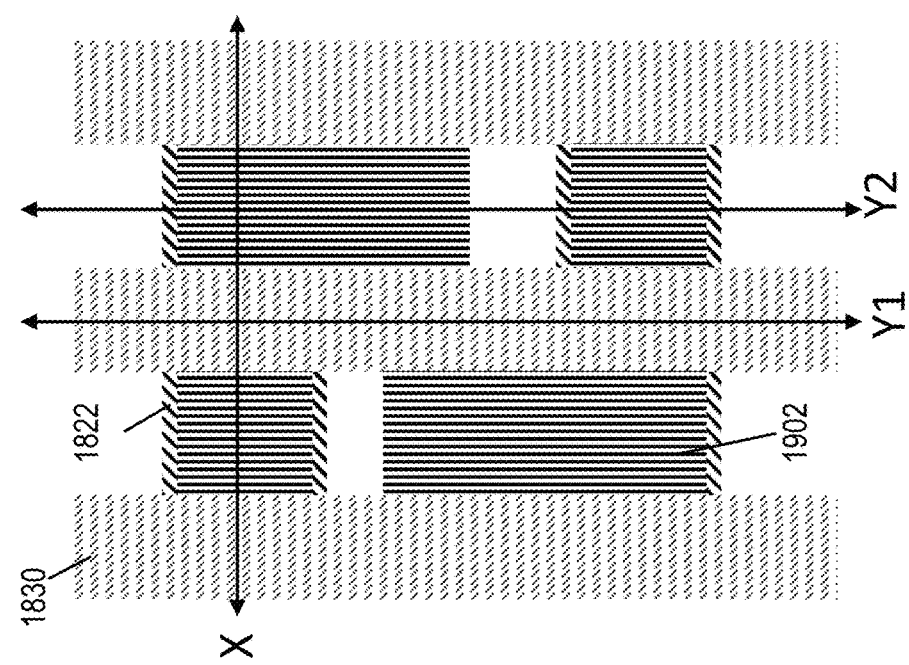
FIG. 20B 1800
FIG. 20A 1800

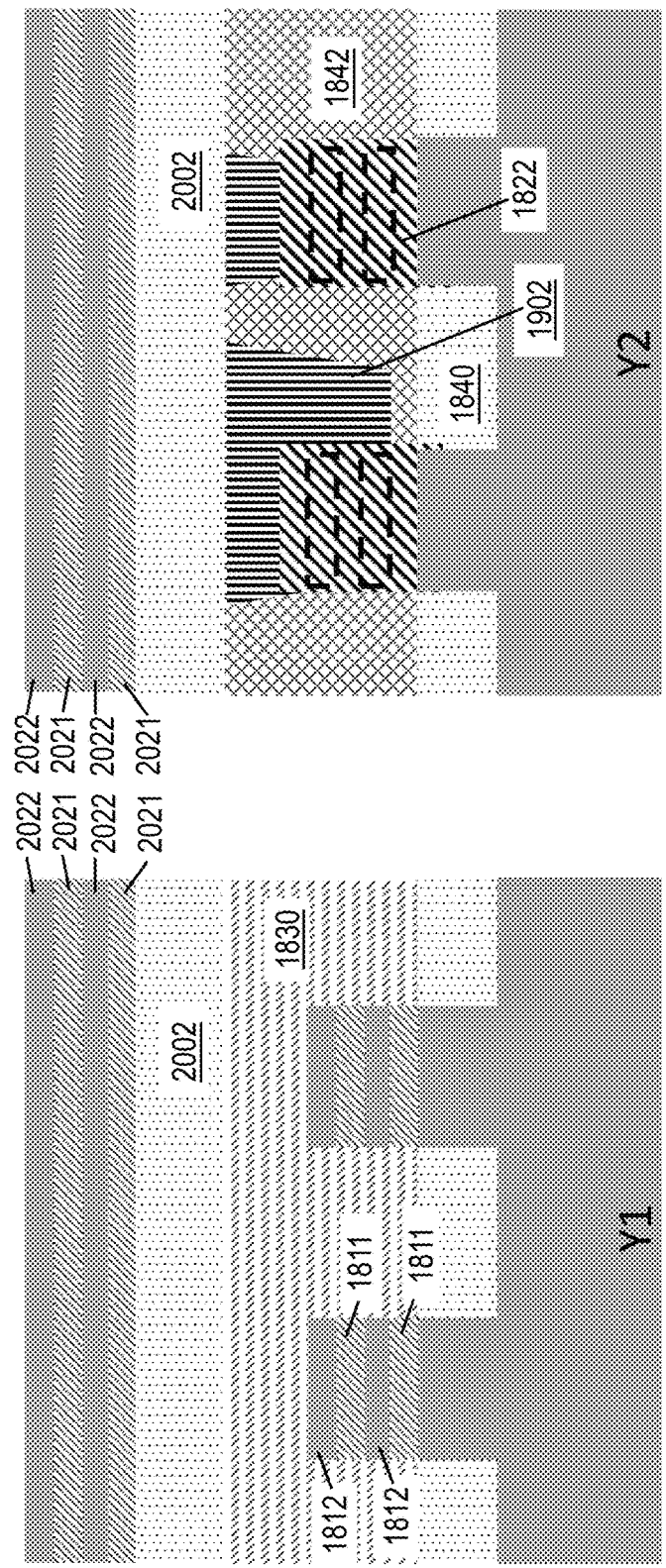

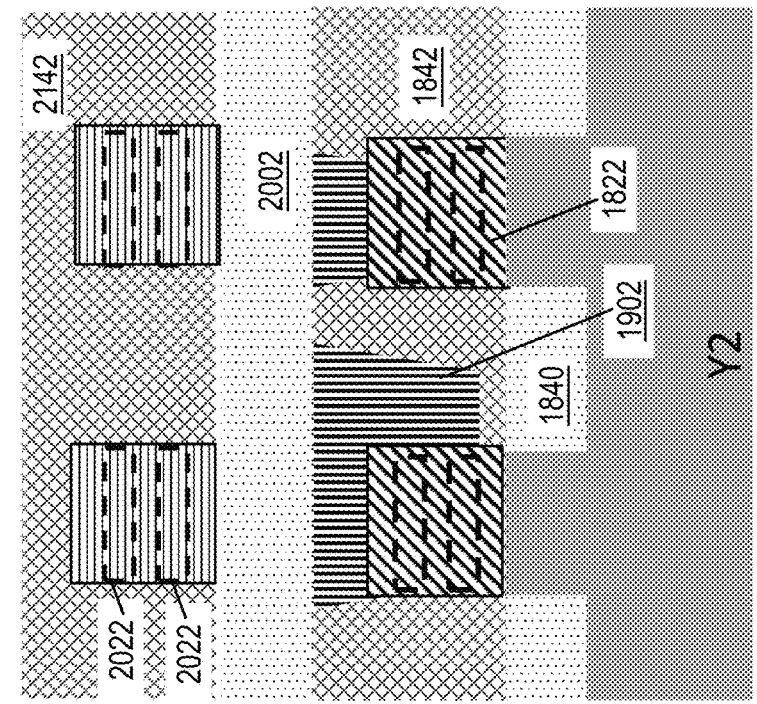

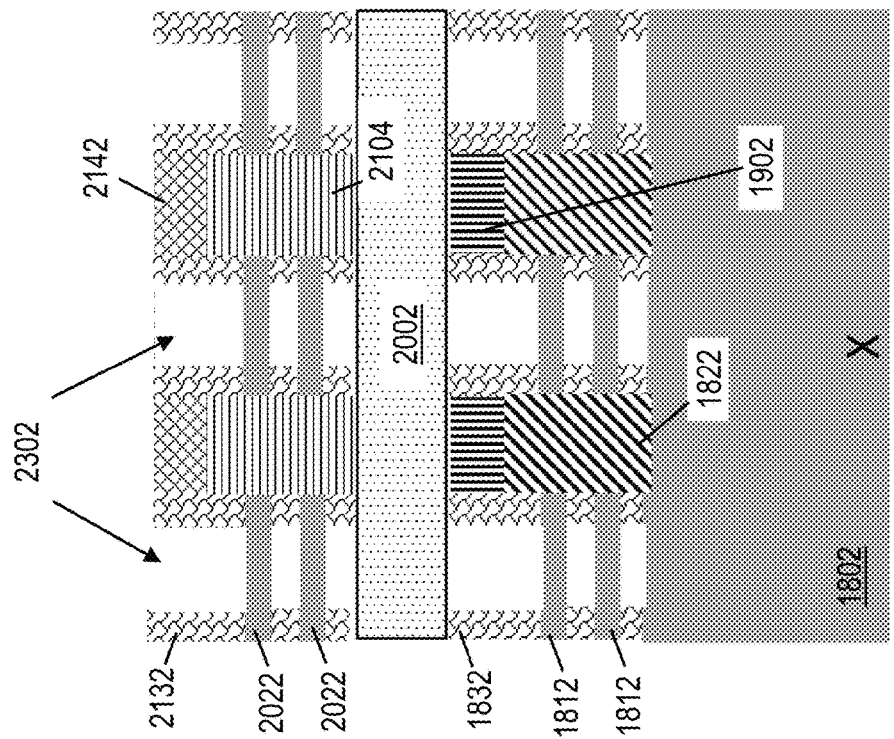
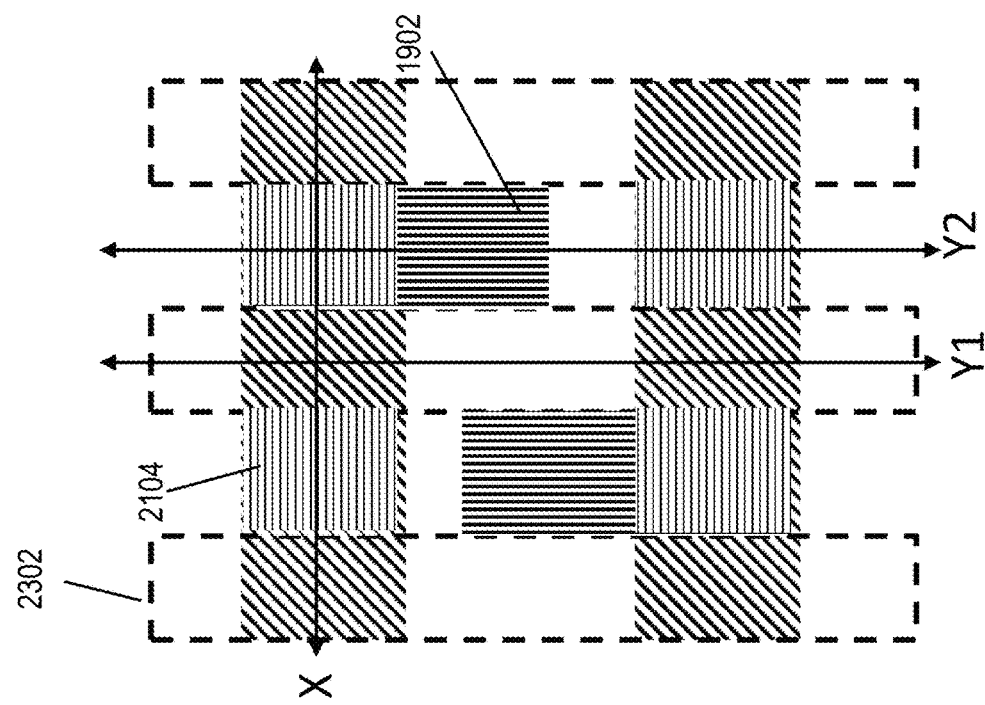

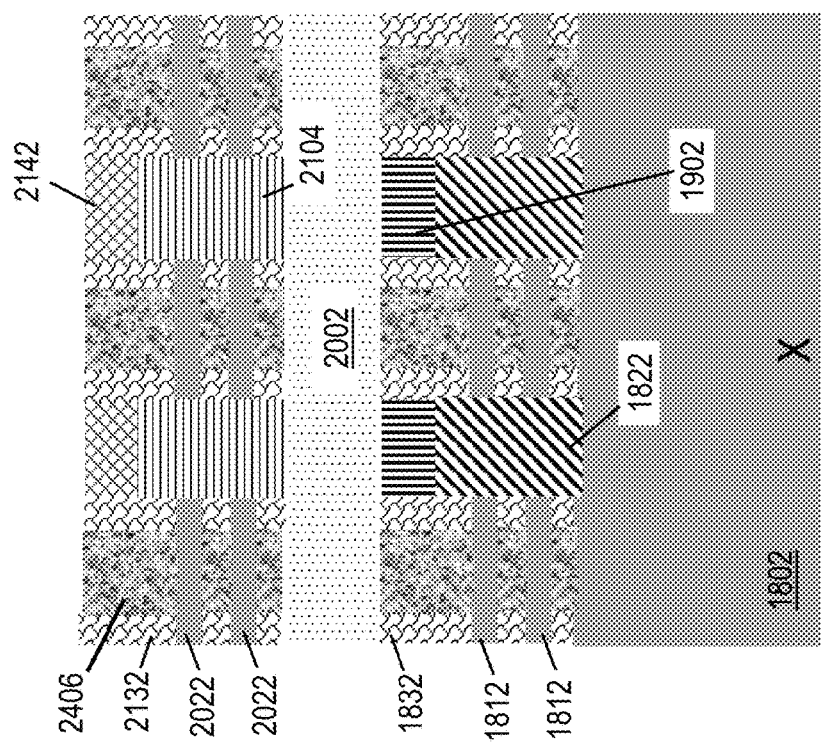
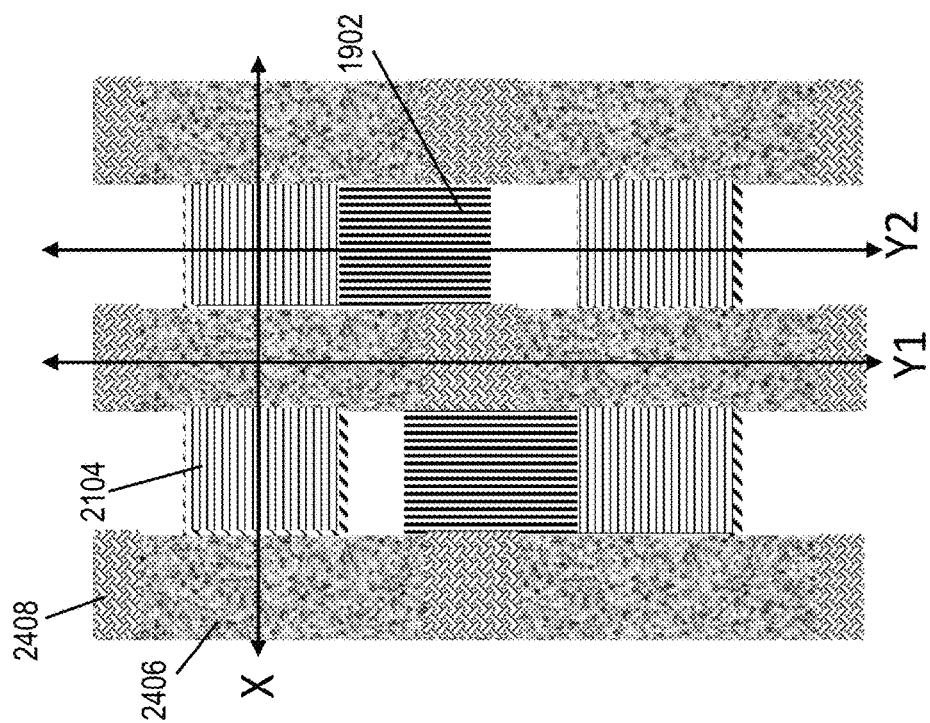

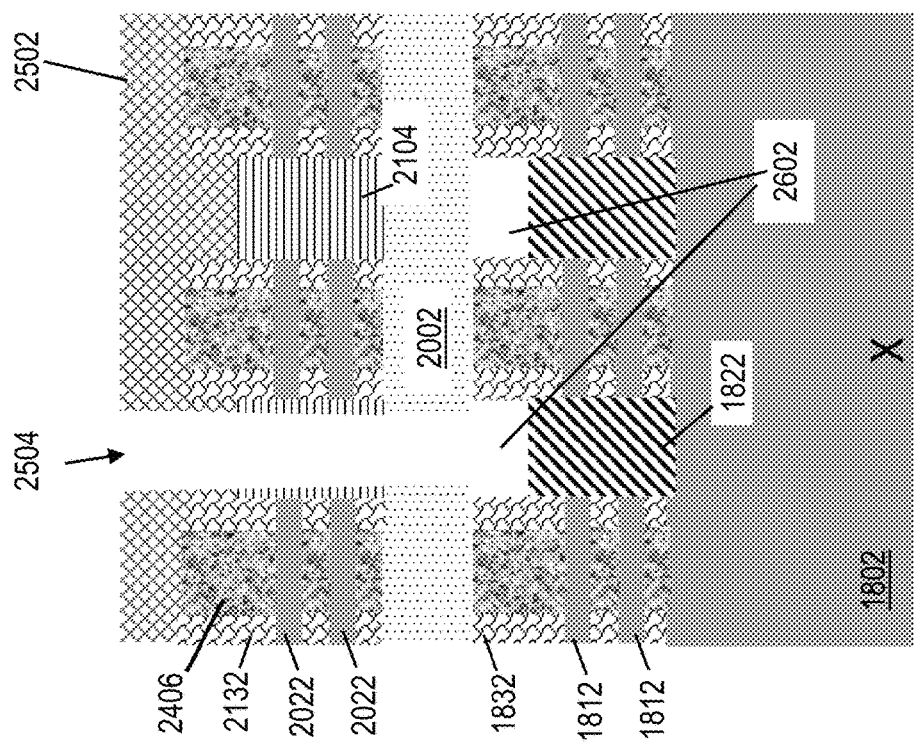
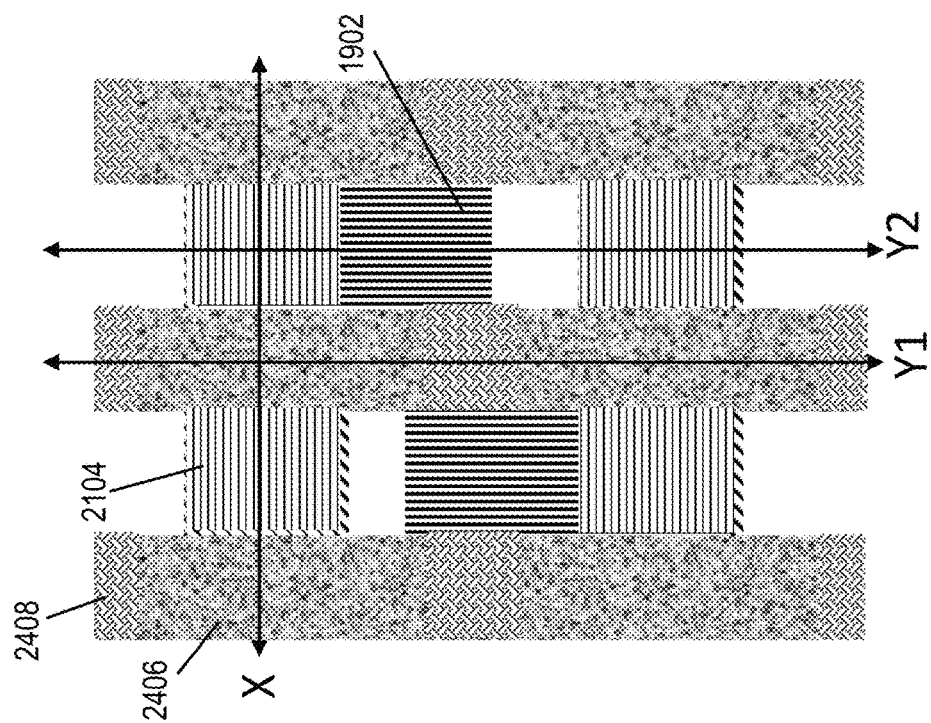

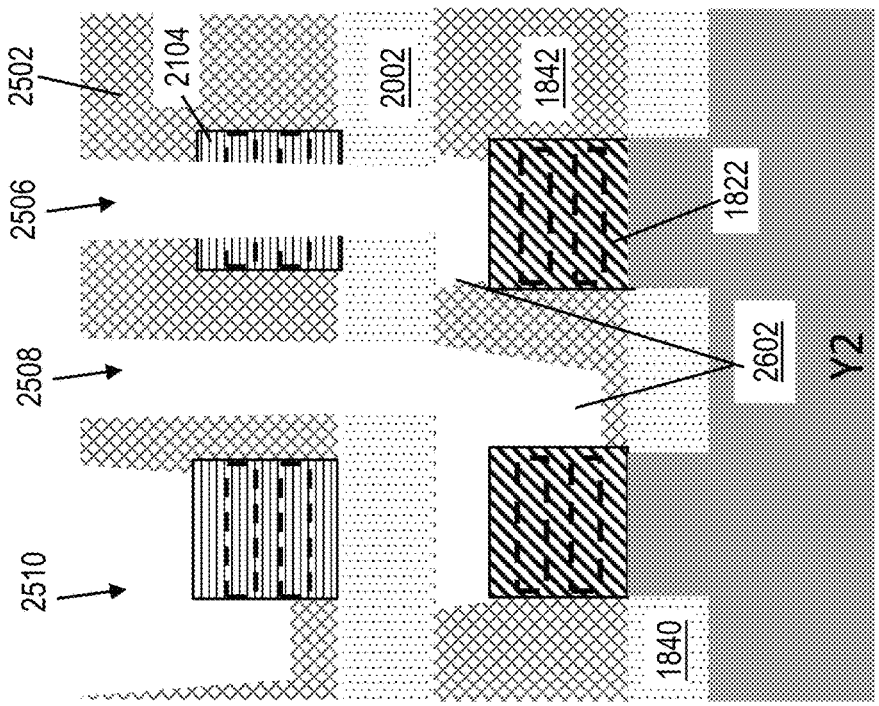
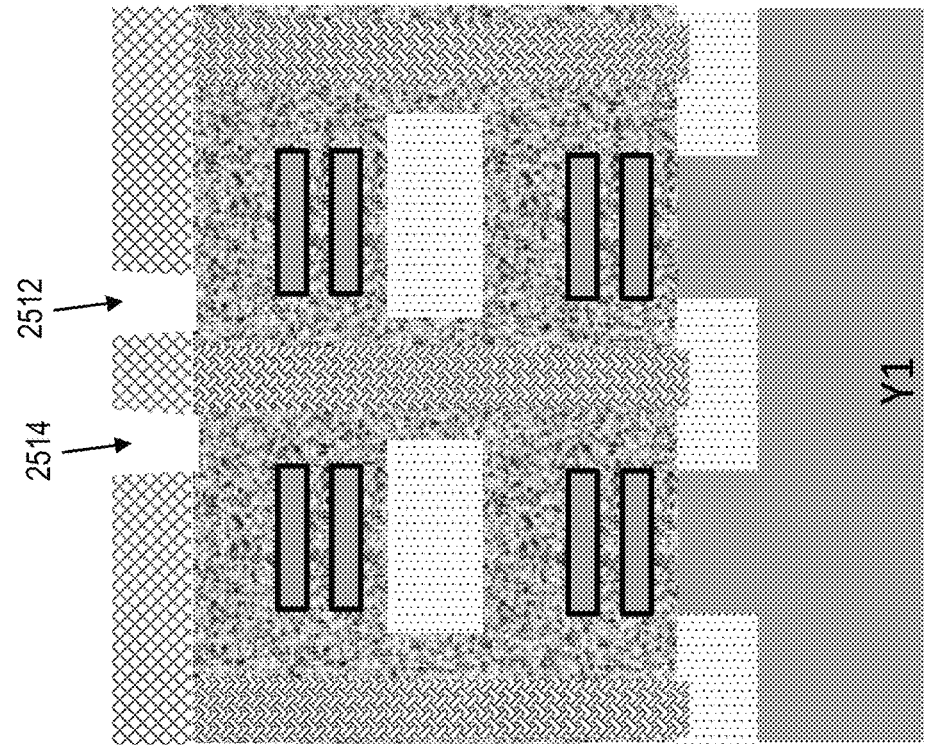

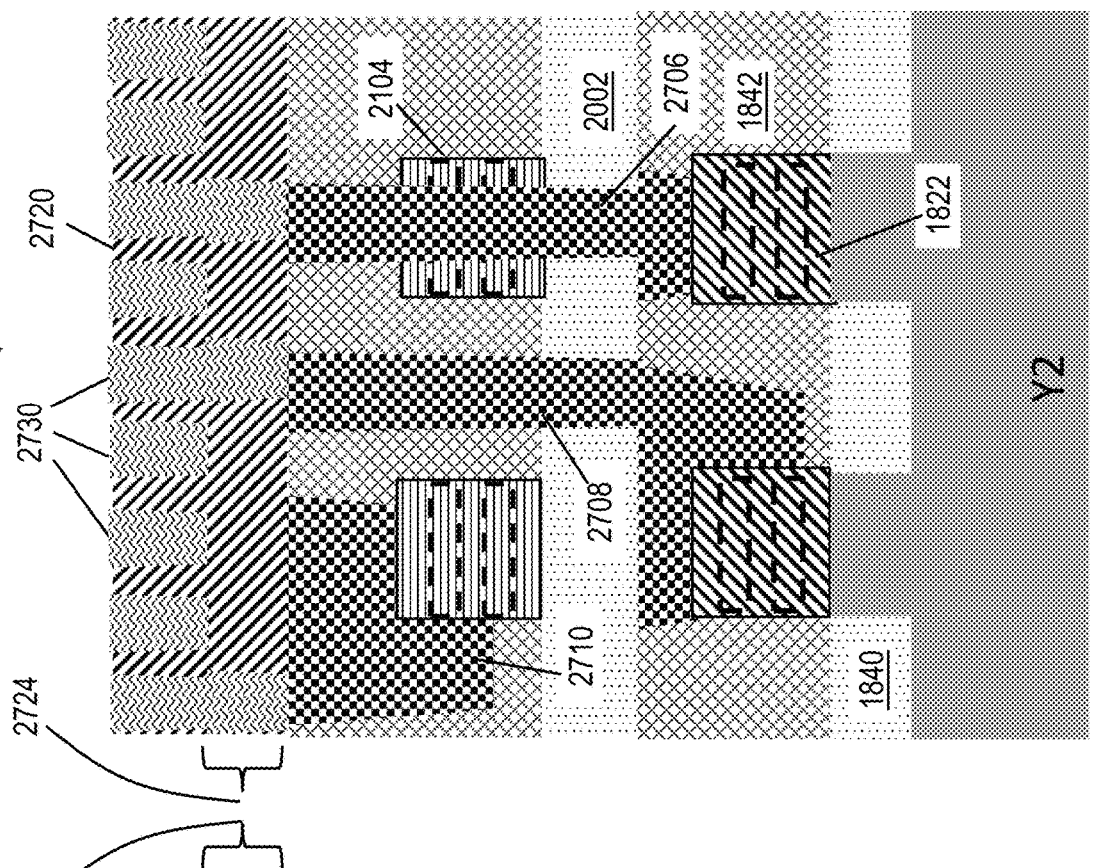
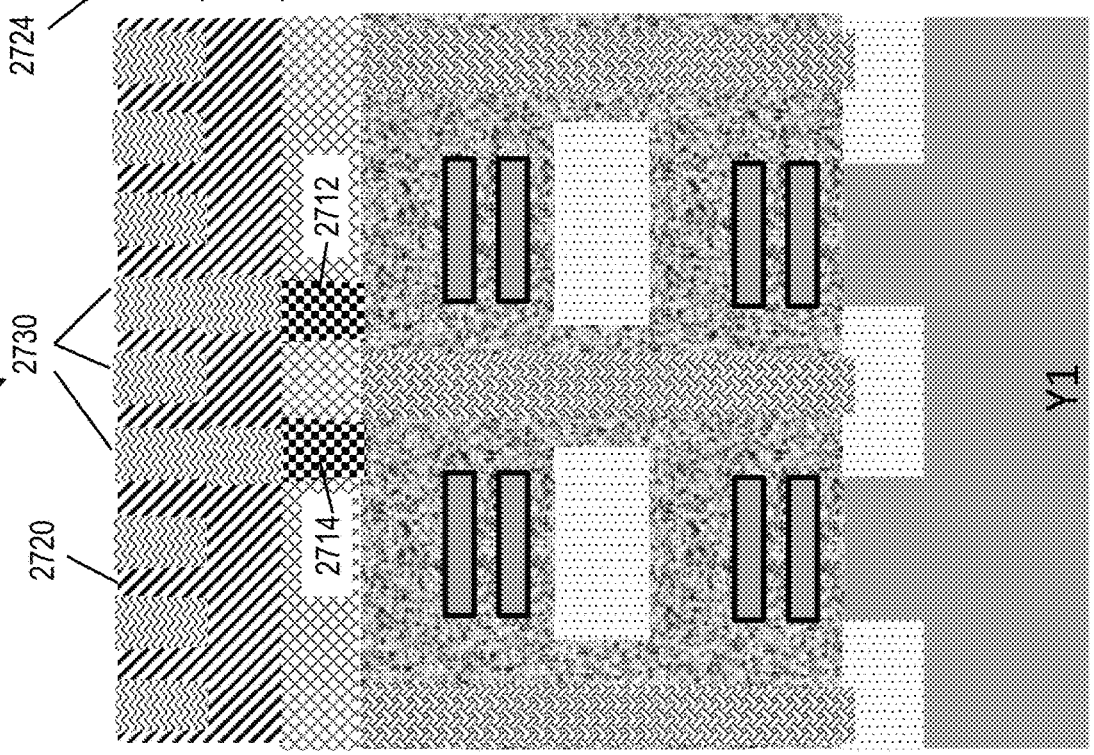

FIG. 28 2800

2802 PROVIDE A FIRST SOURCE REGION AND A FIRST DRAIN REGION FORMING A FIRST L-SHAPED LAYOUT

2804 PROVIDE A SECOND SOURCE REGION AND A SECOND DRAIN REGION FORMING A SECOND L-SHAPED LAYOUT, THE FIRST L-SHAPED LAYOUT AND THE SECOND L-SHAPED LAYOUT BEING INTERRUPTED BY A GATE

STACKED TRANSISTOR LAYOUT FOR IMPROVED CELL HEIGHT SCALING

BACKGROUND

The present invention generally relates to fabrication methods and resulting structures for integrated circuits (ICs), and more specifically, to fabrication methods and resulting structures configured and arranged to provide a stacked transistor layout for improved cell height scaling.

ICs (also referred to as a chip or a microchip) include electronic circuits on a wafer. The wafer is a semiconductor material, such as, for example, silicon or other materials. An IC is formed of a large number of devices, such as transistors, capacitors, resistors, etc., formed in layers of the IC and interconnected with wiring in the back-end-of-line (BEOL) layers of the wafer. on the wafer. Typical ICs are formed by first fabricating individual semiconductor devices using processes referred to generally as the front-end-of-line (FEOL). A metal-oxide-semiconductor field-effect transistor (MOSFET) is a transistor used for amplifying or switching electronic signals. The MOSFET has a source, a drain, and a metal oxide gate electrode. A conventional FET is a planar device where the entire channel region of the device is formed parallel and slightly below the planar upper surface of the semiconducting substrate. In contrast to a planar FET, there are so-called three-dimensional (3D) devices, such as a FinFET device, which is a three-dimensional structure. One type of device that shows promise for advanced integrated circuit products of the future is generally known as a nanosheet transistor. In general, a nanosheet transistor has a fin-type channel structure that includes of a plurality of vertically spaced-apart sheets of semiconductor material. A gate structure for the device is positioned around each of these spaced-apart layers of channel semiconductor material.

One example of a complex gate-all-around technology is a complementary-FET, which is a 3D monolithic structure having N-type FET (NFET) and P-type FET (PFET) nanowires/nanosheets vertically stacked on top of each other. A complementary-FET layout typically has P-type FETs on one level and N-type FETs on an adjacent level (i.e., above or below). In such structures, the source/drain regions of the lower FET are electrically isolated from the source/drain regions of the upper FET by dielectric layers. Thereafter, the BEOL is the second portion of IC fabrication where wiring of the IC is formed. The BEOL layer that includes the interconnection of wiring is referred to as the metallization layer, which generally begins when the first layer of metal is deposited on the wafer. BEOL layers of the IC generally include contacts, insulating layers (dielectrics), metal levels, bonding sites for chip-to-package connections, etc. ICs typically have interconnect levels, each level consisting of metallic lines (or tracks) and vias. Although methods and resulting stacked FETs are suitable for their intended purposes, one or more embodiments provide improvements.

SUMMARY

Embodiments of the present invention are directed to providing fabrication methods and resulting structures for a stacked transistor layout for improved cell height scaling. A non-limiting method includes providing a first source region and a first drain region forming a first L-shaped layout and providing a second source region and a second drain region forming a second L-shaped layout, the first L-shaped layout and the second L-shaped layout being interrupted by a gate. This can provide an improvement over known methods for stacked FET device by allowing for staggered connections to contacts. The channel region of the upper and lower FETs is equivalent or the same size.

In addition to one or more of the features described above or below, or as an alternative, further embodiments of the invention disclose wherein a first portion of the first L-shaped layout overlaps a second portion of the second L-shaped layout. This advantageously allows for simpler and staggered connections to the top and bottom transistors, which make connections more efficient.

In addition to one or more of the features described above or below, or as an alternative, further embodiments of the invention disclose wherein the first L-shaped layout and the second L-shaped layout have different orientations such that the first and second L-shaped layouts avoid a complete overlap. This advantageously allows for simpler and staggered connections to the top and bottom transistors, which make connections more efficient to the stacked FET device.

In addition to one or more of the features described above or below, or as an alternative, further embodiments of the invention disclose wherein a first channel region associated with the first source region and the first drain region overlaps a second channel region associated with the second source region and the second drain region. This advantageously allows the channels regions to have the same width.

In addition to one or more of the features described above or below, or as an alternative, further embodiments of the invention disclose wherein a first end of the first L-shaped layout is configured to operatively couple to a first power source and a second end of the second L-shaped layout is configured to operatively couple to a second power source, the first end and the second end being non-overlapping. This advantageously allows for simpler and staggered connections to the top and bottom transistors (e.g., Vdd and Vss), which make connections more efficient to the stacked FET device.

In addition to one or more of the features described above or below, or as an alternative, further embodiments of the invention disclose wherein an overlapped end of the first L-shaped layout and the second L-shaped layout is configured to operatively couple to an output connection. This advantageously allows for simpler and staggered connections to the top and bottom transistors (e.g., Vout), which make connections more efficient to the stacked FET device.

Other embodiments of the present invention implement features of the above-described devices/structures in methods and/or implement features of the methods in devices/structures.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1A and 1B depict a top view of a simplified illustration of a portion of an integrated circuit (IC) according to embodiments of the invention;

FIG. 2 depicts views of L-shaped layouts according to one or more embodiments of the invention;

FIGS. 3A, 3B, 3C, and 3D respectively depict a top view and cross-sectional views of a portion of an IC under-fabrication after fabrication operations according to one or more embodiments of the invention;

FIGS. 4A, 4B, 4C, and 4D respectively depict a top view and cross-sectional views of a portion of an IC under-fabrication after fabrication operations according to one or more embodiments of the invention;

FIGS. 6A, 6B, 6C, and 6D respectively depict a top view and cross-sectional views of a portion of an IC under-fabrication after fabrication operations according to one or more embodiments of the invention;

FIGS. 7A, 7B, 7C, and 7D respectively depict a top view and cross-sectional views of a portion of an IC under-fabrication after fabrication operations according to one or more embodiments of the invention;

FIGS. 8A, 8B, 8C, and 8D respectively depict a top view and cross-sectional views of a portion of an IC under-fabrication after fabrication operations according to one or more embodiments of the invention;

FIGS. 9A, 9B, 9C, and 9D respectively depict a top view and cross-sectional views of a portion of an IC under-fabrication after fabrication operations according to one or more embodiments of the invention;

FIGS. 10A, 10B, 10C, and 10D respectively depict a top view and cross-sectional views of a portion of an IC under-fabrication after fabrication operations according to one or more embodiments of the invention;

FIGS. 11A, 11B, 11C, and 11D respectively depict a top view and cross-sectional views of a portion of an IC under-fabrication after fabrication operations according to one or more embodiments of the invention;

FIGS. 14A, 14B, 14C, and 14D respectively depict a top view and cross-sectional views of a portion of an IC under-fabrication after fabrication operations according to one or more embodiments of the invention;

FIGS. 15A, 15B, 15C, and 15D respectively depict a top view and cross-sectional views of a portion of an IC under-fabrication after fabrication operations according to one or more embodiments of the invention;

FIGS. 16A, 16B, 16C, and 16D respectively depict a top view and cross-sectional views of a portion of an IC under-fabrication after fabrication operations according to one or more embodiments of the invention;

FIGS. 17A, 17B, 17C, and 17D respectively depict a top view and cross-sectional views of a portion of an IC under-fabrication after fabrication operations according to one or more embodiments of the invention;

FIGS. 20A, 20B, 20C, and 20D respectively depict a top view and cross-sectional views of a portion of an IC under-fabrication after fabrication operations according to one or more embodiments of the invention;

FIGS. 21A, 21B, 21C, and 21D respectively depict a top view and cross-sectional views of a portion of an IC under-fabrication after fabrication operations according to one or more embodiments of the invention;

FIGS. 23A, 23B, 23C, and 23D respectively depict a top view and cross-sectional views of a portion of an IC under-fabrication after fabrication operations according to one or more embodiments of the invention;

FIGS. 24A, 24B, 24C, and 24D respectively depict a top view and cross-sectional views of a portion of an IC under-fabrication after fabrication operations according to one or more embodiments of the invention;

FIGS. 26A, 26B, 26C, and 26D respectively depict a top view and cross-sectional views of a portion of an IC under-fabrication after fabrication operations according to one or more embodiments of the invention;

FIGS. 27A, 27B, 27C, and 27D respectively depict a top view and cross-sectional views of a portion of an IC under-fabrication after fabrication operations according to one or more embodiments of the invention; and FIG. 28 is a flowchart of a computer-implemented method of forming a stacked FET device according to one or more embodiments of the invention.

DETAILED DESCRIPTION

Figure 3D:
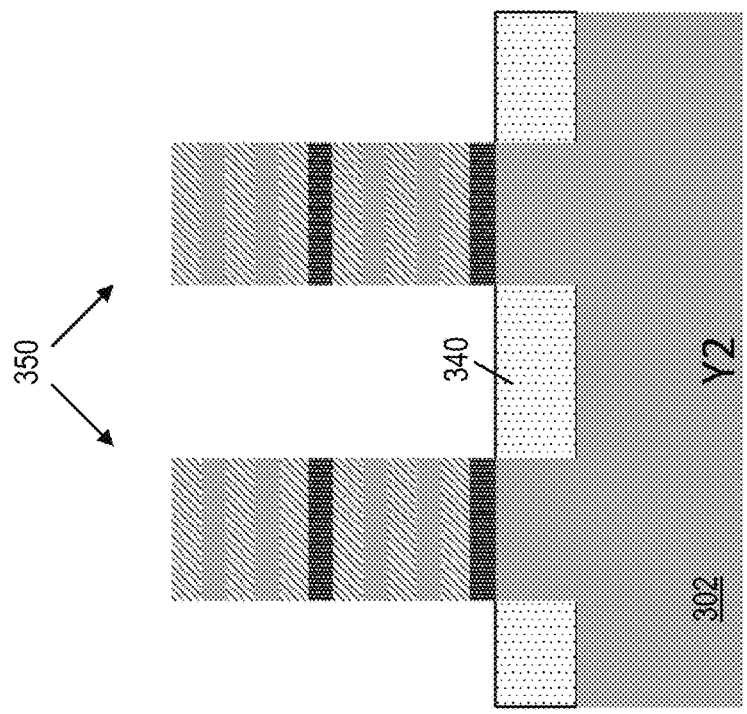

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

A stacked FET device is a complex structure. One or more embodiments of the invention describe methods and subsequent device/structures which provide a stacked FET layout for improved cell height scaling. A first portion (e.g., bottom layer) of the stacked FET transistor is formed with a source, a drain, and a gate, such that the combined source and drain of the first portion (including source/drain epitaxial layer or contact extension) of the stacked FET transistor forms a first L-shaped. A second portion of the stacked FET transistor above the first portion of the stacked FET transistor is formed with a source, a drain, and a gate, such that the combined source and drain of the second portion (including source/drain epitaxial layer or contact extension) of the transistor forms a second L-shaped.

In the state-of-the-art, a technical problem arises because a front-up layout uses a larger bottom active region or nanosheet width in the bottom than the top active region to facilitate contact formation. This results in a waste of area, a high risk of having bottom contact to top epitaxial layer short, and a high parasitic capacitance between the bottom contact and the top epitaxial layer. However, one or more embodiments of the invention provide technical solutions by using a bottom epitaxial extension or contact extension in an L-shape and a top epitaxial extension or contact extension in an L-shape. Further, embodiments provide a staggered via and metal line connection which allows for easier and efficient connection to the stacked FET transistor.

Turning now to a more detailed description of aspects of the present invention, FIG. 1A depicts a top view of a simplified illustration of a portion of an integrated circuit (IC) 100, and FIG. 1B depicts a top view of the IC 100 with example metal tracks or metal lines (e.g., M1 metal layer) for physical and electrical connections. A bottom epitaxial layer 102 is formed with an L-shaped layout and the top epitaxial layer 104 is formed with an L-shaped layout. The L-shaped layouts of the bottom epitaxial layer 102 and the top epitaxial layer 104 are interrupted by the gate region 106. The metal tracks 110 are illustrated as dashed lines in FIG. 1B. The L-shaped layout of the bottom and top epitaxial layers 102, 104 forms the source and drain regions of the two stacked FETs.

As a simplified view further illustrating the L-shaped layouts, FIG. 2 highlights the L-shaped layout for the bottom epitaxial layer 102 with a source region and drain region on either side of the gate region 106 in view 202. The bottom epitaxial layer 102 has an epitaxial extension 212 which is the extended epitaxial material that contributes to forming the L-shaped layout. View 204 illustrates the L-shaped layout for the top epitaxial layer 104 with a source region and drain region on either side of the gate region 106. The top epitaxial layer 104 has an epitaxial extension 214 which is the extended epitaxial material that contributes to forming the L-shaped layout. The L-shaped layout for the top epitaxial layer 104 overlaps the bottom epitaxial layer 102 in the x-axis, while not overlapping the bottom epitaxial layer 102 in the y-axis, particularly along the respective epitaxial extensions 212, 214. View 206 illustrates staggered voltage connections for the drain connection (Vdd), the source connection (Vss), the input voltage (Vin), and the output voltage (Vout), where the staggered voltage connections are facilitated because of the L-shaped layouts. Although FIG. 2 illustrates epitaxial material with the L-shaped layout, it should be appreciated that by analogy the L-shaped layout can be contact material (e.g., metal and silicide) and/or a combination of contact material and epitaxial material.

Figure 3C:
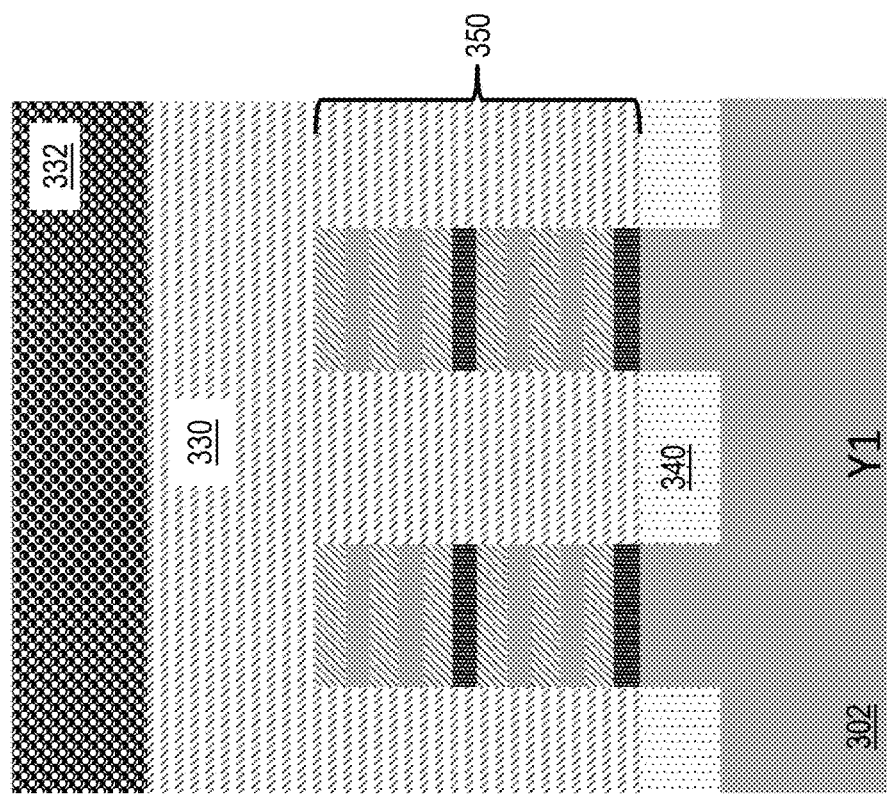
Figure 5B:
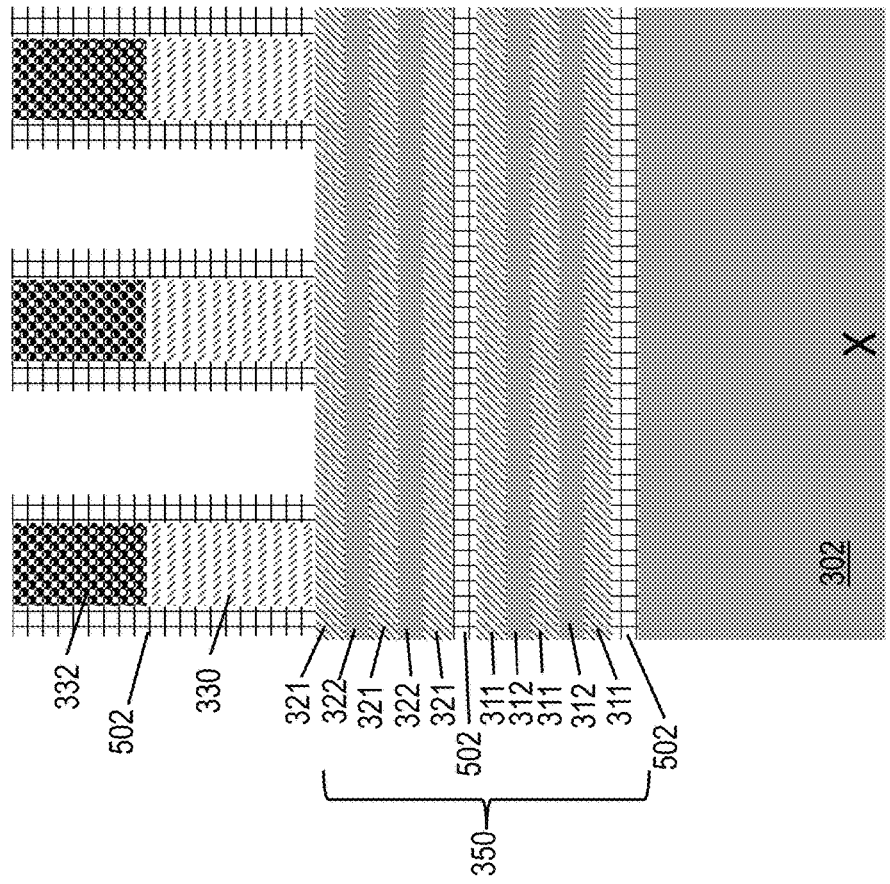
FIGS. 5A, 5B, 5C, and 5D respectively depict a top view and cross-sectional views of a portion of an IC under-fabrication after fabrication operations according to one or more embodiments of the invention.
Figure 5A:
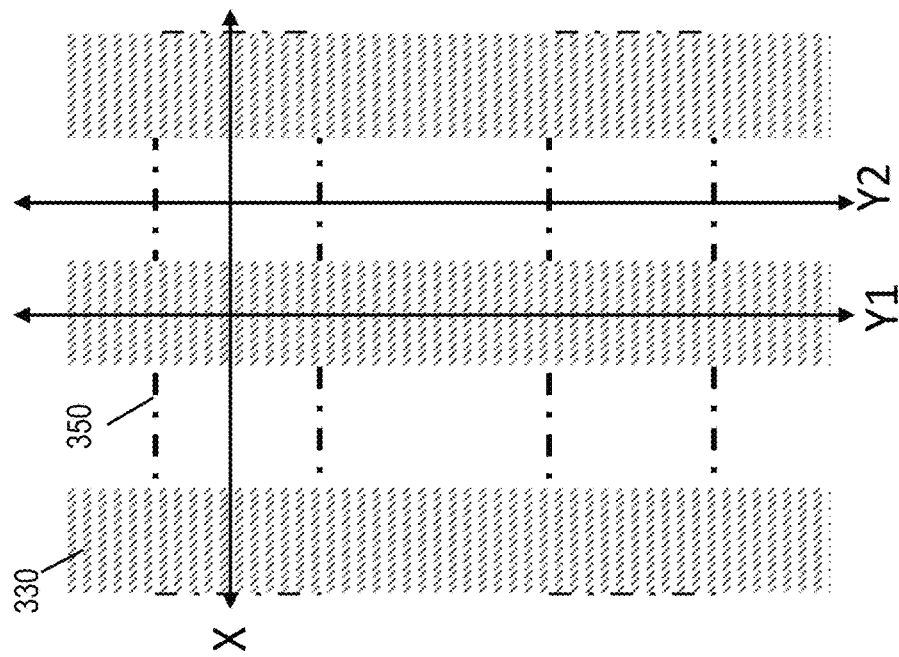
Figure 5D:
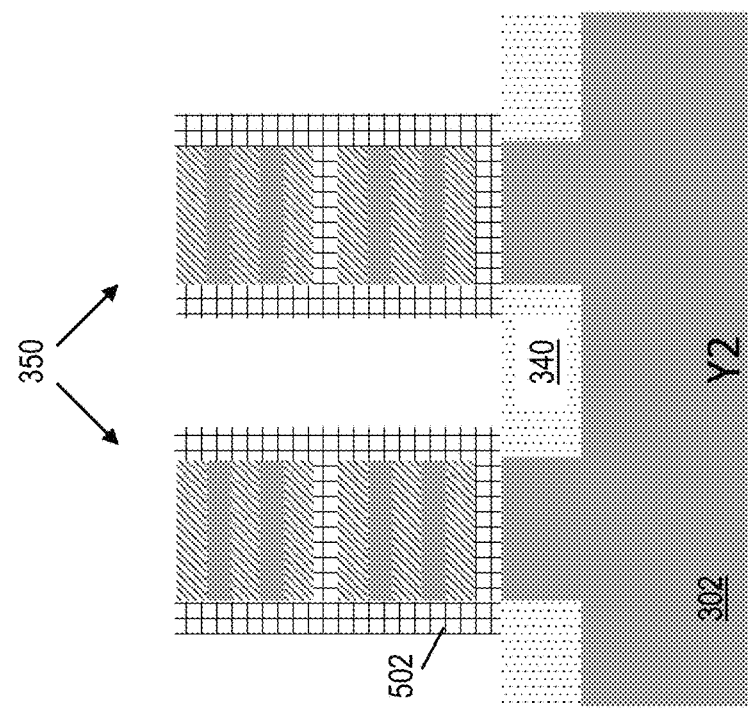
Figure 5C:
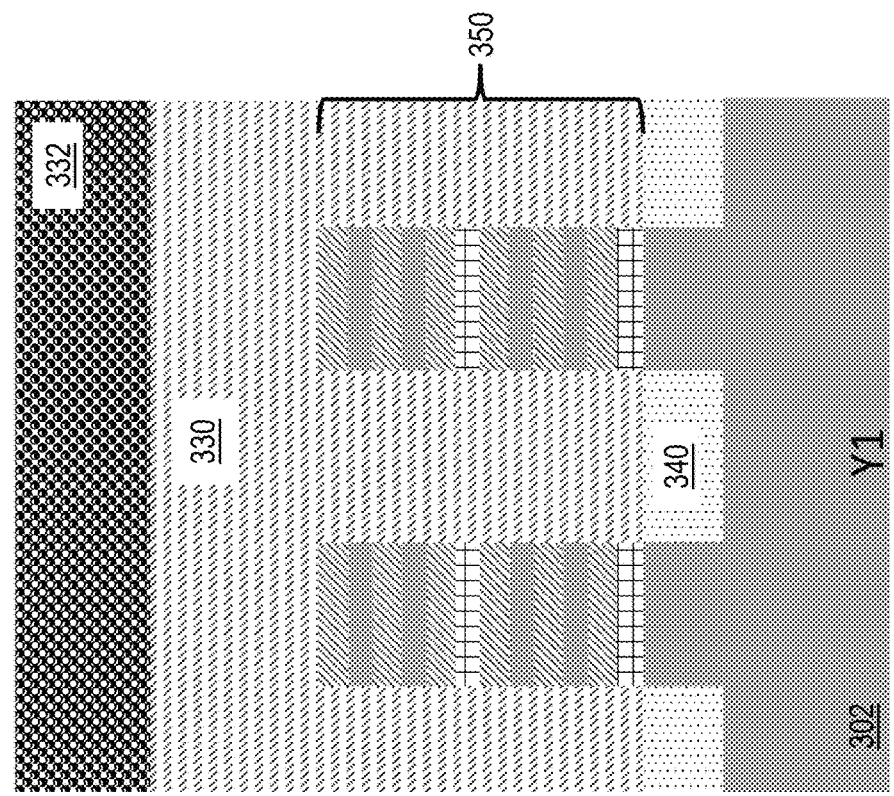
Figure 7D:
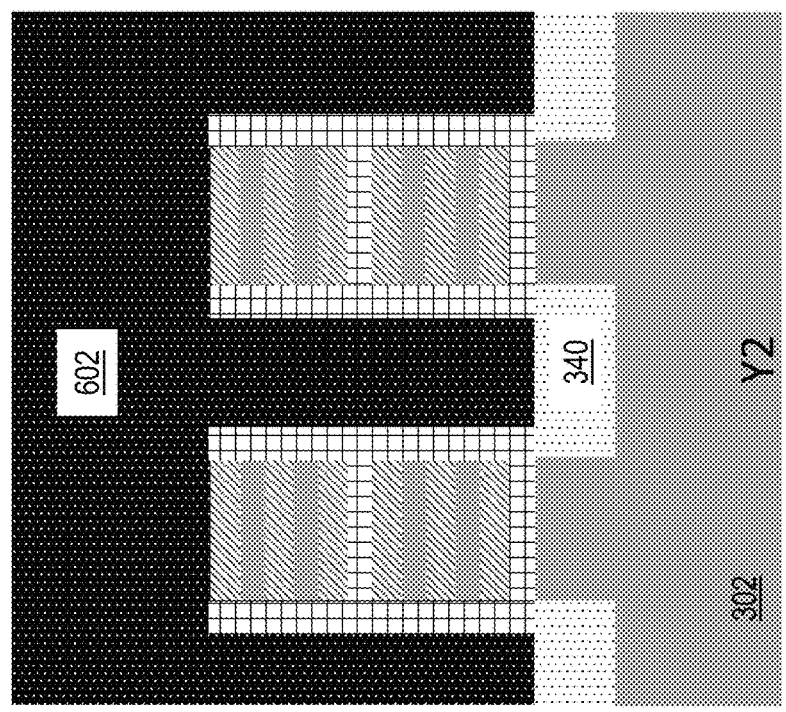
Figure 7C:
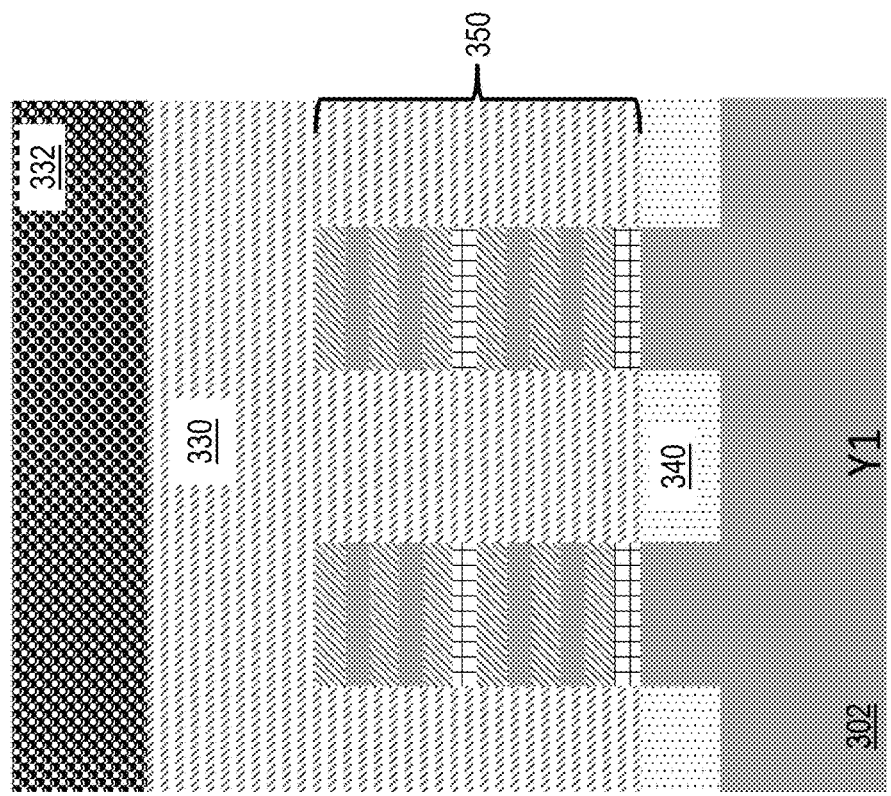

FIGS. 3A-17D illustrate the IC 100 after selected fabrication operations have been completed for forming the stacked FET device according to one or more embodiments. Standard semiconductor fabrication techniques can be utilized to fabricate IC 100 as understood by one of ordinary skill in the art. Any suitable lithography processes including deposition techniques and etching techniques can be utilized herein. FIG. 3A depicts a top view of a simplified illustration of a portion of the IC 100, FIG. 3B depicts a cross-sectional view taken along X of the IC 100, FIG. 3C depicts a cross-sectional view taken along Y1 of the IC 100, and FIG. 3D depicts a cross-sectional view taken along Y2 of the IC 100. For ease of understanding, some layers may be omitted from the various top views so as not to obscure the figure and to view layers underneath.

FIGS. 3A, 3B, 3C, 3D depict the IC 100 at a point in fabrication where several fabrication processes have been performed. A nanosheet stack is formed and fin patterning is performed, resulting in nanosheet stacks 350. The nanosheet stacks 350 are formed on a substrate 302, and shallow trench isolation regions 340 are formed. The nanosheet stacks 350 include layers 310 and alternating layers 311 and 312. The nanosheet stacks 350 further include layer 320 and alternating layers 321 and 322. The layers 312 and 322 may be the same or nearly the same semiconductor material and may include substantially pure silicon. The layers 312 and 322 are to be utilized as the channel regions for the stacked FET device. Particularly, the layers 312 and 322 are the channel regions for two stacked FETs. The layers 311 and 321 are sacrificial layers formed of silicon germanium (SiGe) where germanium has an atomic percent (%) of about 30%, thereby leaving silicon with an atomic percent of about 70%. In layers 311 and 321, the atomic percent of germanium may range from about 20-35%, while silicon is the remainder. The layers 310 and 320 are sacrificial layers formed of silicon germanium, where the atomic percent of germanium is about 55%. In layers 310 and 320, the atomic percent of germanium may range from about 50-65%, while silicon is the remainder. In one or more embodiments, the thicknesses of semiconductor layers 310, 311, 312, 320, 321, 322 may be about the same. In one or more embodiments, the thicknesses of the semiconductor layers 310, 311, 312, 320, 321, 322 may vary depending upon the particular application and they need not have the same thicknesses.

Sacrificial gate structures 330, also referred to as dummy gates, are formed on the nanosheet stacks 350. The sacrificial gate structures 330 are sacrificial in nature in that they are replaced at a later point in the process flow with other materials to form functional gate structures, as described below. Sacrificial gate structures 330 may include one or more layers of material, such as a sacrificial gate insulation layer (e.g., silicon dioxide) and/or a sacrificial gate material (e.g., amorphous silicon) which are not separately shown. A hard mask layer 332 (e.g., silicon nitride or a stack including silicon nitride and silicon dioxide) is deposited over the sacrificial gate structure 330. The hard mask layer 332 and sacrificial gate structures 330 are then subsequently patterned by a conventional lithography and etch process.

FIGS. 4A, 4B, 4C, 4D depict the IC 100 after removal of the sacrificial layers 310 and 320. A selective etch is performed to remove sacrificial layers 310, 320. For example, an isotropic etch may be performed to remove sacrificial layers 310, 320 while not removing layers 311, 312, 321, 322, thereby creating cavities 402. An example etchant that selectively etches layers 310, 320 may include vapor phased HCl at a suitable temperature and pressure.

FIGS. 5A, 5B, 5C, 5D depict the IC 100 after spacer deposition and etch. Dielectric material is formed as gate spacer material 502 in the cavities 402 and on the sacrificial gate structure 330, the hard mask layer 332, and the nanosheet stacks 350. The gate spacer material 502 isolates layers 311, 312 below from layers 321, 322 above. An etch, for example, reactive ion etch (RIE), is performed to remove portions of the gate spacer material. Example materials of the gate spacer material 502 may include SiN, SiBCN, SiOCN, SiOC, etc.

FIGS. 6A, 6B, 6C, 6D depict the IC 100 after forming a mask layer. A mask layer 602 is deposited and etched. The mask layer 602 may be an organic patterning layer (OPL) or any suitable material or combination of materials. An anisotropic etch may be utilized to recess the mask layer 602. Also, an etch is performed to remove a top portion of the gate spacer material 502 which is not protected by the recessed mask 602, as best seen in FIG. 6B.

FIGS. 7A, 7B, 7C, 7D depict the IC 100 after forming a protective spacer over the gate spacer. The protective spacer 702 is deposited and then etched back. Example materials of the protective spacer 702 may include $SiO_2$, SiN, SiBCN, SiC, SiOC, aluminum oxide ($AlO_2$), and titanium oxide ($TiO_2$).

Figure 8D:
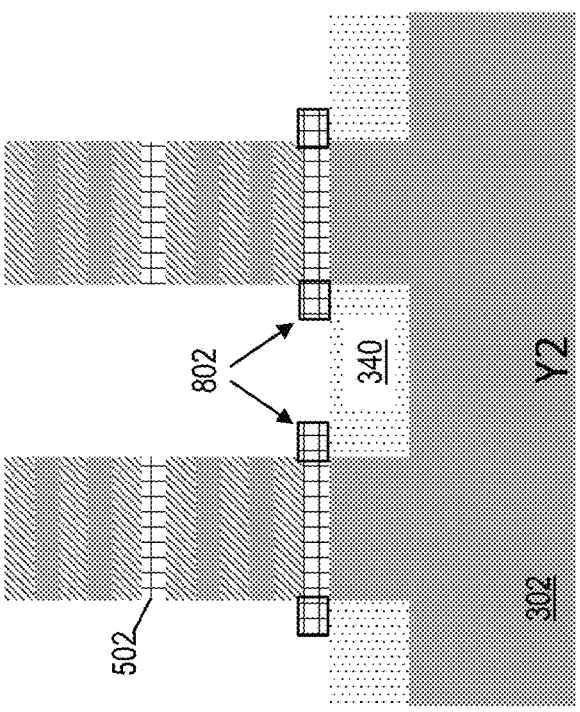
Figure 8C:
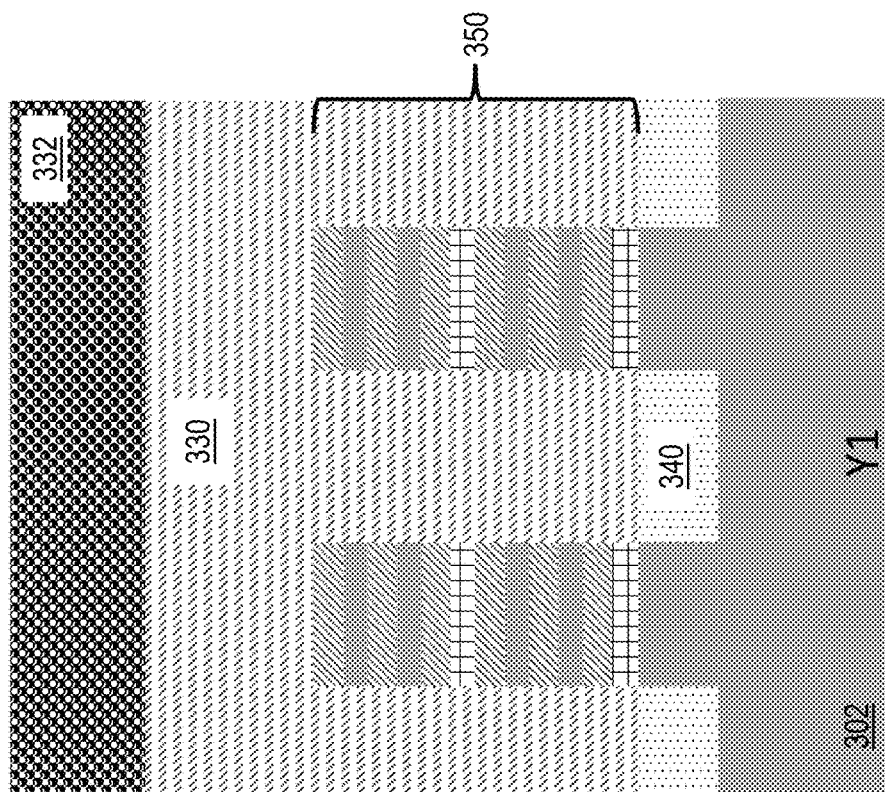
Figure 10C:
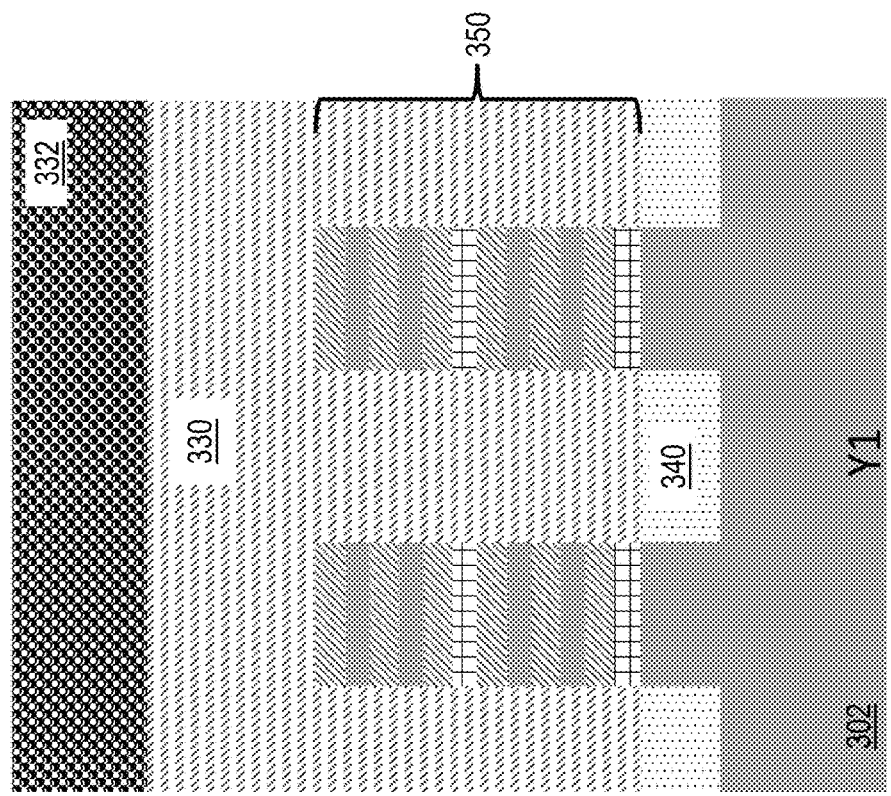
Figure 10D:
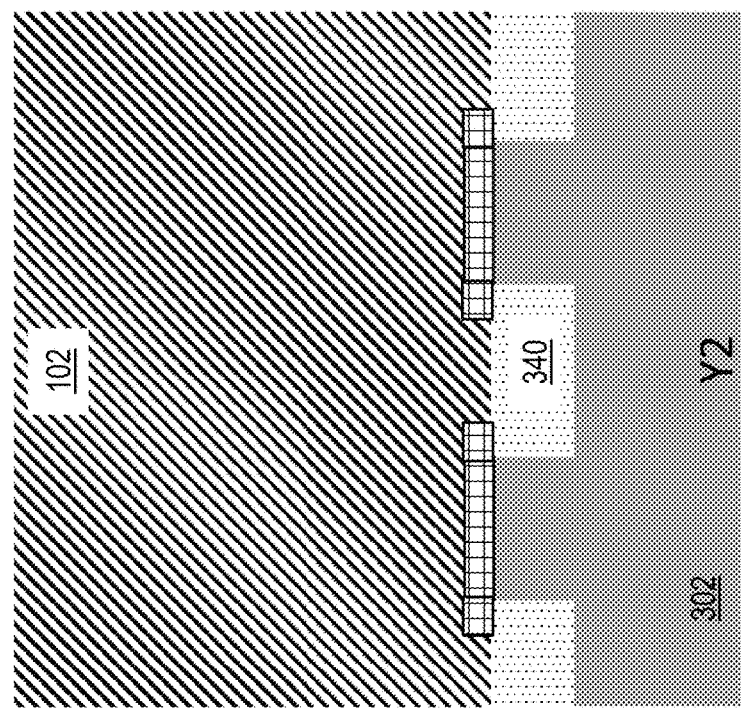

FIGS. 8A, 8B, 8C, 8D depict the IC 100 after mask removal and preparation for the formation of source and drain regions. The mask layer 602 is removed, for example, using an OPL ash. Spacer pull down is performed to pull down the gate spacer material 502 leaving extended portions 802 of the gate spacer material 502, as best seen in FIG. 8D. The protective spacer 702 is utilized to protect part of gate spacer material 502, as best seen in FIG. 8B. An anisotropic etch (i.e., a directional etch) is used to pull down the gate spacer material 502. As one example, a RIE etch may be utilized.

FIGS. 9A, 9B, 9C, 9D depict the IC 100 after nanosheet stack recess. The nanosheet stacks 350 are etched locations where the hard mask layer 332 and the protective spacer 702 are not present, which in preparation for source and drain regions. An isotropic etch process is performed to recess the layers 311, 321 to define end cavities on ends thereof. A conformal deposition process, such as an ALD process, is performed to form a layer of inner spacer material on the nanosheet stack 350, and the inner spacer material is isotropically etched to define inner spacers 902 in the end cavities.

FIGS. 10A, 10B, 10C, 10D depict the IC 100 after source and drain formation. The bottom epitaxial layer 102 is grown from the bottom up and merges at the top of the stacked FETs. The bottom epitaxial layer 102 may be an N-type epitaxial material or P-type epitaxial material, resulting in N-type source and drain regions or P-type source and drain regions, respectively.

Figure 11D:
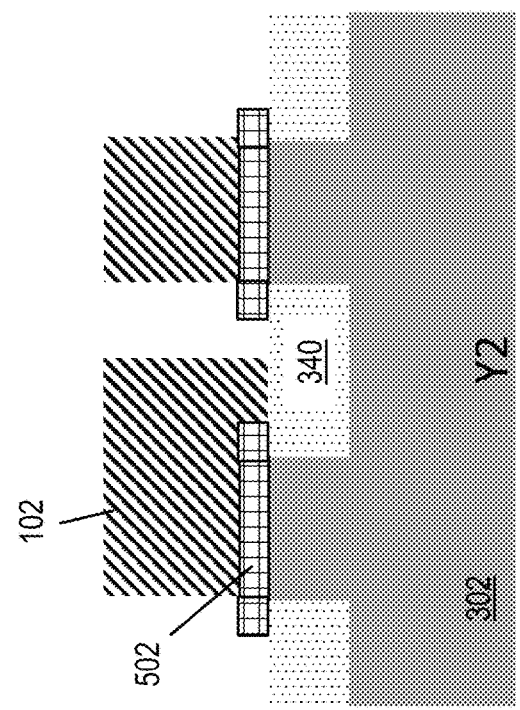
Figure 11C:
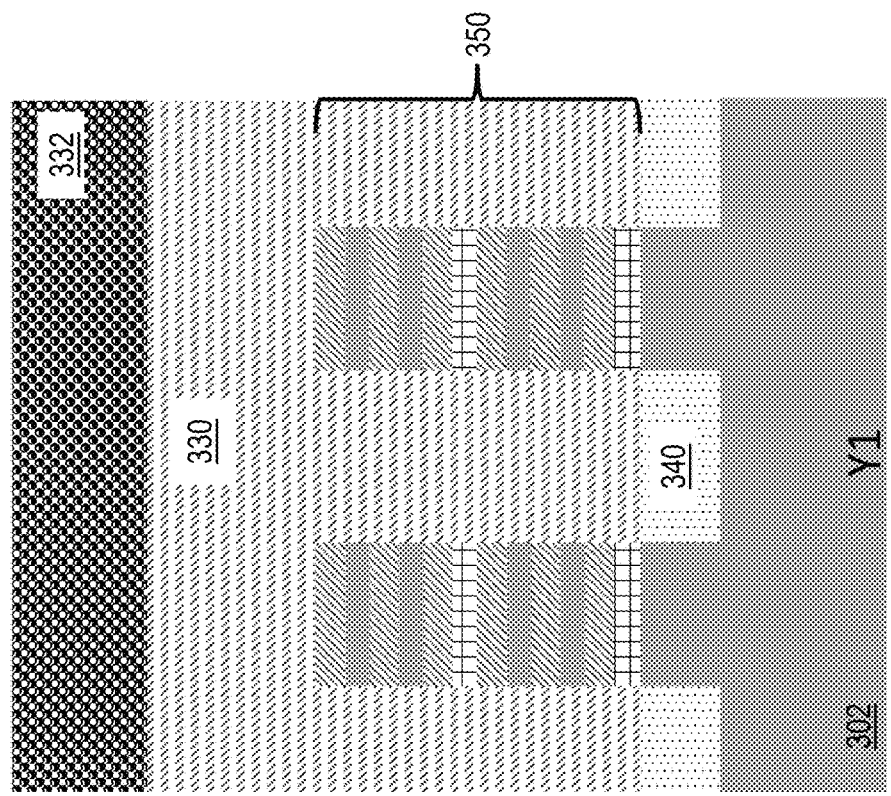
Figure 12B:
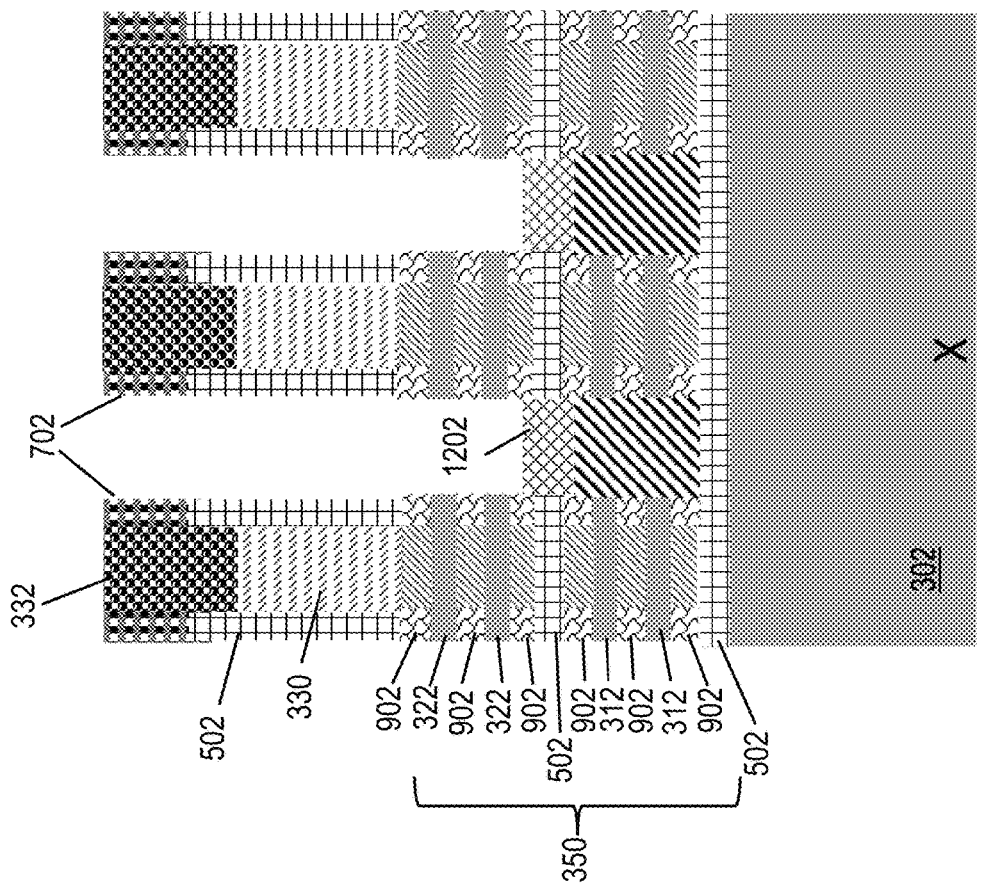
FIGS. 12A, 12B, 12C, and 12D respectively depict a top view and cross-sectional views of a portion of an IC under-fabrication after fabrication operations according to one or more embodiments of the invention.
Figure 12A:
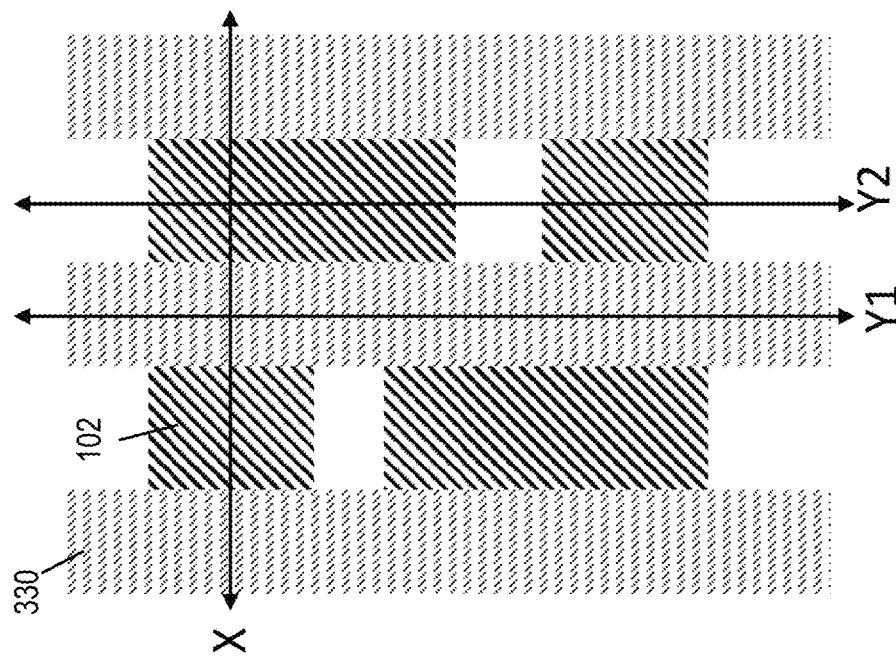
Figure 12D:
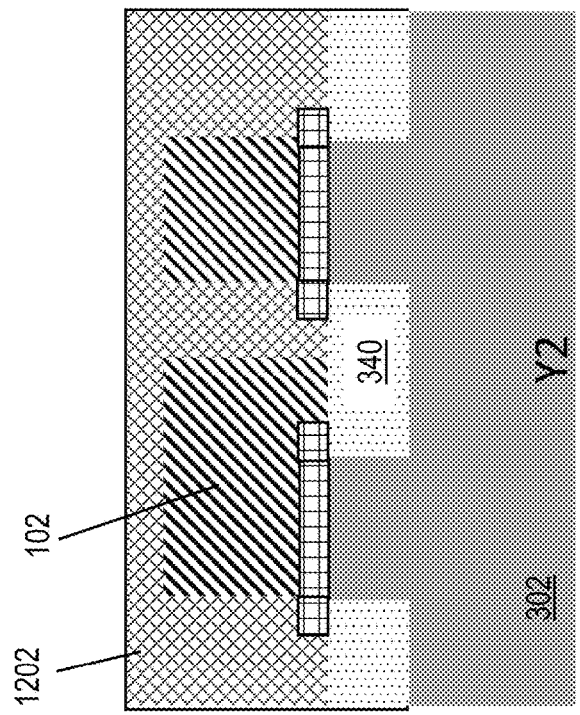
Figure 12C:
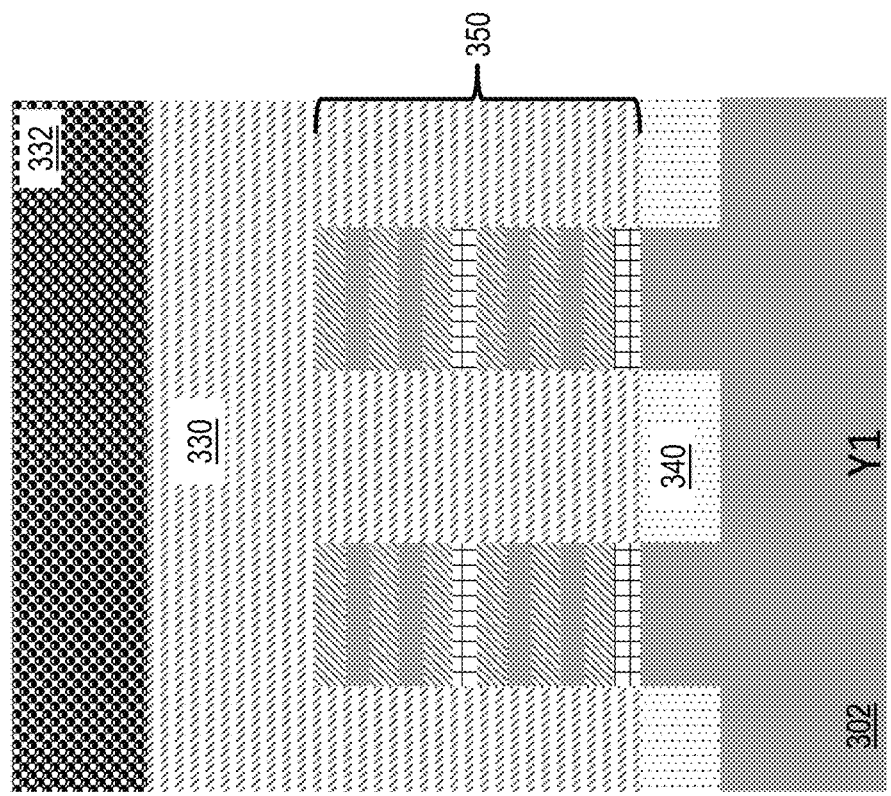

FIGS. 11A, 11B, 11C, 11D depict the IC 100 after source and drain recess and patterning. Material of the bottom epitaxial layer 102 is removed from the top by a recessing process, and then a patterned mask (not shown) is utilized to further etch the bottom epitaxial layer 102. The bottom epitaxial layer 102 is recessed below a portion of the gate spacer material 502 separating the bottom layers 311, 312 from the upper layer 321, 322. An anisotropic etch can be utilized, for example, a RIE etch. As best seen in FIG. 11A, the bottom epitaxial layer 102 is formed with an L-shaped layout as discussed herein after a patterning process. The bottom epitaxial layer 102 appears as two L-shaped layouts facing one another. Although only two L-shaped layouts are illustrated for explanation purposes, it should be appreciated that there are numerous L-shaped layouts of bottom epitaxial material.

FIGS. 12A, 12B, 12C, 12D depict the IC 100 after formation of interlayer dielectric (ILD) material 1202. The ILD material 1202 is formed on top of the bottom epitaxial layer 102, as a barrier, in preparation for the top epitaxial layer 104. The ILD material 1202 can be a low-k dielectric material or an ultralow-k dielectric material. Low-k dielectric materials may generally include dielectric materials having a k value of about 3.9 or less, such as silicon dioxide. The ultralow-k dielectric material generally includes dielectric materials having a k value less than 2.5. Unless otherwise noted, all k values mentioned in the present application are measured relative to a vacuum. Exemplary ultralow k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultralow-k dielectric material can be produced using a templated process or a sol-gel process as is generally known in the art. In the templated process, the precursor typically contains a composite of thermally labile and stable materials. After film deposition, the thermally labile materials can be removed by thermal heating, leaving pores in the dielectric film. In the sol gel process, the porous low k dielectric films can be formed by hydrolysis and polycondensation of an alkoxide (s) such as tetraetehoxysilane (TEOS).

Figure 13B:
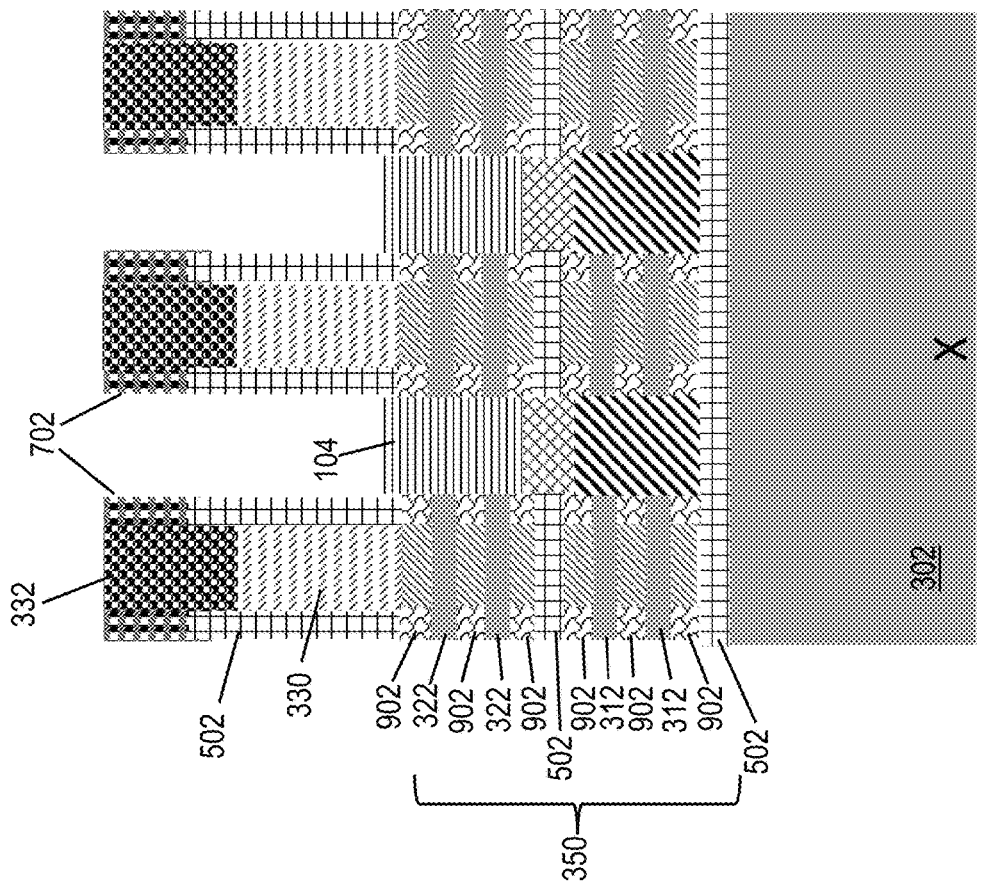
FIGS. 13A, 13B, 13C, and 13D respectively depict a top view and cross-sectional views of a portion of an IC under-fabrication after fabrication operations according to one or more embodiments of the invention.
Figure 13A:
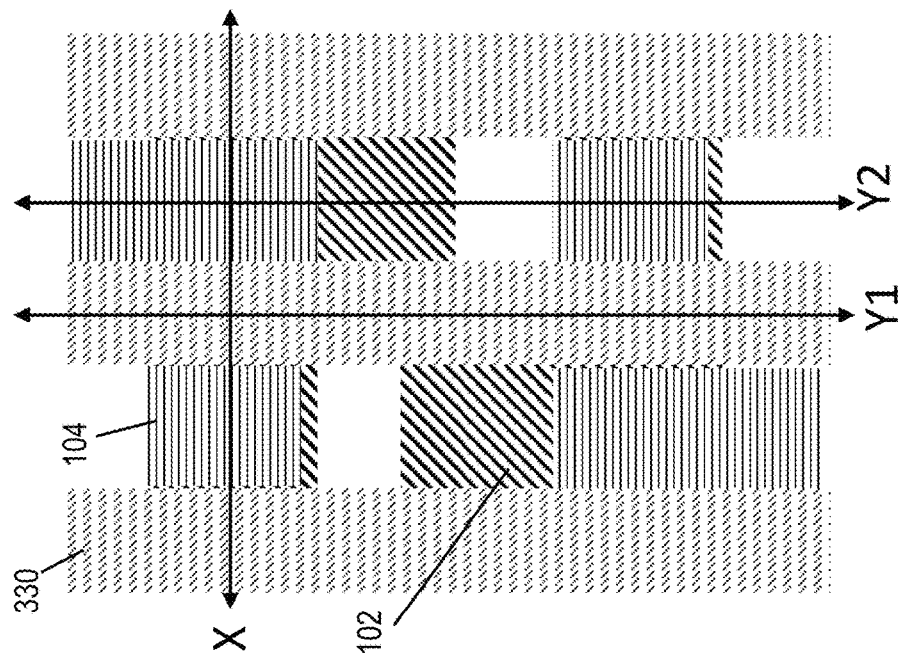
Figure 13C:
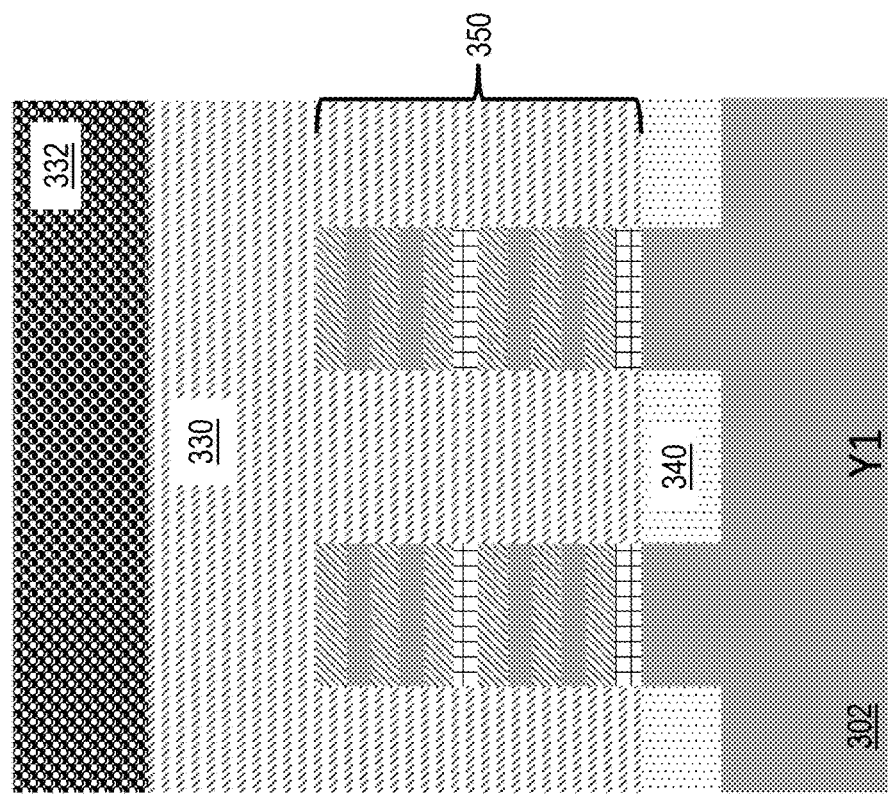
Figure 13D:
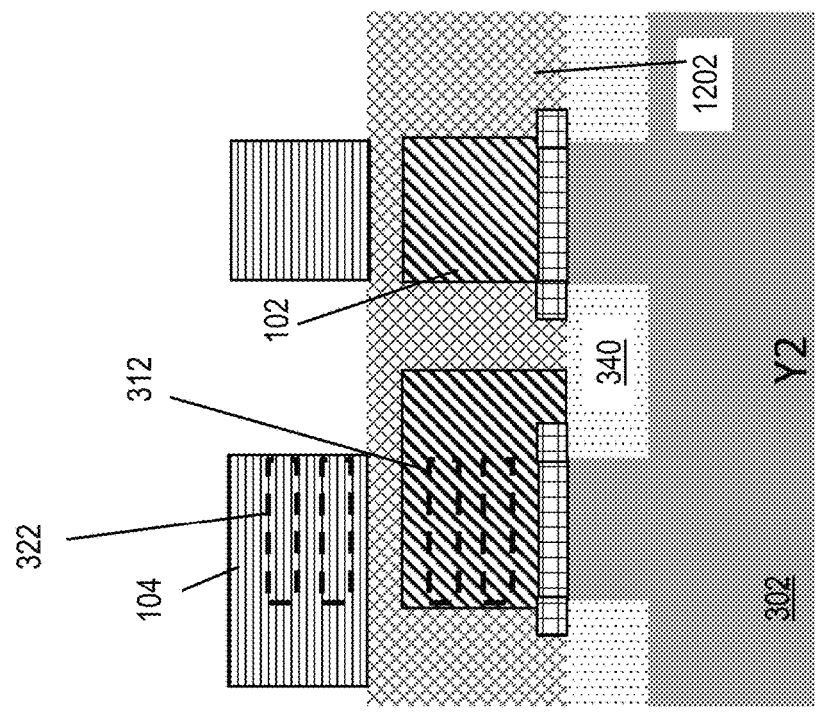
Figure 15B:
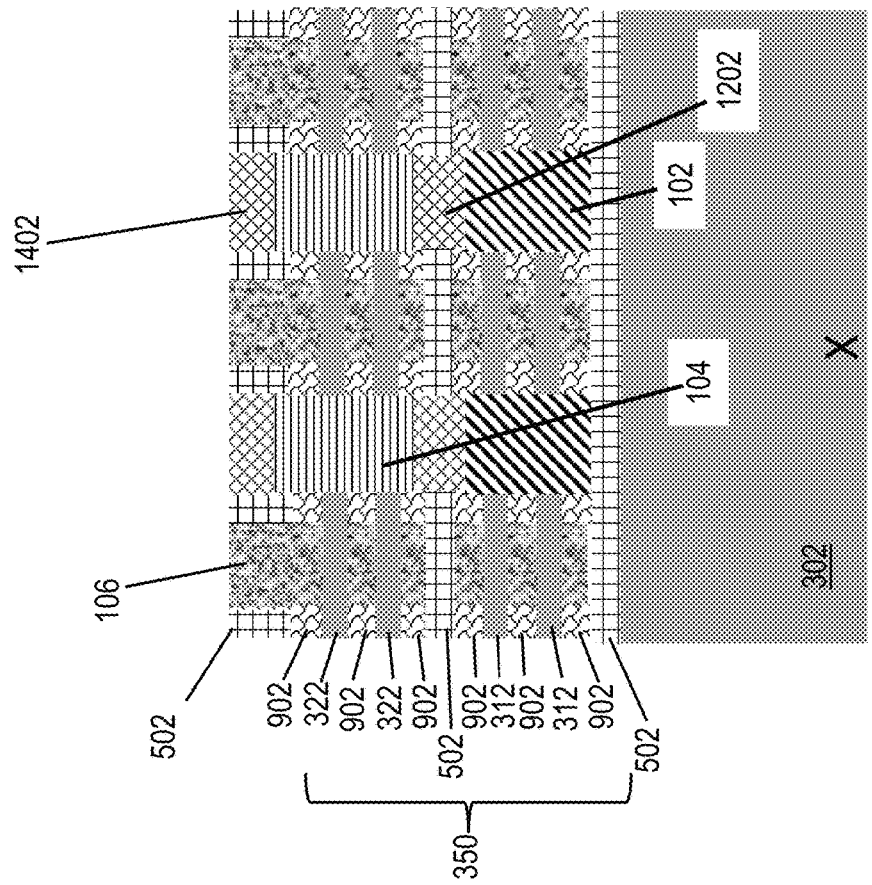
Figure 15A:
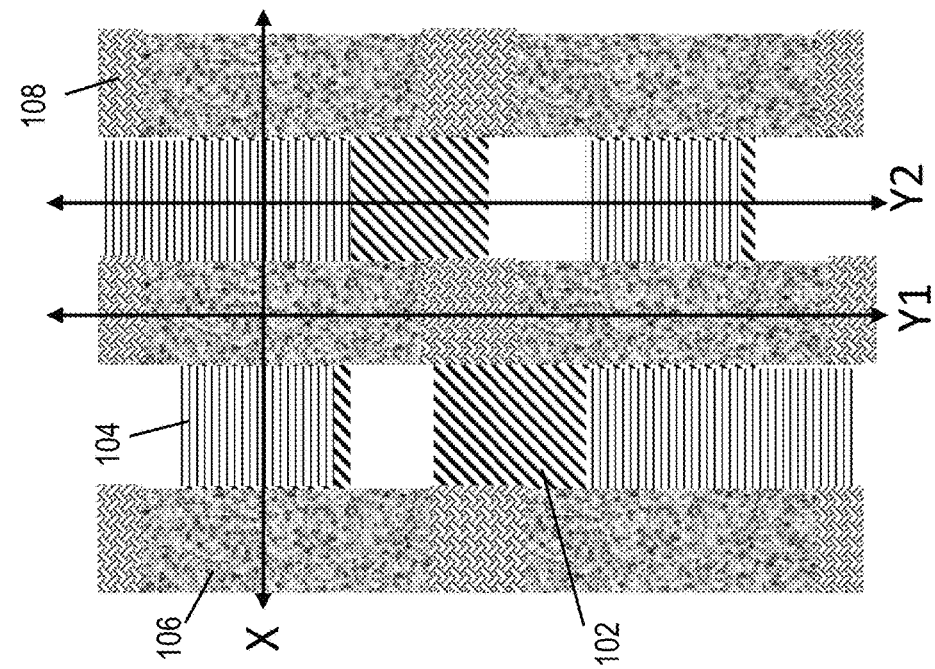
Figure 18B:
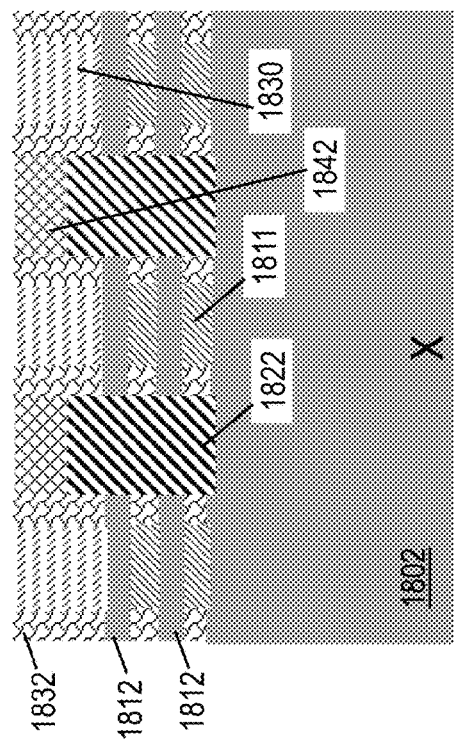
FIGS. 18A, 18B, 18C, and 18D respectively depict a top view and cross-sectional views of a portion of an IC under-fabrication after fabrication operations according to one or more embodiments of the invention.
Figure 18A:
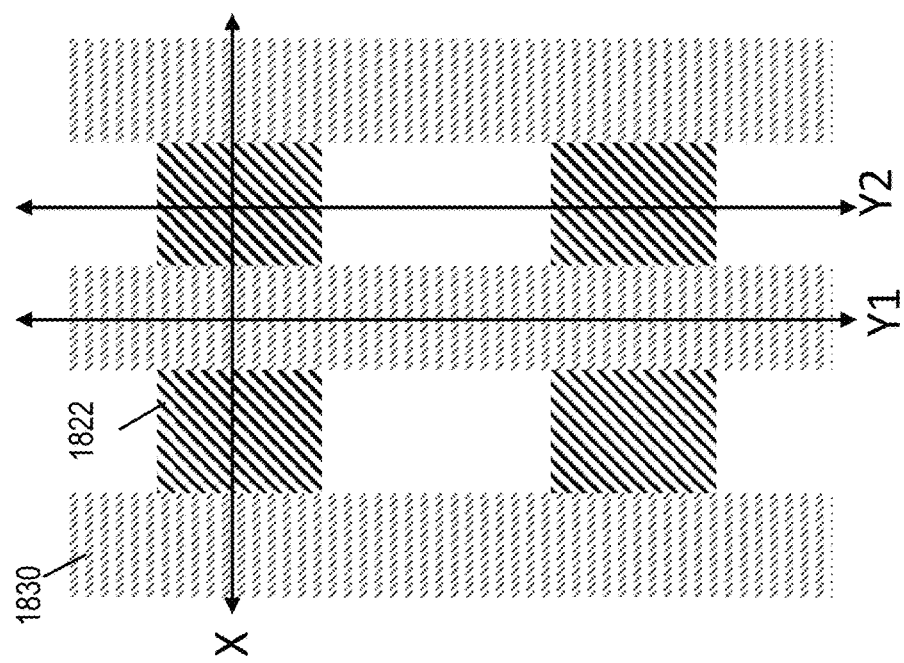
Figure 18C:
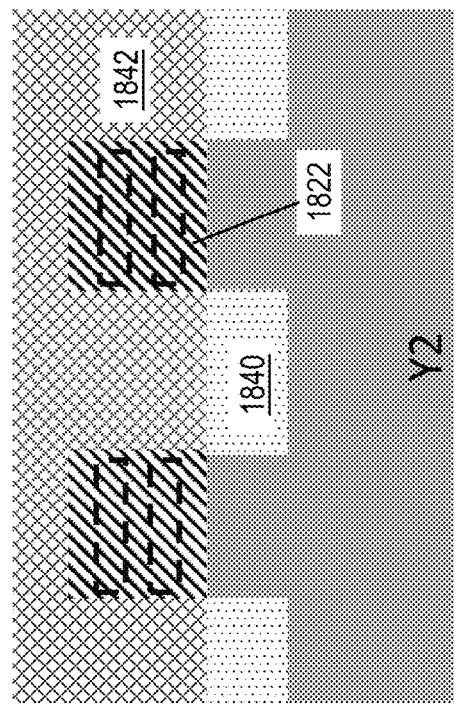
Figure 18D:
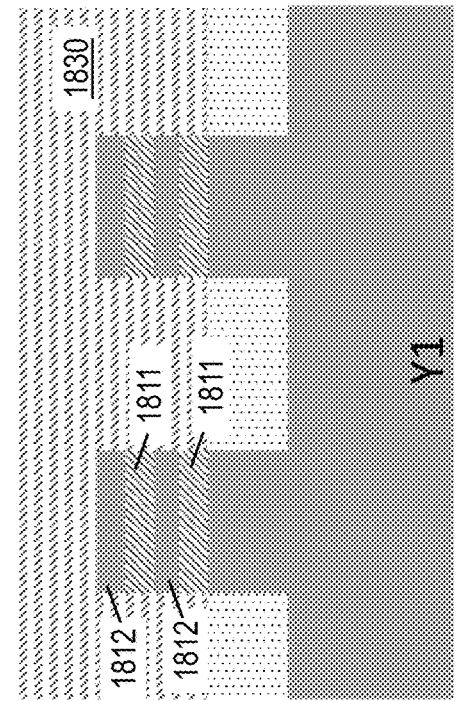

FIGS. 13A, 13B, 13C, 13D depict the IC 100 after to source and drain formation. The top epitaxial layer 104 is grown, and material of the top epitaxial layer 104 may be removed from the top. The top epitaxial layer 104 may be an N-type epitaxial material or P-type epitaxial material, resulting in N-type source and drain regions or P-type source and drain regions, respectively. If the stacked FET device has complimentary transistors, the epitaxial material of the top epitaxial layer 104 has the opposite polarity of the bottom epitaxial layer 102. A patterned mask (not shown) is utilized to etch the top epitaxial layer 104 into the L-shaped layout. An anisotropic etch can be utilized, for example, a RIE etch. As best seen in FIG. 13A, the top epitaxial layer 104 is formed with the L-shaped layout as discussed herein. The top epitaxial layer 104 appears as two L-shaped layouts facing away from one another. As noted herein, the active regions or widths for the top layer 322 and bottom layer 312 are (always) the same, which allows for easy gate formation. For connecting the output signal (Vout), the top and bottom epitaxial layers 104, 102 overlap. For respectively connecting Vdd and Vss, the top and bottom epitaxial layers 104, 102 have opposite epitaxial extensions (i.e., they extend in opposite directions and do not overlap). This allows for easier connection to the stacked FET device. Although two stacked FETs are formed herein, it should be appreciated that hundreds, thousands, or millions of stacked FETs can be formed on an IC, which all need to be operatively connected for transmitting and receiving signals. One or more embodiments use the L-shaped layouts to provide more efficient connections.

FIGS. 14A, 14B, 14C, 14D depict the IC 100 after ILD fill. Further ILD material 1402 is deposited, and chemical mechanical polishing/planarization is performed. A gate cut is performed, and the resulting cavities are filled with dielectric material 108. The dielectric material 108 can be a low-k dielectric material or ultralow-low k dielectric material.

FIGS. 15A, 15B, 15C, 15D depict the IC 100 after dummy gate removal. The hard mask layer 332 is etched. The sacrificial gate structures 330 are removed, and the layers 311, 321 (SiGe) are released. Replacement metal gate (RMG) formation is performed, thereby forming gate regions 106. The replacement metal gate process is performed to deposit a high-k dielectric material followed by one or more work function material layers to thereby form the gate regions 106.

FIGS. 16A, 16B, 16C, 16D depict the IC 100 after contact formation or middle of the line (MOL) contacts. Metal contacts 1602, 1604, 1606, 1608, 1610, and 1612 are formed. For example, cavities are formed, and then metal is deposited to fill the metal contacts 1602, 1604, 1606, 1608, 1610, 1612. A portion of the metal contacts may include silicide, resulting from the interface of the metal material and semiconductor material.

FIGS. 17A, 17B, 17C, 17D depict the IC 100 after metal (M1) formation. Further ILD material 1702 is deposited and patterned. Metal is deposited to form metal vias 1704 on the metal contacts 1602, 1604, 1606, 1608, 1610, 1612. Metal tracks 110 are formed to electrically contact the metal contacts 1602, 1604, 1606, 1608, 1610, 1612 through the metal vias 1704.

According to one or more embodiments, FIGS. 18A-27D illustrate the IC 1800 after selected fabrication operations have been completed for forming the stacked FET device using wafer bonding according to one or more embodiments. The L-shaped layouts are fabricated using different materials. Standard semiconductor fabrication techniques can be utilized to fabricate IC 1800 as understood by one of ordinary skill in the art. Any suitable lithography processes including deposition techniques and etching techniques can be utilized herein.

FIGS. 18A, 18B, 18C, 18D depict the IC 1800 after dummy gate formation and source and drain formation. A nanosheet stack includes layers 1811 and layers 1812 on a substrate 1802. The layers 1811 and layers 1812 are analogous to layers 311 and 312 in IC 100. Shallow trench isolation regions 1840 are formed which are analogous to shallow trench isolation regions 340. Sacrificial gate structures 1830 are formed which are analogous to sacrificial gate structures 330. Gate spacer material 1832 (including inner spacers) is formed on the ends of layer 1811 and on the sacrificial gate structures 1830. Source and drains regions are formed by growing bottom epitaxial layer 1822. In IC 1800, the bottom epitaxial layer 1822 is not formed with the L-shaped layout. ILD material 1842 is deposited, and CMP is performed. The ILD material 1842 may be a low-k material or ultralow-k dielectric material.

Figure 19B:
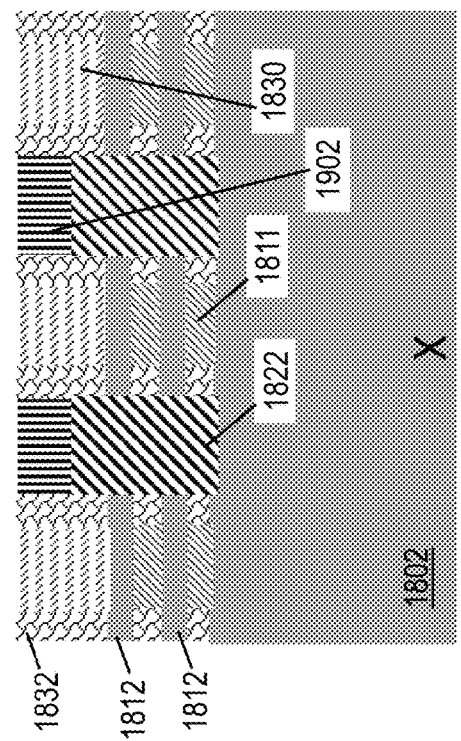
FIGS. 19A, 19B, 19C, and 19D respectively depict a top view and cross-sectional views of a portion of an IC under-fabrication after fabrication operations according to one or more embodiments of the invention.
Figure 19A:
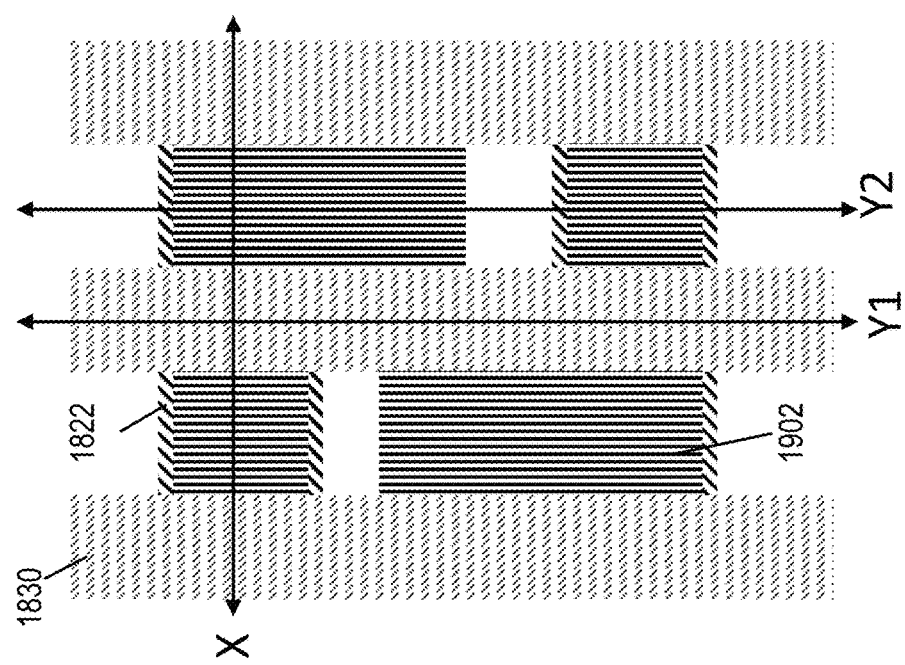
Figure 19D:
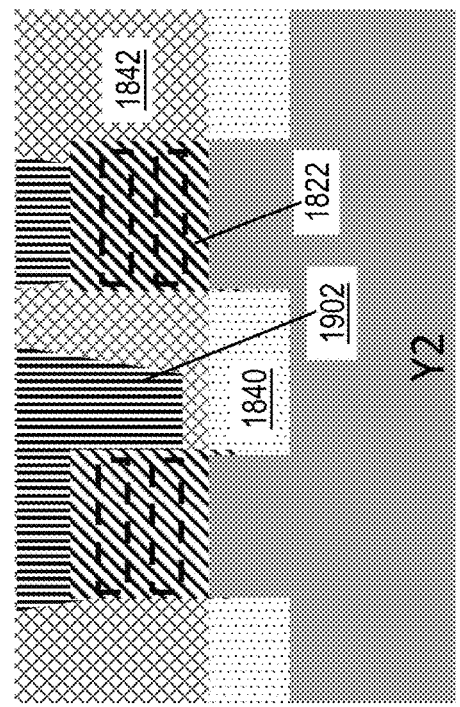
Figure 19C:
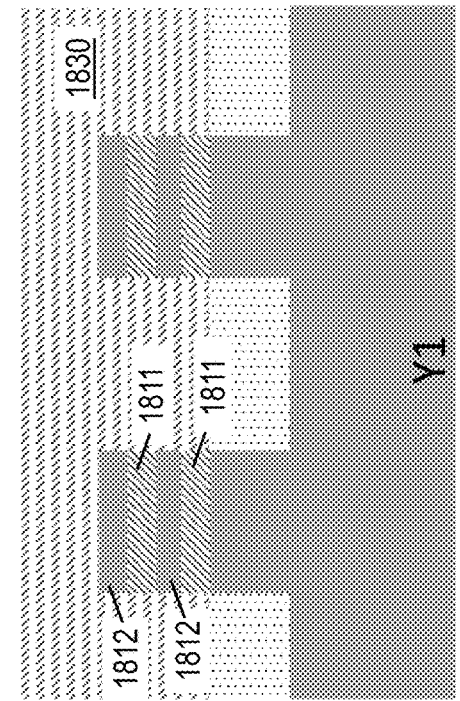
Figure 21B:
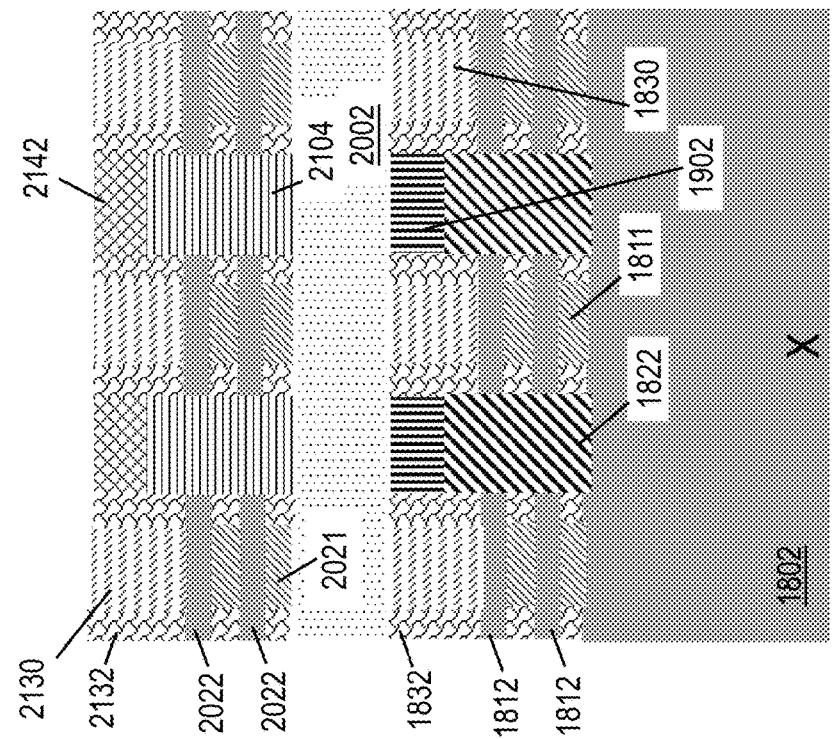
Figure 21A:
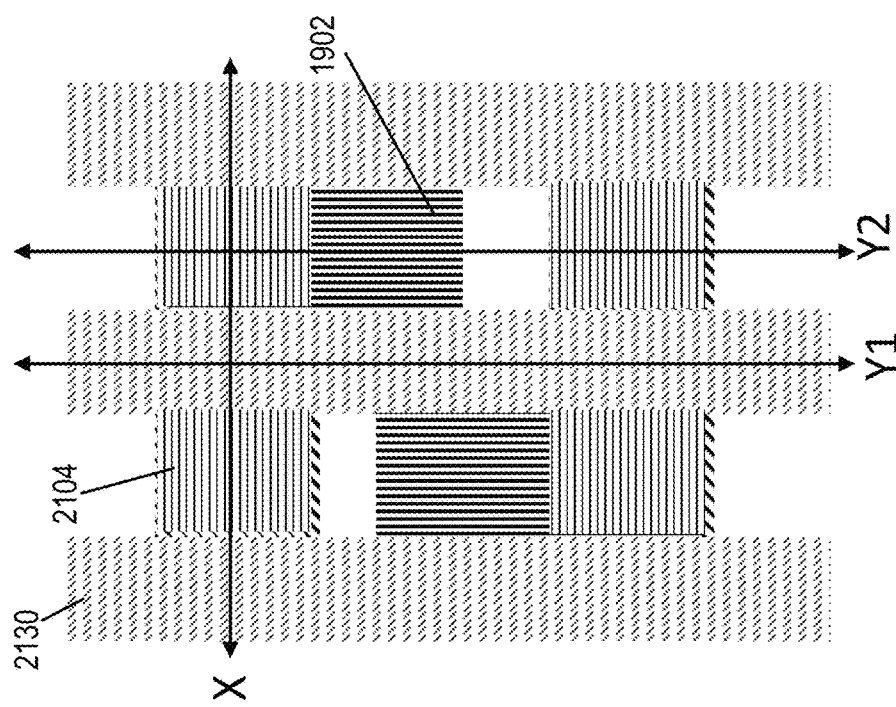
Figure 22B:
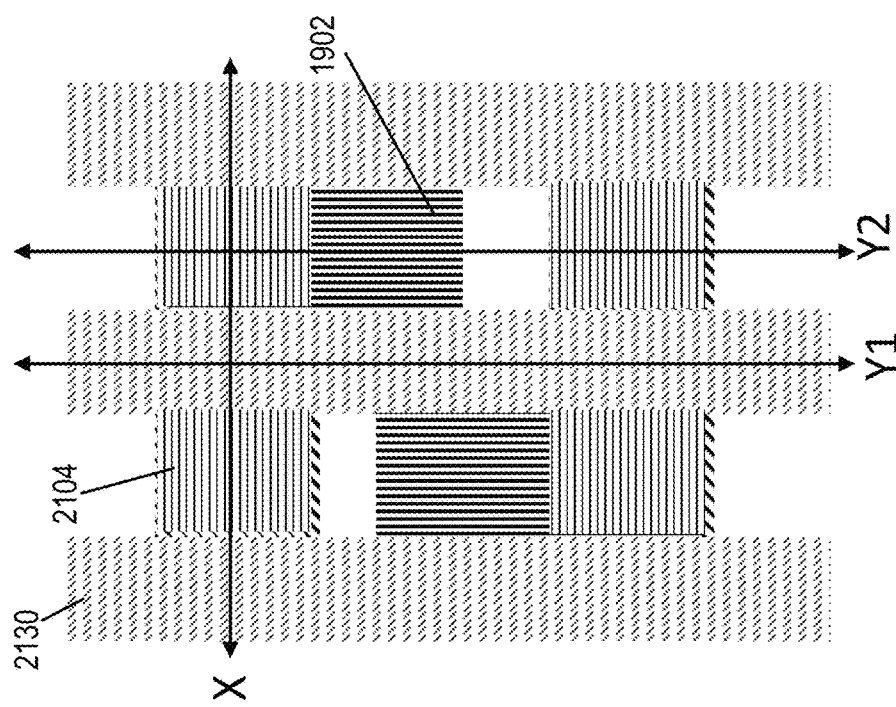
FIGS. 22A, 22B, 22C, and 22D respectively depict a top view and cross-sectional views of a portion of an IC under-fabrication after fabrication operations according to one or more embodiments of the invention.
Figure 22A:
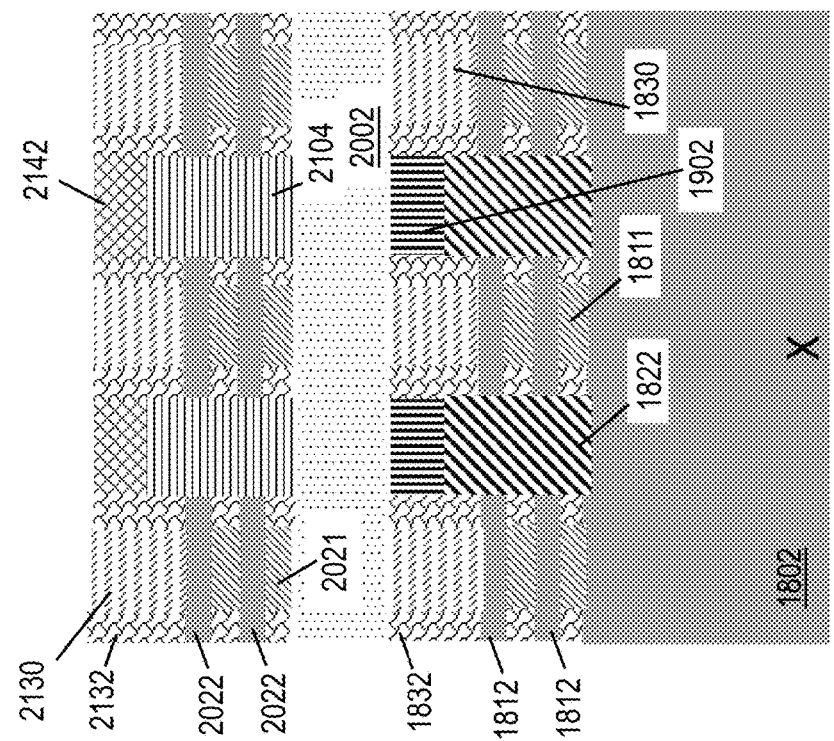
Figure 22C:
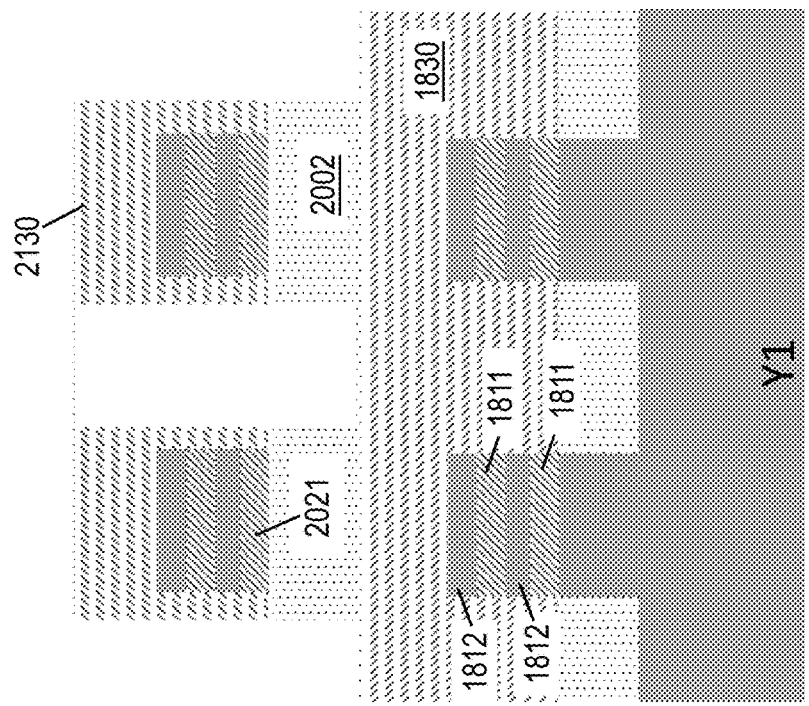
Figure 22D:
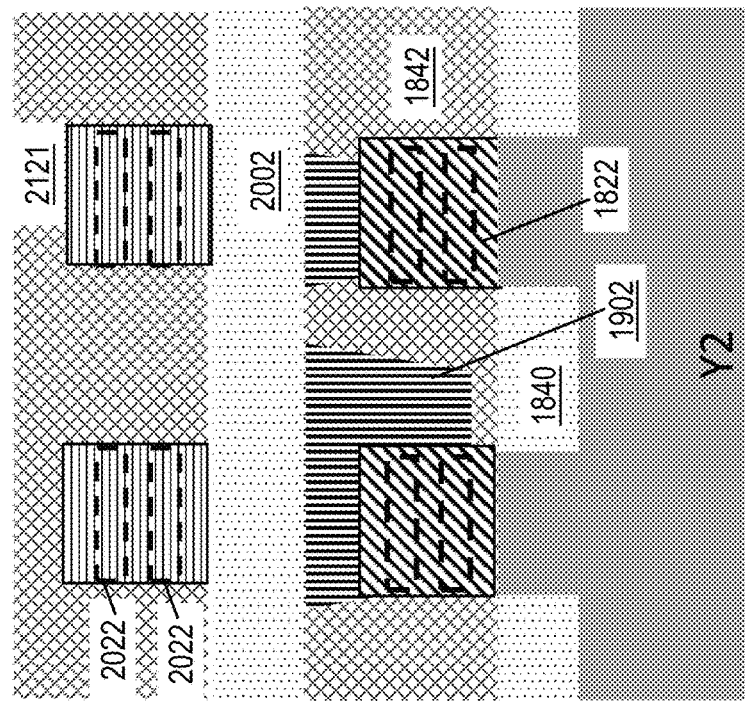
Figure 23D:
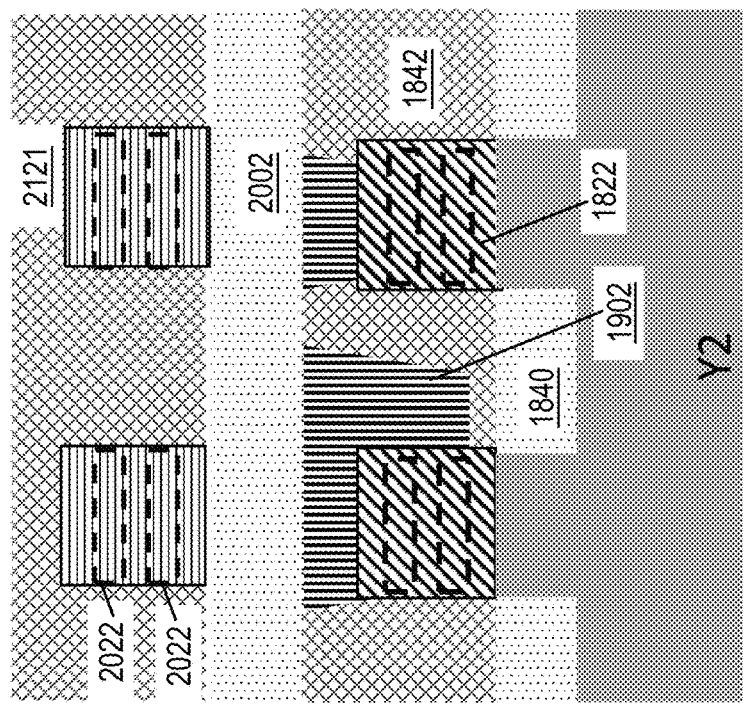
Figure 23C:
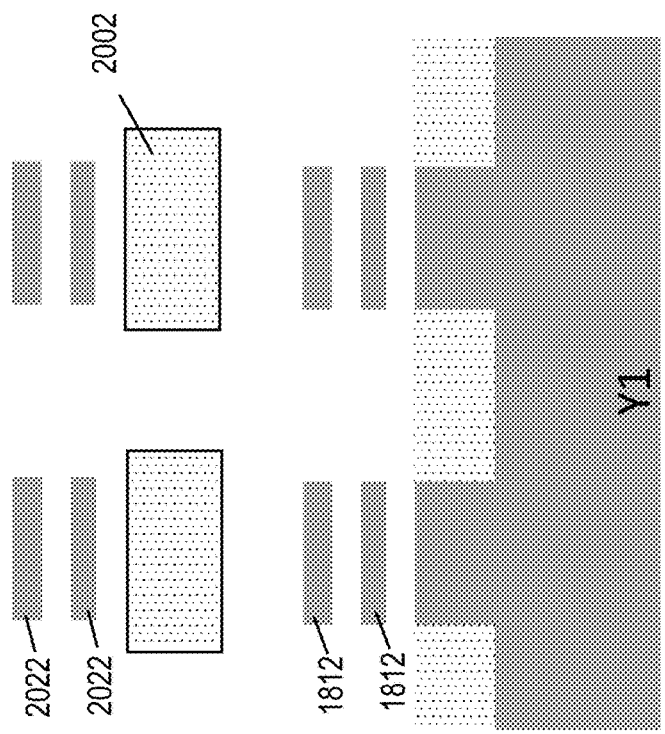
Figure 24C:
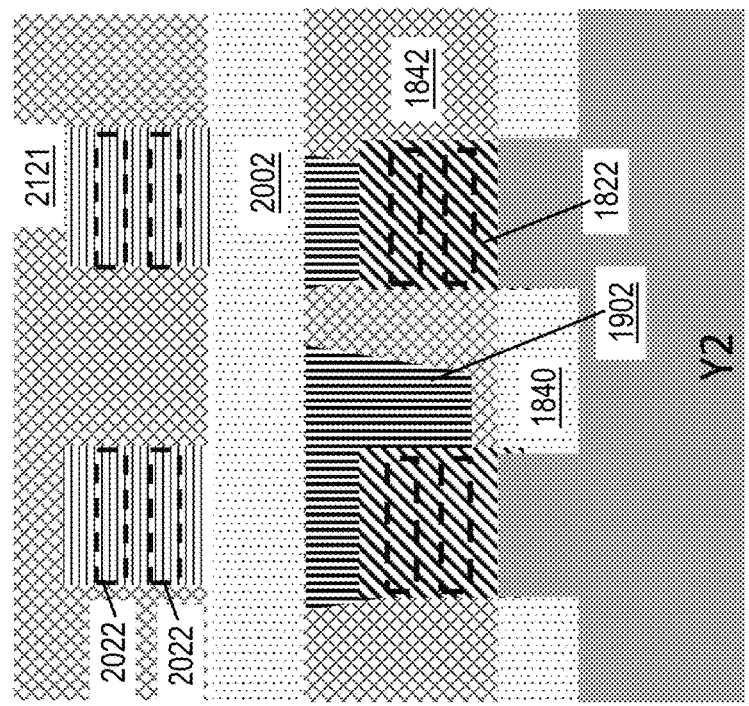
Figure 24D:
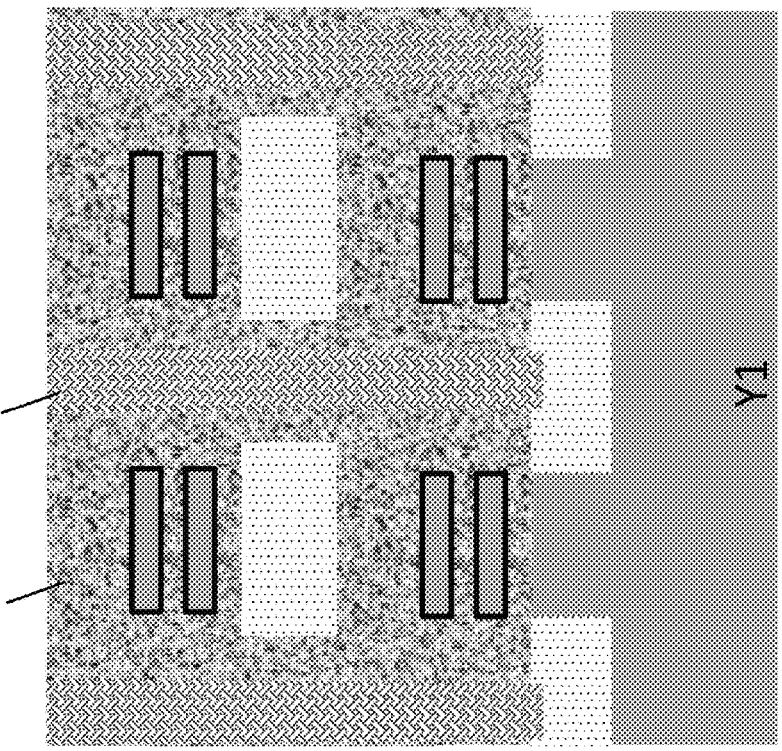
Figure 25B:
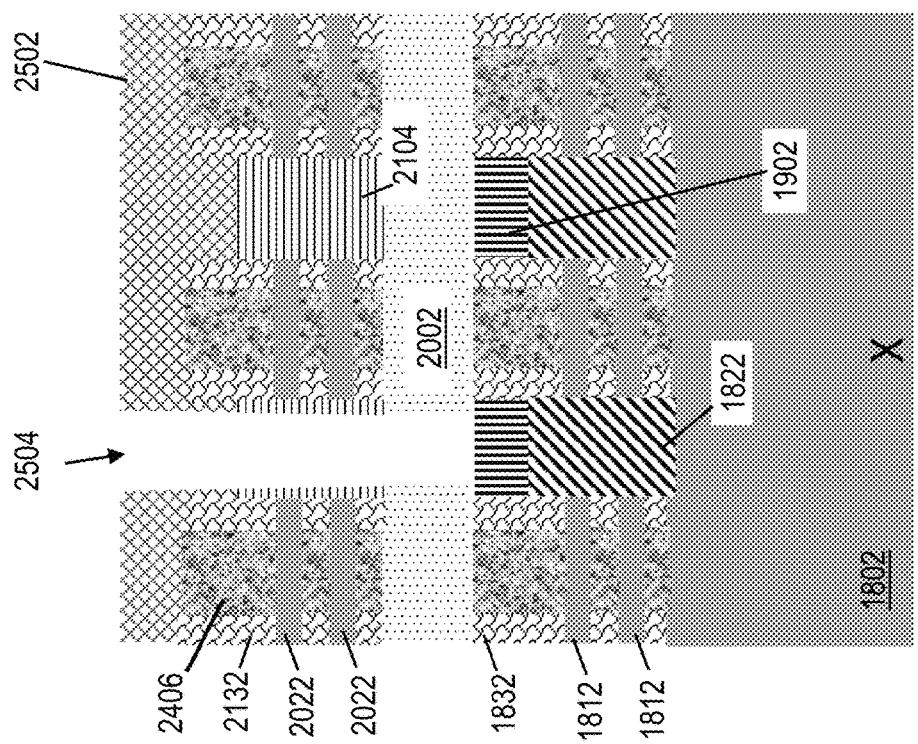
FIGS. 25A, 25B, 25C, and 25D respectively depict a top view and cross-sectional views of a portion of an IC under-fabrication after fabrication operations according to one or more embodiments of the invention.
Figure 25A:
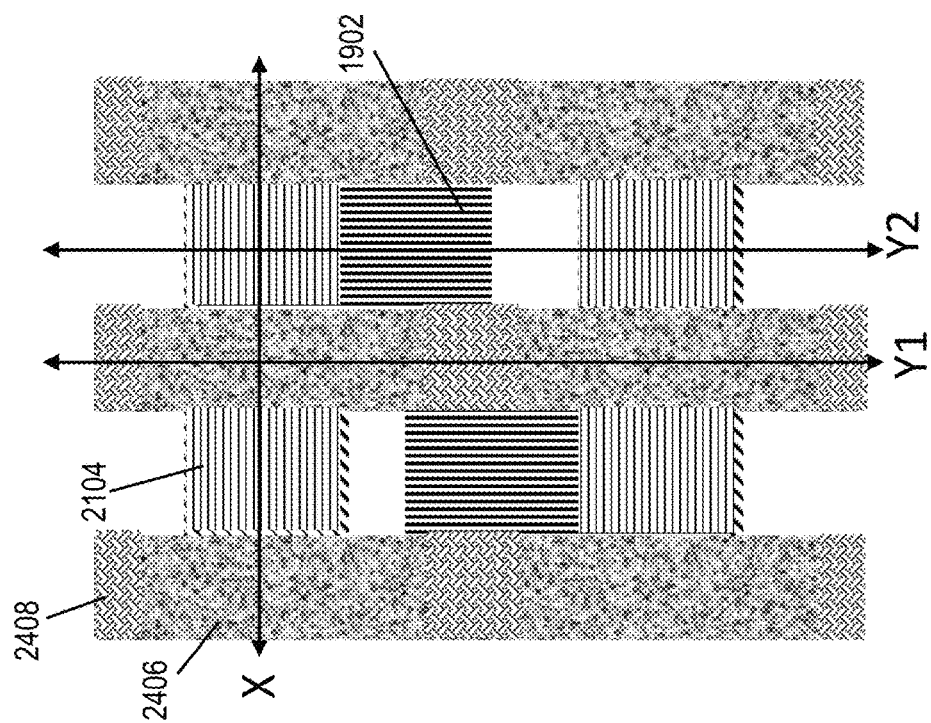
Figure 25D:
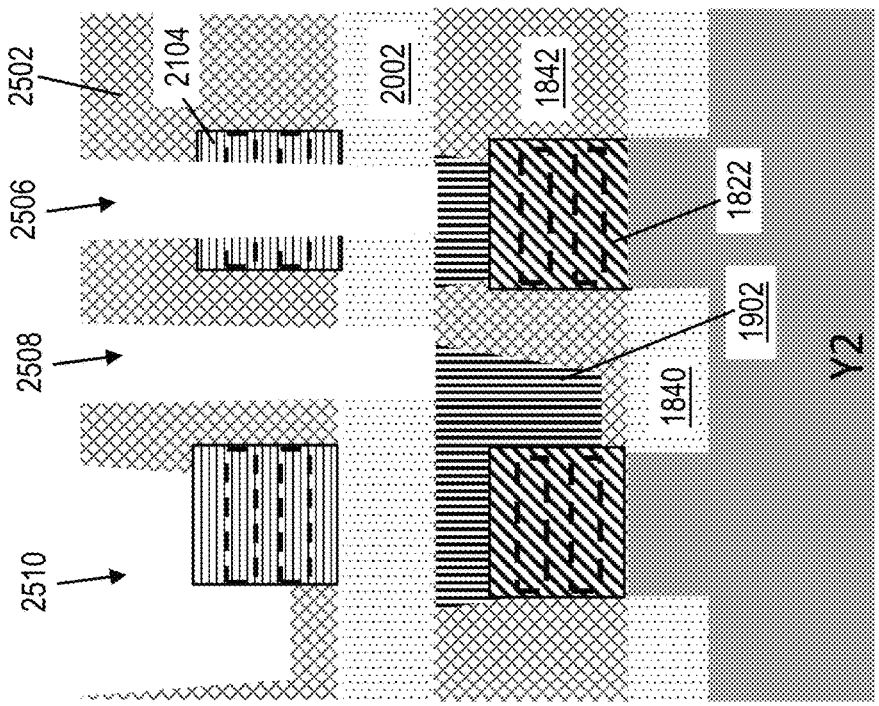
Figure 25C:
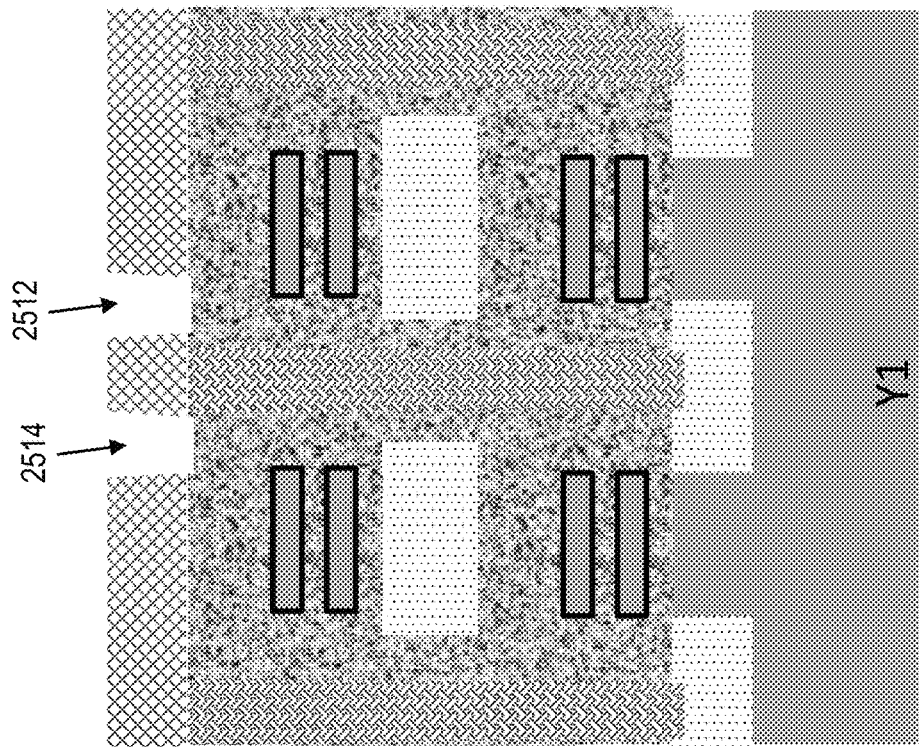
Figure 27B:
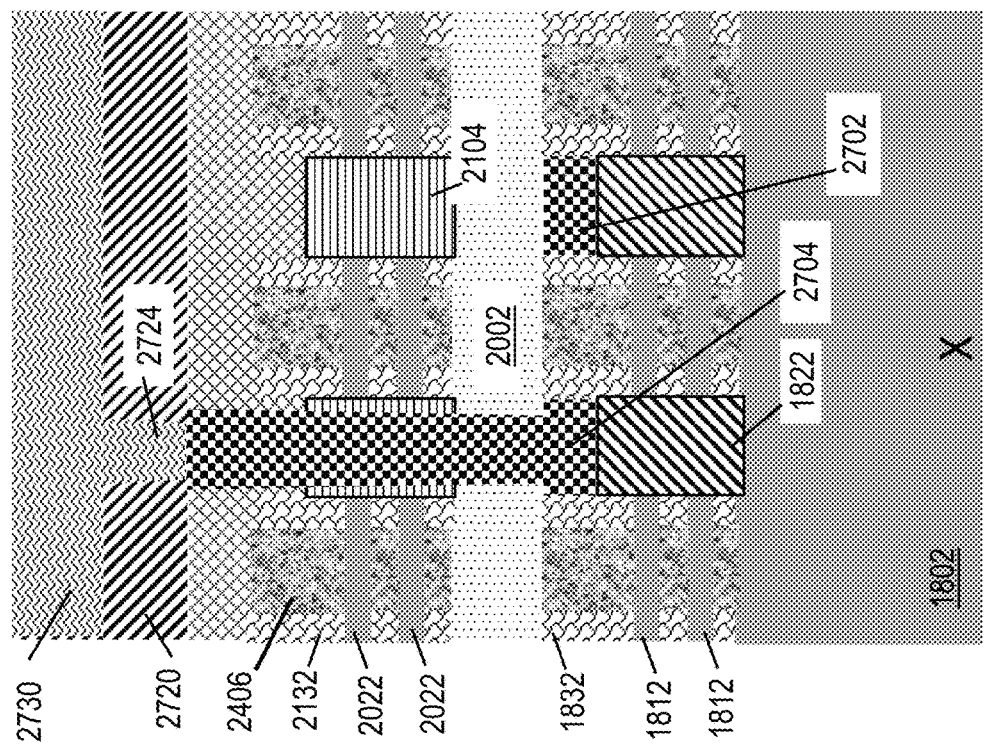
Figure 27A:
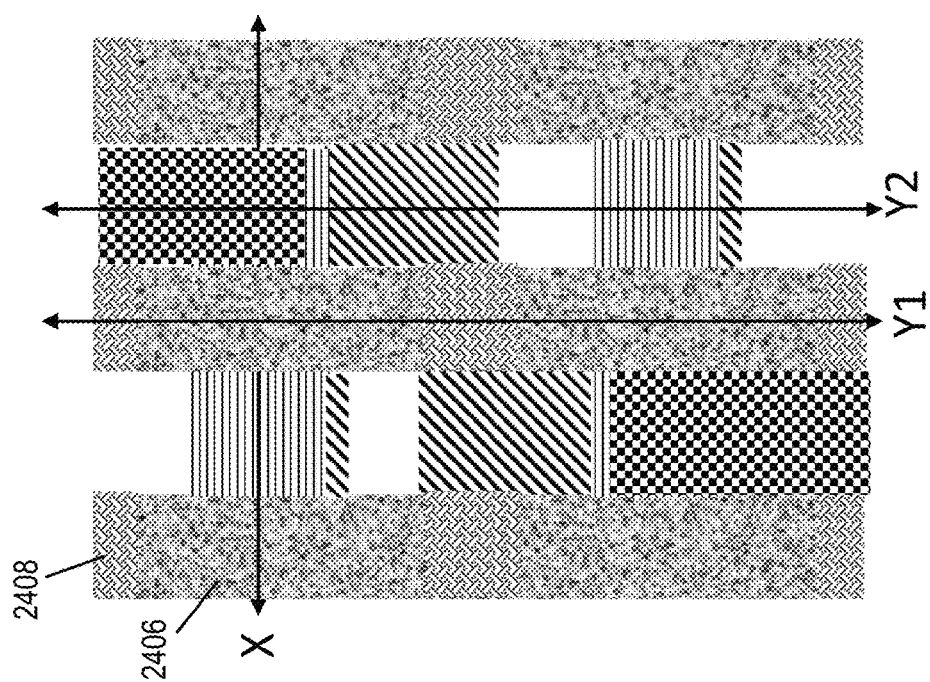

FIGS. 19A, 19B, 19C, 19D depict the IC 1800 after bottom device contact extension patterning and filling with dummy material. Cavities are patterned so as to expose the bottom epitaxial layer 1822, and dummy material 1902 is deposited to fill the cavities. Examples of the dummy material 1902 may include TiOx, AlOx, amorphous silicon (a-Si), amorphous silicon germanium (a-SiGe), etc. The cavities and subsequent dummy material 1902 are formed to have the L-shaped layout, as best seen in FIG. 19A. The dummy material 1902 will be replaced with the metal contact, thereby forming metal contact with the L-shaped layout.

FIGS. 20A, 20B, 20C, 20D depict the IC 1800 after oxide-to-oxide bonding. A dielectric material 2002 may be deposited as an oxide. A nanosheet stack of layers 2021 and 2022 are formed on the dielectric material 2002. The layers 2021 and 2022 are analogous to layer 321 and 322 in IC 100.

FIGS. 21A, 21B, 21C, 21D depict the IC 1800 after top dummy gate formation and top source and drain region formation. The nanosheet stack of layers 2021, 2022 are patterned, and top sacrificial gate structures 2130 are formed. The top sacrificial gate structures 2130 are analogous to bottom sacrificial gate structures 1830, as well as the sacrificial gate structures 330 in IC 100. Gate spacer material 2132 is formed on the ends of layer 2011 and on the top sacrificial gate structures 2130. Source and drains regions are formed by growing top epitaxial layer 2104. In IC 1800, the top epitaxial layer 2104 is not formed with the L-shaped layout. ILD material 2142 is deposited, and CMP is performed. The ILD material 2142 may be a low-k material or ultralow-k dielectric material.

FIGS. 22A, 22B, 22C, 22D depict the IC 1800 after forming replacement metal gate openings. Etching is performed to expose the top and bottom dummy gates in preparation for subsequent etching.

FIGS. 23A, 23B, 23C, 23D depict the IC 1800 after dummy gate removal and SiGe release, as part of the replacement metal gate process. The sacrificial gate structures 1830, 2130 are removed, resulting in cavities 2302, and the layers 1811, 2011 are removed.

FIGS. 24A, 24B, 24C, 24D depict the IC 1800 after the replacement gate formation and the gate cut. Replacement metal gate (RMG) formation is performed, thereby forming gate regions 2406. The replacement metal gate process is performed to deposit a high-k dielectric material followed by one or more work function material layers to thereby form the gate regions 2406. A gate cut is performed, and the resulting cavities are filled with dielectric material 2408. The dielectric material 2408 can be a low-k material or ultralow-k material.

FIGS. 25A, 25B, 25C, 25D depict the IC 1800 during the middle of the line (MOL) process. Further ILD material 2502 is deposited, and cuts are made in preparation for metal contacts, thereby leaving cavities 2504, 2506, 2508, 2510, 2512, 2514. The cavity 2510 is formed to have an extended opening beyond the source or drain regions, which will be utilized to provide an L-shaped layout.

FIGS. 26A, 26B, 26C, 26D depict the IC 1800 after removing the bottom contact extension. Dummy material 1902 is removed exposing the bottom epitaxial material 1822, thereby leaving cavities 2602. The cavities are formed to have an extended opening beyond the source or drain regions, which will be utilized to provide an L-shaped layout.

FIGS. 27A, 27B, 27C, 27D depict the IC 1800 after MOL metallization and metal (M1) formation. Metal is deposited to form metal contacts 2702, 2704, 2706, 2708, 2710, 2712. Further ILD material 2720 is deposited and patterned with open vias. Metal is deposited to form metal vias 2724 on the metal contacts 2702, 2704, 2706, 2708, 2710, 2712. Metal tracks 2730 are formed to electrically contact the metal contacts 2702, 2704, 2706, 2708, 2710, 2712 through the metal vias 2724. Metal tracks 2730 are analogous to metal tracks 110. Because of the extensions, the metal contacts in combination with the source and drain regions of the bottom epitaxial layer 1822 form an L-shaped layout, and likewise, the metal contacts in combination with the top epitaxial layer 2104 form the L-shaped layout.

FIG. 28 is a flowchart of a method 2800 of forming an IC 100, 1800 with a stacked FET device according to one or more embodiments. At block 2802, a first source region and a first drain region are formed with a first L-shaped layout. For example, the bottom epitaxial layer 102 is formed with an L-shaped layout. At block 2804, a second source region and a second drain region are formed with a second L-shaped layout, the first L-shaped layout and the second L-shaped layout being interrupted by a gate (e.g., gate region 106). For example, the top epitaxial layer 104 is formed with an L-shaped layout. Further, metal contacts 2702, 2704, 2706, 2708, 2710 are formed to have an L-shaped layout in IC 1800.

The first source region and the first drain region comprise epitaxial material, and the second source region and the second drain region comprise epitaxial material. A stacked field-effect transistor comprises the first source region, the first drain region, the second source region, the second drain region, and the gate. A first portion of the first L-shaped layout overlaps a second portion of the second L-shaped layout. The first L-shaped layout and the second L-shaped layout have different orientations such that the first and second L-shaped layouts avoid a complete overlap. A first channel region (e.g., layers 312, 1812) associated with the first source region and the first drain region overlaps a second channel region (e.g., layer 322, 2022) associated with the second source region and the second drain region. The first source region and the first drain region (e.g., P-type or N-type) are doped to be complementary (e.g., opposite polarity) to the second source region and the second drain region (e.g., N-type or P-type).

A first end of the first L-shaped layout is configured to operatively couple to a first power source (e.g., Vdd or Vss) and a second end of the second L-shaped layout is configured to operatively couple to a second power source (e.g., Vss or Vdd), the first end and the second end being non-overlapping. An overlapped end of the first L-shaped layout and the second L-shaped layout is configured to operatively couple to an output connection (Vout). The gate (e.g., gate region 106) is configured to operatively coupled to an input connection in proximity to the first source and drain regions and the second source and drain regions.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e., one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor structure comprising:
a first source region and a first drain region forming a first L-shaped layout, the first source and drain regions being formed on a bottom gate spacer material; and
a second source region and a second drain region forming a second L-shaped layout, the first L-shaped layout and the second L-shaped layout being interrupted by a gate, wherein one of the first source and drain regions extends in a direction beyond the bottom gate spacer material to form the first L-shaped layout, wherein the direction is parallel to a lengthwise direction of the gate.

2. The semiconductor structure of claim 1, wherein:
the first source region and the first drain region comprise epitaxial material; and the second source region and the second drain region comprise epitaxial material.

3. The semiconductor structure of claim 1, wherein a stacked field-effect transistor comprises the first source region, the first drain region, the second source region, the second drain region, and the gate.

4. The semiconductor structure of claim 1, wherein a first portion of the first L-shaped layout overlaps a second portion of the second L-shaped layout.

5. The semiconductor structure of claim 1, wherein the first L-shaped layout and the second L-shaped layout have different orientations such that the first and second L-shaped layouts avoid a complete overlap.

6. The semiconductor structure of claim 1, wherein a first channel region associated with the first source region and the first drain region overlaps a second channel region associated with the second source region and the second drain region.

7. The semiconductor structure of claim 1, wherein the first source region and the first drain region are doped to be complementary to the second source region and the second drain region.

8. The semiconductor structure of claim 1, wherein a first end of the first L-shaped layout is configured to operatively couple to a first power source and a second end of the second L-shaped layout is configured to operatively couple to a second power source, the first end and the second end being non-overlapping.

9. The semiconductor structure of claim 1, wherein an overlapped end of the first L-shaped layout and the second L-shaped layout is configured to operatively couple to an output connection.

10. The semiconductor structure of claim 1, wherein the gate is configured to operatively coupled to an input connection in proximity to the first source and drain regions and the second source and drain regions.

11. A method comprising:
providing a first source region and a first drain region forming a first L-shaped layout, the first source and drain regions being formed on a bottom gate spacer material; and
providing a second source region and a second drain region forming a second L-shaped layout, the first L-shaped layout and the second L-shaped layout being interrupted by a gate, wherein one of the first source and drain regions extends in a direction beyond the bottom gate spacer material to form the first L-shaped layout, wherein the direction is parallel to a lengthwise direction of the gate.

12. The method of claim 11, wherein:
the first source region and the first drain region comprise epitaxial material; and
the second source region and the second drain region comprise epitaxial material.

13. The method of claim 11, wherein a stacked field-effect transistor comprises the first source region, the first drain region, the second source region, the second drain region, and the gate.

14. The method of claim 11, wherein a first portion of the first L-shaped layout overlaps a second portion of the second L-shaped layout.

15. The method of claim 11, wherein the first L-shaped layout and the second L-shaped layout have different orientations such that the first and second L-shaped layouts avoid a complete overlap.

16. The method of claim 11, wherein a first channel region associated with the first source region and the first drain region overlaps a second channel region associated with the second source region and the second drain region.

17. The method of claim 11, wherein the first source region and the first drain region are doped to be complementary to the second source region and the second drain region.

18. The method of claim 11, wherein a first end of the first L-shaped layout is configured to operatively couple to a first power source and a second end of the second L-shaped layout is configured to operatively couple to a second power source, the first end and the second end being non-overlapping.

19. The method of claim 11, wherein an overlapped end of the first L-shaped layout and the second L-shaped layout is configured to operatively couple to an output connection.

20. The method of claim 11, wherein the gate is configured to operatively coupled to an input connection in proximity to the first source and drain regions and the second source and drain regions.

* * * * *